(12) United States Patent
Ooishi

(10) Patent No.: US 6,396,768 B2
(45) Date of Patent: May 28, 2002

(54) SYNCHRONOUS SEMICONDUCTOR MEMORY DEVICE ALLOWING EASY AND FAST TEST

(75) Inventor: Tsukasa Ooishi, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/849,252

(22) Filed: May 7, 2001

Related U.S. Application Data

(63) Continuation of application No. 09/587,271, filed on Jun. 5, 2000, now abandoned, which is a continuation of application No. 09/271,301, filed on Mar. 17, 1999, now Pat. No. 6,111,807.

(30) Foreign Application Priority Data

Jul. 17, 1998 (JP) .............................. 10-203995
Oct. 16, 1998 (JP) .............................. 10-295624

(51) Int. Cl.$^7$ ................................................. G11C 8/00
(52) U.S. Cl. ...................... 365/233; 365/63; 365/189.05
(58) Field of Search ...................... 365/233, 63, 189.05

(56) References Cited

U.S. PATENT DOCUMENTS 5,487,050 A    1/1996   Kim 6,172,893 B1   1/2001   Ryan

FOREIGN PATENT DOCUMENTS

JP    7-140207    6/1995

OTHER PUBLICATIONS

"A 2.5–ns Clock Access, 250–MHz, 256–Mb SDRAM with Synchronous Mirror Delay", by Saeki et al., IEEE Journal of Solid–State Circuits, vol. 31, No. 11, Nov. 1996, pp. 1656–1665.

*Primary Examiner*—Son T. Dinh
(74) *Attorney, Agent, or Firm*—McDermott, Will & Emery

(57) ABSTRACT

A synchronous semiconductor memory device performs input/output of data in synchronization with an externally applied external clock signal or a data strobe signal in a test operation mode. An operation of an internal circuit in the test operation mode is performed in synchronization with a clock signal produced by an internal control clock producing circuit and being faster than the external clock. In the test operation mode, a decode circuit produces write data based on data applied to a specific terminal among data I/O terminals, and a result of comparison of a plurality of read data is issued to the specific terminal during a data read operation.

4 Claims, 67 Drawing Sheets

FIG.2

| | | 88PIN TSOP2 29.5mm × 16mm Bank BA0-2 Row A0-12 Col A0-8(x32) | | |
|---|---|---|---|---|
| Vdd | 1 | | 88 | Vss |
| DQ0 | 2 | | 87 | DQ15 |
| VddQ | 3 | | 86 | VssQ |
| DQ1 | 4 | | 85 | DQ14 |
| DQ2 | 5 | | 84 | DQ13 |
| VssQ | 6 | | 83 | VddQ |
| DQ3 | 7 | | 82 | DQ12 |
| DQ4 | 8 | | 81 | DQ11 |
| VddQ | 9 | | 80 | VssQ |
| DQ5 | 10 | | 79 | DQ10 |
| DQ6 | 11 | | 78 | DQ9 |
| VssQ | 12 | | 77 | VddQ |
| DQ7 | 13 | | 76 | DQ8 |
| Vdd | 14 | | 75 | Vss |
| DM0 | 15 | | 74 | VREF |
| NC | 16 | | 73 | DM1 |
| /WE | 17 | | 72 | /CLK |
| /CAS | 18 | | 71 | CLK |
| /RAS | 19 | | 70 | CKE |
| /CS | 20 | | 69 | QS |
| A14(BS1) | 21 | | 68 | A15(BS2) |
| A13(BS0) | 22 | | 67 | A12 |
| Vdd | 23 | | 66 | Vss |
| A10/AP | 24 | | 65 | A11 |
| A0 | 25 | | 64 | A9 |
| A1 | 26 | | 63 | A8 |
| A2 | 27 | | 62 | A7 |
| A3 | 28 | | 61 | A6 |
| A4 | 29 | | 60 | A5 |
| DM2 | 30 | | 59 | DM3 |
| Vdd | 31 | | 58 | Vss |
| DQ16 | 32 | | 57 | DQ31 |
| VssQ | 33 | | 56 | VddQ |
| DQ17 | 34 | | 55 | DQ30 |
| DQ18 | 35 | | 54 | DQ29 |
| VddQ | 36 | | 53 | VssQ |
| DQ19 | 37 | | 52 | DQ28 |
| DQ20 | 38 | | 51 | DQ27 |
| VssQ | 39 | | 50 | VddQ |
| DQ21 | 40 | | 49 | DQ26 |
| DQ22 | 41 | | 48 | DQ25 |
| VddQ | 42 | | 47 | VssQ |
| DQ23 | 43 | | 46 | DQ24 |
| Vdd | 44 | | 45 | Vss |

FIG.10

| PIN TYPE | PIN NAME | STATE IN TEST MODE |
|---|---|---|
| EXTERNAL CLOCK INPUT TERMINAL | ext.CLK | USED |
| | /ext.CLK | |
| CONTROL SIGNAL INPUT TERMINAL GROUP | CKE | |
| | /CS | |
| | /RAS | USED |
| | /CAS | |
| | /WE | |
| | DM0~DM3 | NOT USED |
| | QS | |
| DATA REFERENCE POTENTIAL INPUT TERMINAL | Vref | NOT USED |
| ADDRESS SIGNAL INPUT TERMINAL GROUP | A0~A12 | USED (BUT THE NUMBER OF PINS CAN BE REDUCED IF DEGENERATION DEGREE CAN BE INCREASED.) |
| BANK SIGNAL INPUT TERMINAL GROUP | BA0~BA2 | NOT USED (EXTERNAL SIGNAL IS "DON'T CARE" BECAUSE OF MULTI-SELECTION OF BANKS.) |
| DATA I/O TERMINAL GROUP | DQ0~DQ31 | 4×2 BITS AMONG 16×2 BITS ARE USED (4 BITS ARE USED FOR DEGENERATION OF 4 BITS, I.E., SELECTION UNIT OF COLUMN SELECT LINES (REPLACEMENT UNIT OF REDUNDANT COLUMNS), AND FOR GENERATING DATA PATTERN. THE NUMBER OF ADDRESS SIGNAL INPUT TERMINALS REQUIRED IN TEST CAN BE FURTHER REDUCED BY USING THEM AS A PORTION OF ROW ADDRESS IN ROW-RELATED ACTIVATION.) |
| POWER SUPPLY TERMINAL | VDDQ | EXTERNAL POWER SUPPLY FOR OUTPUT |
| | VSSQ | GROUND FOR OUTPUT |
| | VDD | EXTERNAL POWER SUPPLY POTENTIAL |
| | VSS | GROUND |

| (DQ4,DQ0) | 00 | 01 | 10 | 11 |
|---|---|---|---|---|
| DATA PATTERN | 0000<br>0000<br>0000<br>0000 | 0000<br>1111<br>0000<br>1111 | 1111<br>0000<br>1111<br>0000 | 1111<br>1111<br>1111<br>1111 |

FIG.56

| PIN TYPE | PIN NAME | STATE IN TEST MODE |
|---|---|---|
| EXTERNAL CLOCK INPUT TERMINAL | ext.CLK | USED |
| | /ext.CLK | /ext.CLK TERMINAL IS USED FOR ROM DATA SHIFT CLOCK SENT FROM SHIFT DATA I/O TERMINAL Din BECAUSE OF OPERATION WITH SINGLE-PHASE CLOCK SIGNAL. |
| SHIFT DATA INPUT | Din | INPUT OF SHIFT DATA (COMMAND, ADDRESS & DATA) FOR TEST |
| CONTROL SIGNAL INPUT TERMINAL GROUP | CKE | |
| | /CS | |
| | /RAS | NOT USED |
| | /CAS | |
| | /WE | |
| | DM0~DM3 | NOT USED |
| | QS | |
| DATA REFERENCE POTENTIAL INPUT TERMINAL | Vref | NOT USED (EXTERNAL INPUT IS "DON'T CARE" BECAUSE OF USE OF INTERNALLY PRODUCED Vref.) |
| TEST MODE SIGNAL INPUT TERMINAL 1 | TEST1 | SETTING TO MODE REGISTER 1 |
| ADDRESS SIGNAL INPUT TERMINAL GROUP | A0~A12 | USED (BUT THE NUMBER OF PINS CAN BE REDUCED IF DEGENERATION DEGREE CAN BE INCREASED.) |
| BANK SIGNAL INPUT TERMINAL GROUP | BA0~BA2 | NOT USED (EXTERNAL SIGNAL IS "DON'T CARE" BECAUSE OF MULTI-SELECTION OF BANKS.) |
| TEST MODE SIGNAL INPUT TERMINAL 2 | TEST2 | SETTING TO MODE REGISTER 2 |
| DATA I/O TERMINAL GROUP | DQ0~DQ31 | NOT USED |
| POWER SUPPLY TERMINAL | VDDQ | EXTERNAL POWER SUPPLY FOR OUTPUT |
| | VSSQ | GROUND FOR OUTPUT |
| | VDD | EXTERNAL POWER SUPPLY POTENTIAL |
| | VSS | GROUND |
| SHIFT DATA OUTPUT | Dout | OUTPUT OF SHIFT DATA (COMMAND, ADDRESS & DATA) FOR TEST |

FIG.59

| PIN TYPE | PIN NAME | STATE IN TEST MODE |
|---|---|---|
| EXTERNAL CLOCK INPUT TERMINAL | ext.CLK | USED |
| | /ext.CLK | /ext.CLK TERMINAL IS USED FOR DATA SHIFT CLOCK SENT FROM SHIFT DATA I/O TERMINAL Din BECAUSE OF OPERATION WITH SINGLE-PHASE CLOCK. |
| SHIFT DATA INPUT | Din | WRITING OF DATA INTO ROM OF BIST |
| CONTROL SIGNAL INPUT TERMINAL GROUP | CKE | |
| | /CS | |
| | /RAS | NOT USED |
| | /CAS | |
| | /WE | |
| | DM0~DM3 | NOT USED |
| | QS | |
| DATA REFERENCE POTENTIAL INPUT TERMINAL | Vref | NOT USED (EXTERNAL INPUT IS "DON'T CARE" BECAUSE OF USE OF INTERNALLY PRODUCED Vref.) |
| TEST MODE SIGNAL INPUT TERMINAL 1 | TEST | ACTIVATION SIGNAL FOR BIST |
| ADDRESS SIGNAL INPUT TERMINAL GROUP | A0~A12 | NOT USED |
| BANK SIGNAL INPUT TERMINAL GROUP | BA0~BA2 | NOT USED |
| DATA I/O TERMINAL GROUP | DQ0~DQ31 | RETAIN ONLY MINIMUM NUMBER OF PINS REQUIRED FOR RESULT OUTPUT |
| POWER SUPPLY TERMINAL | VDDQ | EXTERNAL POWER SUPPLY FOR OUTPUT |
| | VSSQ | GROUND FOR OUTPUT |
| | VDD | EXTERNAL POWER SUPPLY POTENTIAL |
| | VSS | GROUND |

SYNCHRONOUS SEMICONDUCTOR MEMORY DEVICE ALLOWING EASY AND FAST TEST

This application is a Continuation of application Ser. No. 09/587,271 filed Jun. 5, 2000 now abandoned, which is a Continuation of application Ser. No. 09/271,301 filed Mar. 17, 1999 and now U.S. Pat. No. 6,111,807.

BACKGROUND OF THE INVENTION

1. Field of the Invention

The present invention relates to a synchronous semiconductor memory device, and in particular to a synchronous semiconductor memory device operating in synchronization with an external clock signal.

2. Description of the Background Art

With increase in operation speed of microprocessors (which will be referred to as "MPUs" hereinafter) in recent years, synchronous DRAMs (which will be referred to as SDRAMs hereinafter) and others operating in synchronization with clock signals have been used for achieving fast access of dynamic random access memories (which will be referred to as "DRAMs" hereinafter) and others used as main storage devices.

Internal operations of the SDRAM and others are controlled by dividing the operations into the row-related operation and the column related operation for control.

In the SDRAMs, structures in which a memory cell array is divided into banks each allowing independent operation have been employed for allowing further fast operation. In each bank, the row-related operation and the column-related operation are controlled independently of each other.

As a result of increase in operation speed, the semiconductor memory devices such as SDRAMs suffer from the following problems during operation tests in manufacturing steps or outgoing tests.

With increase in storage capacity of the semiconductor memory device, a time required for the test increases, resulting in increase in cost for the test and increase in manufacturing cost of the product.

As countermeasures against increase in test time which is caused by the increased storage capacity of the semiconductor memory device, such a manner has first been employed that the test is carried out in parallel on a plurality of semiconductor memory devices for improving the test efficiency. However, the foregoing increased storage capacity of the semiconductor memory device increases the number of bits of an address signal applied to the semiconductor memory device, number of bits of a data I/O interface and others, and thus increases the numbers of input pins and I/O pins for the control signals in each semiconductor memory device. This restricts the number of semiconductor memory devices, which can be simultaneously tested in parallel.

The number of chips of the semiconductor memory devices, which can be simultaneously measured by one test operation of a tester device, depends on a relationship between the number of pins provided in a tester side and the number of pins required in the chip side, and can be generally expressed by the following formula:

(number of pins of tester)/(number of pins required in chip)>(number of pins allowing simultaneous test)

Further, an extremely expensive tester device is required for increasing an operation speed of the tester device in accordance with an increased operation speed of the semiconductor memory device itself. This also increases the test cost.

SUMMARY OF THE INVENTION

An object of the invention is to provide a synchronous semiconductor memory device which allows an easy simultaneous parallel test even if the device has an increased storage capacity.

Another object of the invention is to provide a synchronous semiconductor memory device, which can reduce a load on a tester side and allows an inexpensive operation test even if a fast operation is to be performed.

In summary, the invention provides a synchronous semiconductor memory device for taking in an address signal and a control signal in synchronization with an external clock signal, including a memory cell array, an internal clock producing circuit, an address signal input circuit, a memory cell select circuit, a data I/O node and an interface circuit.

The memory cell array has a plurality of memory cells arranged in rows and columns.

The internal clock producing circuit controls a synchronous operation of the synchronous semiconductor memory device. The internal clock producing circuit produces a first internal clock signal of the same frequency as the external clock signal in a first operation mode, and produces the first internal clock signal and a second internal clock signal synchronized with the external clock signal and having a higher frequency than the external clock signal in a second operation mode.

The address signal input circuit takes in the address signal in synchronization with the first internal clock signal.

The memory cell select circuit operates in synchronization with the first internal clock signal in the first operation mode and in synchronization with the second internal clock signal in the second operation mode, and selects the memory cells of at least n (n: natural number) in number during one write cycle in accordance with the address signal.

The data I/O node is supplied with write data to be written into the memory cell or read data read from the memory cell.

The interface circuit is arranged between the memory cell selected by the select circuit and the data I/O node, and transmits the write data. The interface circuit holds data of at least n in number applied in serial to the I/O node, and operates in synchronization with the first internal clock signal in the first operation mode and in synchronization with the second internal clock signal in the second operation mode to apply in parallel the write data to the selected memory cells.

According to another aspect of the invention, a synchronous semiconductor memory device for taking in an address signal and a control signal in synchronization with an external clock signal includes a memory cell array, an internal clock producing circuit, an address signal input circuit, a memory cell select circuit, a data I/O node and an interface circuit.

The memory cell array has a plurality of memory cells arranged in rows and columns.

The internal clock producing circuit produces an internal clock signal for controlling a synchronous operation of the synchronous semiconductor memory device.

The address signal input circuit takes in the address signal in synchronization with the internal clock signal.

The memory cell select circuit operates in synchronization with the internal clock signal to select the memory cell in accordance with the address signal.

The data I/O node is supplied with write data to be written into the memory cell or read data read from the memory cell.

The interface circuit is arranged between the memory cell selected by the select circuit and the data I/O node, and transmits the write data. The interface circuit holds a plurality of data applied to the I/O node, and operates in a test mode to produce, as the write data, a test data pattern by decoding the plurality of data and apply the write data to the selected memory cell.

According to still another aspect of the invention, a synchronous semiconductor memory device for taking in an address signal and a control signal in synchronization with an external clock signal includes a memory cell array, a first internal clock producing circuit, a memory cell select circuit and an I/O circuit.

The memory cell array has a plurality of memory cells arranged in rows and columns.

The first internal clock producing circuit controls a synchronous operation of the synchronous semiconductor memory device. The first internal clock producing circuit receives complementary clock signals including first and second clock signals having a constant phase difference therebetween, and produces an internal clock signal having an active period corresponding to the phase difference.

The memory cell select circuit selects the memory cell in synchronization with the internal clock signal.

The I/O circuit transmits data to and from the memory cell selected by the select circuit.

According to yet another aspect of the invention, a synchronous semiconductor memory device for taking in an address signal and a control signal in synchronization with an external clock signal includes a memory cell array, an internal clock producing circuit, a memory cell select circuit and an I/O circuit.

The memory cell array has a plurality of memory cells arranged in rows and columns.

The internal clock producing circuit controls a synchronous operation of the synchronous semiconductor memory device. The internal clock producing circuit produces an internal clock signal having an active period independent of a period of the external clock signal in response to activation of the external clock signal.

The memory cell select circuit selects the memory cell in synchronization with the internal clock signal.

The I/O circuit transmits data to and from the memory cell selected by the memory cell select circuit.

Accordingly, the invention can achieve the following advantage. In the second operation mode, since an internal processing speed of the device can be increased as compared with a data write speed, a load on a test in a test operation can be reduced, and further a fast operation test can be carried out on the synchronous semiconductor memory device.

The invention can also achieve the following advantage. Since the data pattern is internally produced based on the external data in the test operation mode, a load on the tester can be reduced.

Further, the invention can achieve the following advantage. In the test mode, the speed of internal processing of the device can be increased so that a load on the test in the test operation can be reduced, and further a fast operation test of the synchronous semiconductor memory device can be performed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 conceptually shows an arrangement of input pins for control signals and I/O pins for data in a packaged structure of SDRAM 1000;

FIG. 10 shows a situation of use of the input pins and the data I/O pins of SDRAM 1000 in the test operation mode;

FIG. 56 shows a relationship in the case where I/O pins required in the test mode are reduced in number;

FIG. 59 shows a relationship in the case where I/O pins required in the test mode is reduced in number;

DESCRIPTION OF THE PREFERRED EMBODIMENTS

[Embodiment 1]

Figure 1A:
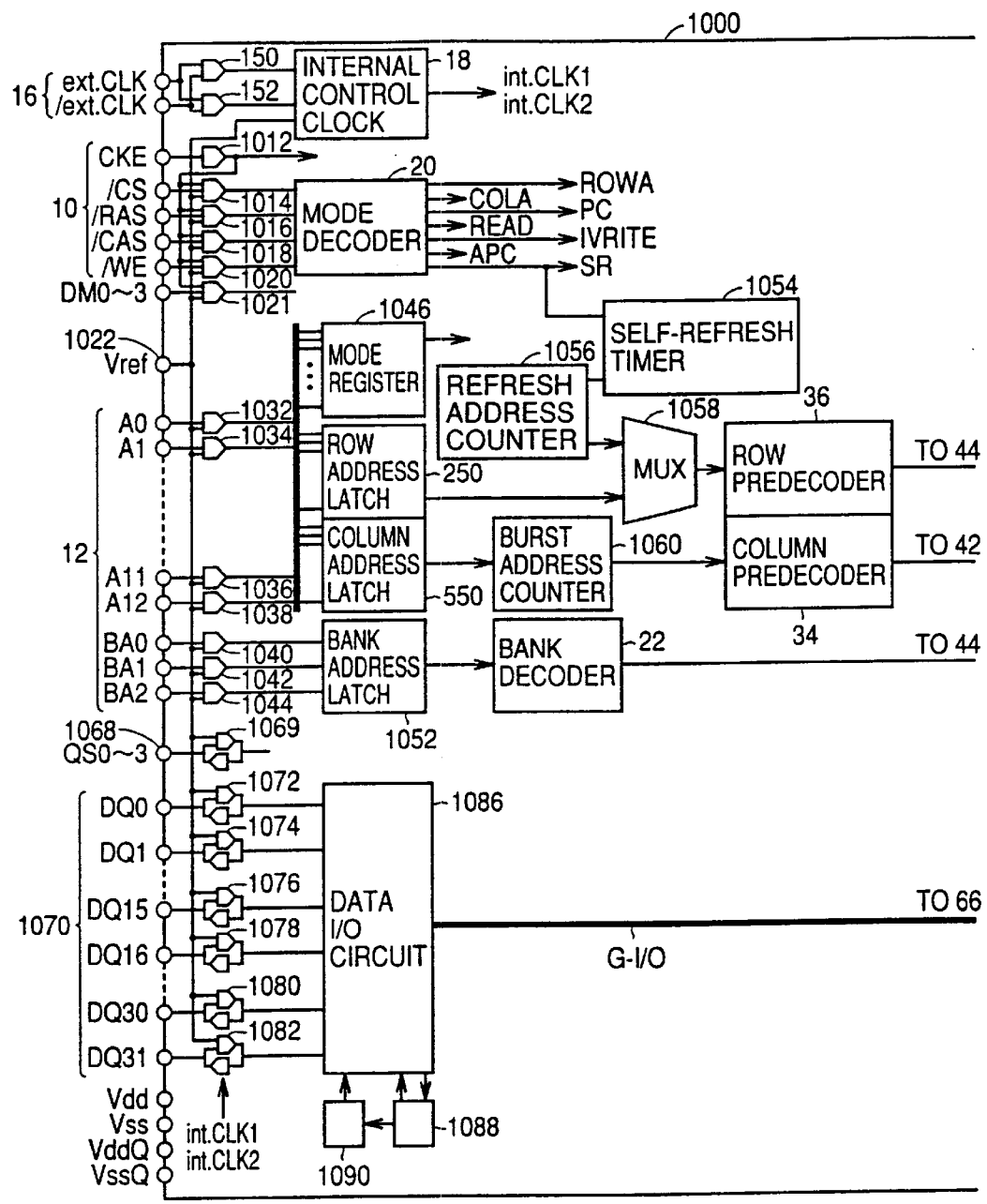
FIGS. 1A and 1B are a schematic block diagram showing a structure of an SDRAM 1000 of an embodiment 1 of the invention.
Figure 1B:
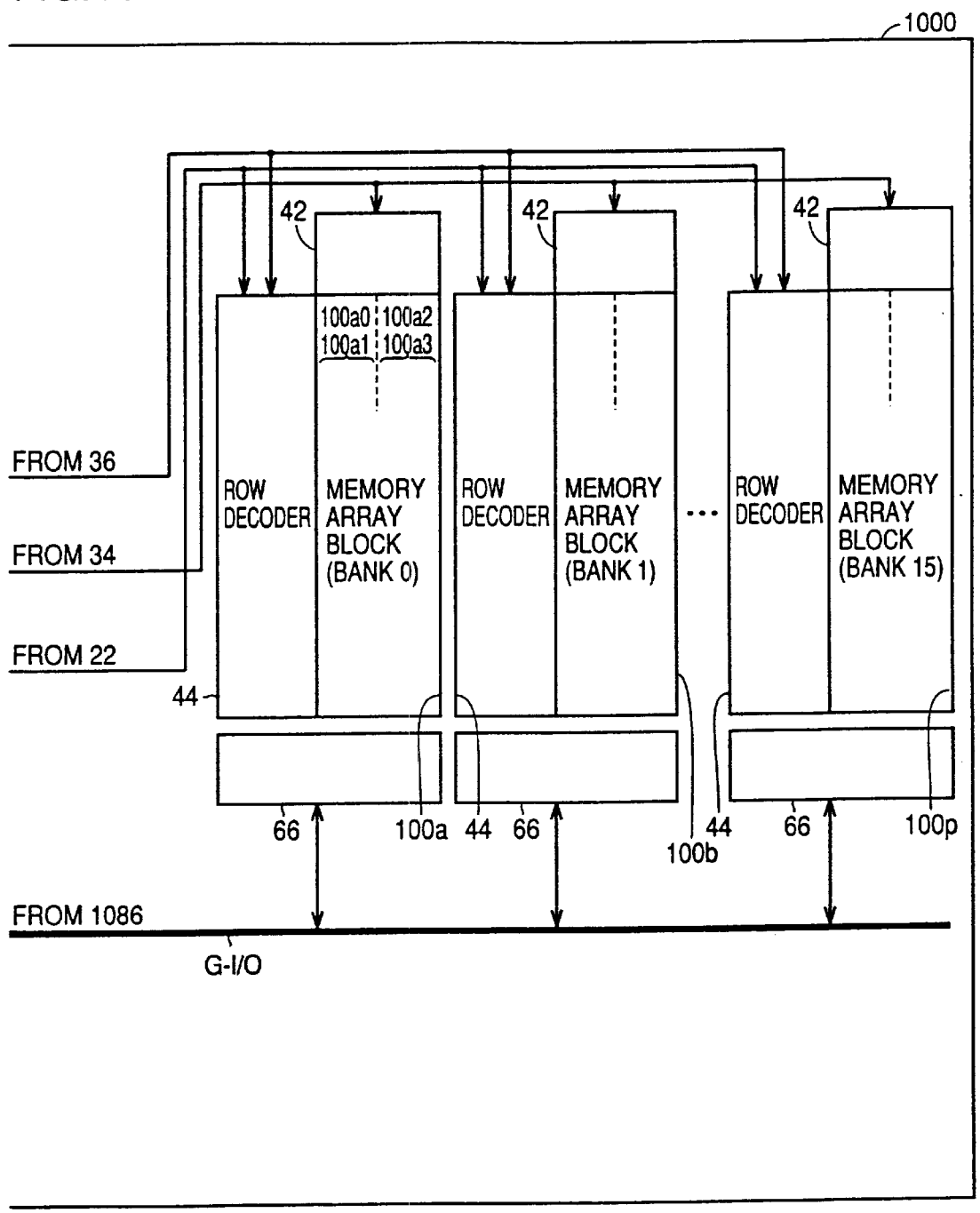

FIGS. 1A and 1B are a schematic block diagram showing a structure of a synchronous semiconductor memory device 1000 of an embodiment 1 of the invention.

SDRAM 1000 includes an external clock signal input terminal 16 which receives externally applied complementary signals ext.CLK and ext./CLK, clock input buffers 150 and 152 which buffer the clock signals applied to external clock terminal 16, an internal control clock producing circuit 18 which receives the outputs of clock buffers 150 and 152, and produces first and second internal clock signals int.CLK1 and int.CLK2, and a mode decoder 20 receiving external control signals, which are applied through an external control signal input terminal 10, through input buffers 1012–1021 operating in accordance with second internal clock signal int.CLK2, respectively.

Internal control signal input terminal 10 receives a signal CKE, a chip select signal /CS, a row address strobe signal /RAS, a column address strobe signal /CAS, a write enable signal /WE and data mask signals DM0–DM3.

Signal CKE is a signal which instructs enabling of input of the control signals into the chip. If signal CKE is not activated, input of the control signals is not enabled so that the chip does not actually operate.

Signal /CS is a signal for determining whether a command signal is supplied or not. While signal /CS is active (i.e., at "L" level, the command is determined at a rising edge of the clock signal in accordance with a combination of other control signals.

Signal /RAS is a signal for instructing operations of row-related circuits. Signal /CAS is a signal for instructing activation of operations of column-related circuits. Signal /WE is used for discrimination between the write operation and the read operation.

Signals DM0–DM3 are signals which instruct masking of data transmission of corresponding data I/O terminals DQ0–DQ7, DQ8–DQ15, DQ16–DQ23 and DQ24–DQ31, respectively.

Mode decoder 20 operates in accordance with these external control signals to issue internal control signals for controlling operations of internal circuits of SDRAM 1000. Mode decoder 20 issues, e.g., as the internal control signals, signals ROWA, COLA, ACD, PC, READ, WRITE, APC and SR. Signal ROWA is a signal indicating that the row-related access is to be performed. Signal COLA is a signal indicating that the column-related access is to be performed. Signal ACT is a signal instructing activation of word lines.

Signal PC is a signal instructing a precharge operation and instructing termination of the operations of the row-related circuits. Signal READ is a signal instructing the column-related circuits to perform the read operation, and signal WRITE is a signal instructing the column-related circuits to perform the write operation.

Signal APC is a signal instructing an automatic precharge operation. When the automatic precharge operation is instructed, the precharge operation automatically starts upon finish of a burst cycle. Signal SR is a signal instructing a self-refresh operation. When the self-refresh operation starts, a self-refresh timer operates. Upon elapsing of a predetermined time, the word lines are activated to start the refresh operation.

SDRAM 1000 also includes a self-refresh timer 1054, which starts the operation when signal SR designates the self-refresh mode so that the word lines may be activated upon elapsing of a predetermined time, i.e., so that start of the refresh operation may be instructed and the refresh operation may be controlled upon elapsing of the predetermined time. SDRAM 1000 further includes a refresh counter 1056 issuing an address for the refresh operation in accordance with the instruction sent from self-refresh timer 1054.

Moreover, SDRAM 1000 includes a reference potential input terminal 1022 which receives a signal VREF forming a reference of determination of "H" and "L" levels of the input signals, a mode register 1046 which operates in accordance with a combination of the address signal applied through an address signal input terminal 12 and the foregoing external control signals, and thereby holds data related to a predetermined operation mode such as data with respect to a burst length as well as information relating to actually designated operation between a single data rate operation and a double data rate operation as will be described later, a row address latch 250 which receives the address signal through address signal input buffers 1032–1038 operating in accordance with second internal clock signal int.CLK2, and holds the applied row address in accordance with timing of input of the row address, a column address latch 550 which receives address signals A0–A12, and holds the column address in accordance with timing of input of the column address, a multiplexer 1058 which receives the outputs of refresh address counter 1056 and row address latch 250, and selectively operates to issue the output sent from row address latch 250 in the normal operation and issue the output sent from refresh address counter 1056 in the self-refresh operation, a row predecoder 36 which receives the output of multiplexer 1058 and predecodes the row address, a burst address counter 1060 which uses the column address held by column address latch 550 as a reference, and produces the internal column address in accordance with data of the burst length sent from burst register 1046, a column predecoder 34 which receives the output of burst address counter 1060, and predecodes the corresponding column address, a bank address latch 1052 receiving bank addresses BA0–BA2 applied to the address input terminal through respective input buffers 1040–1044, which operate in accordance with internal clock signal int.CLK2, and holding the designated bank address value, and a bank decoder 22 decoding the bank address.

The address signal applied to address signal input terminal 12 is used when operation mode information is written into the mode register, and more specifically is used for writing data into the mode register in accordance with a combination of several bits of the address signal. For example, setting relating to a burst length BL and a value of a CAS latency CL are specified in accordance with the combination of a predetermined number of bits of the address signal.

Bank address signals BA0–BA2 specify the access bank in each of the row-related access and the column-related access. More specifically, in each of the row-related access and the column-related access, bank address signals BA0–BA2 applied to address signal input terminal 12 are taken into bank address latch 1052, and then are transmitted to each memory array block (bank) after being decoded by bank decoder 22.

SDRAM 1000 further includes memory array blocks 100a–100p which operate as bank 0–bank 15 allowing independent read/write operations, respectively, row decoders 44 for selecting rows (word lines) in the corresponding banks in accordance with the outputs of bank decoder 22 and row predecoder 1062, respectively, column decoders 42 for selecting the columns (bit line pairs) in the corresponding banks in accordance with the output of column predecoder 34, respectively, I/O ports 66 for applying data, which is read from the selected memory cells in the selected banks, to a global I/O bus G-I/O in the read operation, and applying the write data, which are transmitted from bus G-I/O, to the corresponding banks in the write operation, respectively, a data I/O circuit 1086 operating in the write operation to hold the write data, which is externally applied in serial, and apply the held data to bus G-I/O as parallel data, and operating in the read operation to hold the read data, which is transmitted in parallel from bus G-I/O, and convert the held data into a serial data, a decoder circuit 1088 which produces the write data by decoding the data applied to the predetermined data I/O terminal during the write operation in the test operation mode, a comparator circuit 1090 which compares the read data with an expected value during the read operation in the test operation mode, and bidirectional I/O buffers 1072–1082 which transmit I/O data DQ0–DQ31 between data I/O circuit 1086 and data I/O terminal 1070, respectively.

Bidirectional I/O buffers 1072–1082 operate in accordance with the operation mode data held in mode register 1046. More specifically, bidirectional buffers 1072–1082 operate in synchronization with first internal clock signal int.CLK1 in a double data rate SDRAM (which will be referred to as a "DDR-SDRAM" hereinafter) operation mode, and also operate in synchronization with second clock signal int.CLK2 in the single data rate SDRAM (which will be referred to as a "SDR-SDRAM" hereinafter) operation mode.

Signals QS0–QS3, which are transmitted to and from I/O terminal 1068 through bidirectional I/O buffer 1069, represent timing of data transmission of corresponding data I/O terminals DQ0–DQ7, DQ8–DQ15, DQ16–DQ23 and DQ24–DQ31, respectively.

In the later description of the SDR-SDRAM operation mode, signals QS0–QS3 will be generally referred to as signals QS and, in the later description of the DDR-SDRAM operation mode, signals QS0–QS3 will be generally referred to as signals DQS.

FIG. 2 conceptually shows an arrangement of input pins for the control signals and I/O pins for data in a packaged structure of the SDRAM shown in FIGS. 1A and 1B.

FIG. 2 shows the structure in which SDRAM 1000 is sealed within a package of 88 pins.

In FIG. 2, an external power supply voltage Vdd is applied to 1st, 14th, 23rd, 31st and 44th pins. A ground potential Vss is applied to 45th, 58th, 66th, 75th and 88th pins.

An external power supply potential VddQ for output is applied to eight power supply pins, i.e., 3rd, 9th, 36th, 43rd, 50th, 56th, 77th and 83rd pins. A ground potential VssQ for output is applied to eight power supply pins, i.e., 6th, 12th, 33rd, 39th, 53rd, 80th and 86th pins.

As will be described later, pins of 32 in total number are present as the data I/O terminal. Therefore, such a structure is employed that each of power supply VddQ for output and ground potential VssQ for output is applied to every four pins of the data output terminal.

This structure is employed because power supply lines for the I/O buffer portion are arranged independently so that noises occurring in the I/O buffer portion may not adversely affect the power supply lines for the internal circuits.

Thirty-two pins DQ0–DQ31 of 32 in total are allocated to the data I/O terminal, and each of input pins DM0–DM3 for designating the data mask operation is provided for every eight data I/O pins.

As input pins for other control signals, 11 pins in total are used for control and, more specifically, are provided for signals /WE, /CAS, /RAS, /CS, CKE, QS and others in one-to-one relationship, respectively. For the addresses, 13 address pins A0–A12 as well as 3 pins A13–A15 (BS0–BS2) for specifying the bank addresses are used and, therefore, 16 pins in total are used.

Accordingly, the address pins and the data I/O pins of 59 in total number, i.e., 59 connection pins are required for operating SDRAM 1000.

Figure 3:
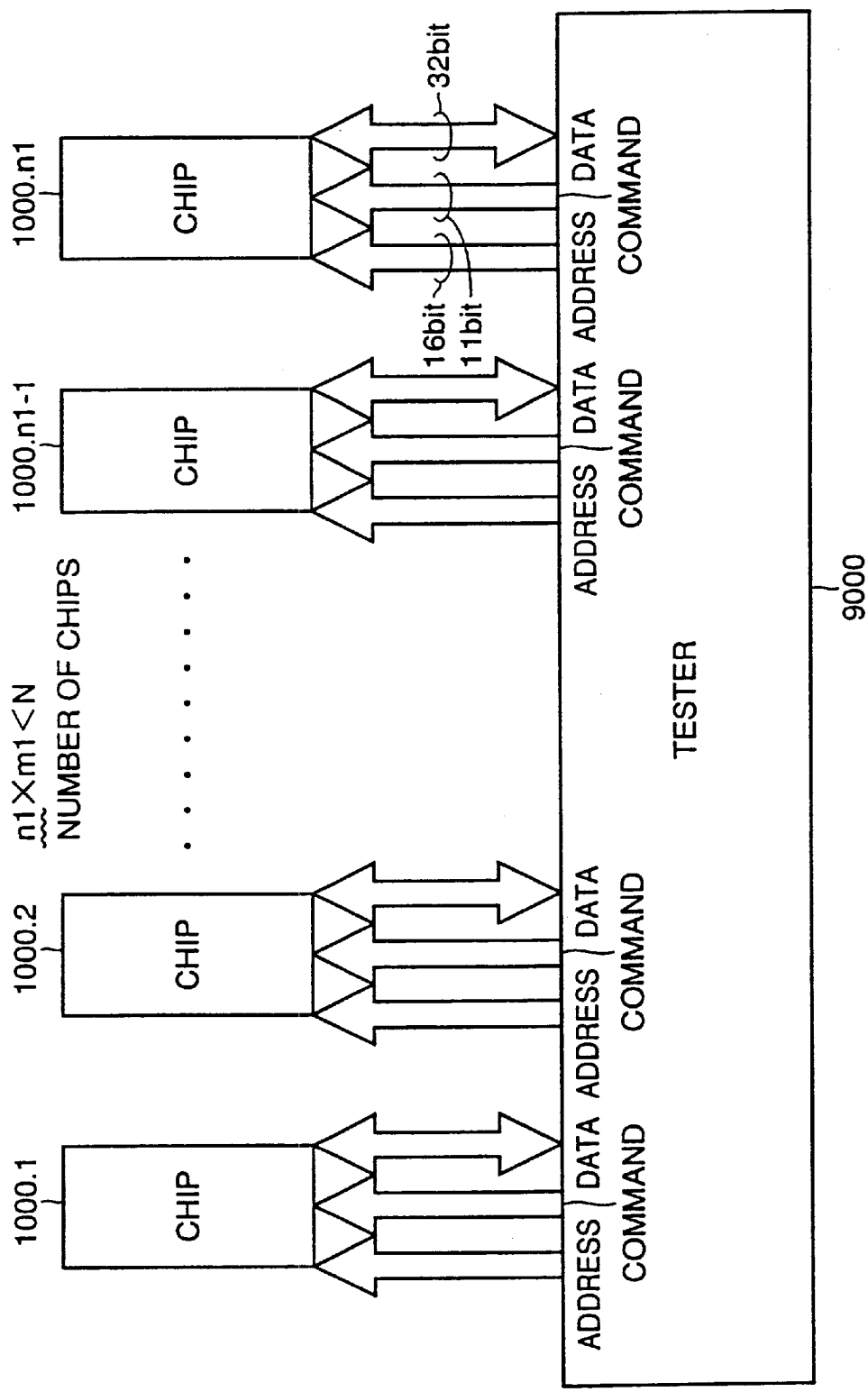
FIG. 3 conceptually shows a structure for a parallel test of the SDRAMs 1000.

FIG. 3 conceptually shows a structure for performing a parallel test on SDRAM chips 1000.1, 100.2, . . . , 1000.n1-1 and 1000.n1 of n1 in total number by controlling all the input pins and data output pins of SDRAMs 1000.

Assuming that the pins required for operation control of each chip is m1 (=59 pins) in number, a tester 9000 simultaneously controls the pins of (n1×m1) in total number for the chips of n1 in number. In other words, tester 9000 must be capable of reliably controlling the pins of N in number which is larger than (n1×m1).

Figure 4:
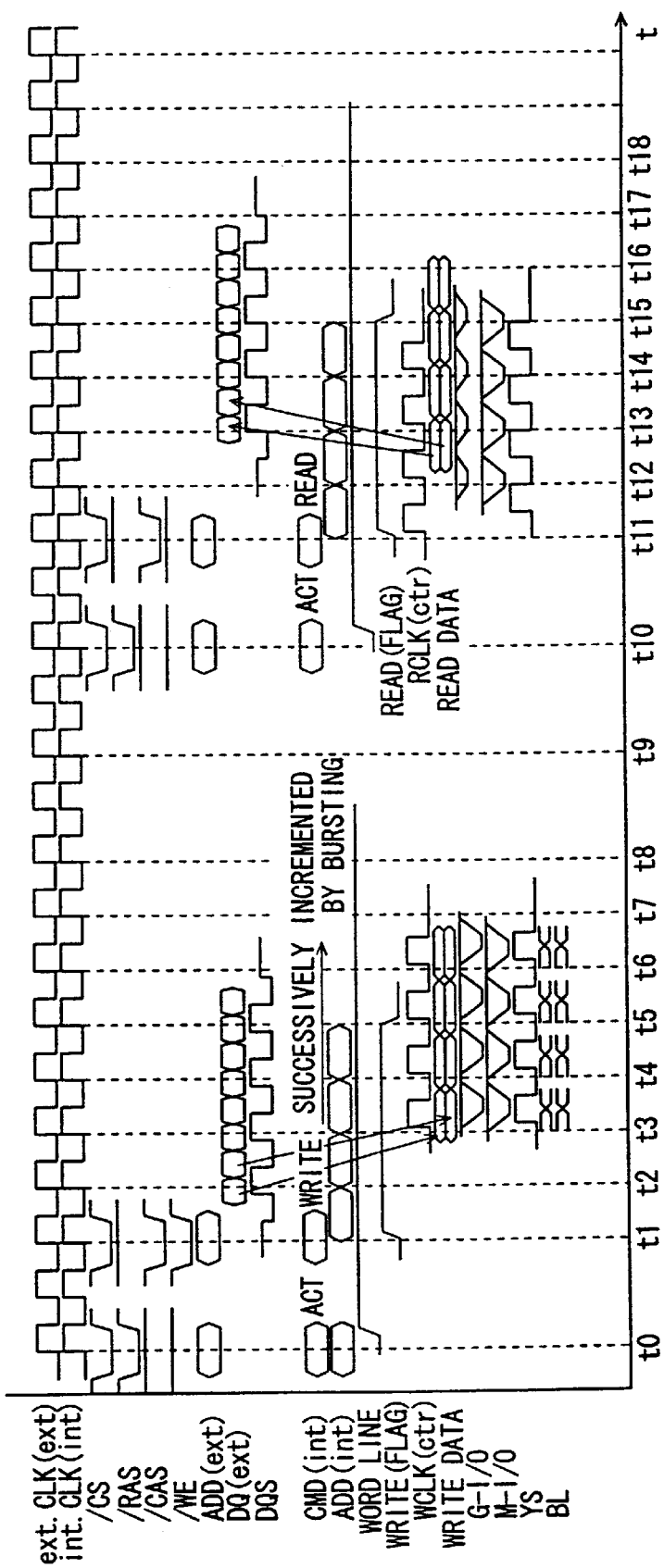
FIG. 4 is a timing chart for schematically showing a double data rate operation of SDRAM 1000.

FIG. 4 is a timing chart conceptually showing the double data rate operation of SDRAM 1000 shown in FIGS. 1A and 1B.

As already described, SDRAM 1000 is switchable between the double data rate operation and the single data rate operation. However, description will be given primarily on the double data rate operation hereinafter.

Referring to FIG. 4, description will now be given on the operation in the case where the burst length is 8 and the CAS latency in the read operation is 2.

The CAS latency of 2 means that the data output starts at the second clock after input of the command.

[Write Operation in DDR-SDRAM Mode]

Referring to FIG. 4, activation of the SDRAM is instructed at the rising edge of external clock signal ext.CLK at time t0 in response to the active state of signals /CS and /RAS.

At time t0, the row address and the bank address are taken in and are held in row address latch 250 and bank address latch 1052, respectively.

Subsequently, the write operation is designated at the edge of internal clock signal int.CLK at time t1 in accordance with the active states of signals /CS, /CAS and /WE. At this time, the column address is input, and column address latch 550 hold the value thereof. By setting the operation mode of the burst write at this time, the write operation in and after the next cycle will be performed while automatically incrementing the column address within SDRAM 1000 by bust test counter 1060.

In accordance with designation of the write operation, signal WRITE which is a flag signal for instructing the internal write operation changes to the active state.

Thereafter, the write data is externally changed in synchronization with signal DQS applied to SDRAM 1000, and is taken into the SDRAM.

The date written in serial is converted by data I/O circuit 1086 into parallel data in a rate of 2 bits per one data I/O terminal, and is written into the selected memory cells at time t3 and subsequent times t4–t6.

[Read Operation in DDR-SDRAM Mode]

In the read operation, the ACT command for activating the word lines is input in response to the active states of signals /CS and RAS at time t10, i.e., at the rising edge of external clock signal ext.CLK. At this time, the address specifying the word line is also input.

Subsequently, the read operation is designated at time t11 in response to the active states of signals /CS and /CAS. At this time, the column address is specified, and is held in column address latch 550. Based on the column address held in the column address latch 550, burst address counter 1060 produces the internal address. The word line is activated, and data is read in 2-bit parallel from the selected memory cells. The data thus read is amplified by sense amplifiers, and is read out in synchronization with read clock RCLK produced in SDRAM 1000.

The data which is read in two-bit parallel is held in data I/O circuit 1086, and is converted into serial data. The converted data is successively output to data I/O terminal 1070 at and after time t13.

When setting for the operation mode of burst read is already set, the read operation on and after time t14 is performed in such a manner that parallel reading of 2 bits and conversion thereof into the serial data are successively performed for outputting the data to the I/O terminal while internally and automatically incrementing the column address.

In this operation, SDRAM 1000 outputs signal DQS in synchronization with the data output for externally applying the timing of data output from SDRAM 1000.

In the column-related access, as already described, the address signal is taken into column address latch 550. The change in column address at the time of burst is performed in either an interleaved manner or a sequential manner, as will be described later. The selected manner of change between them is stored as operation information in mode register 1046 in accordance with a combination of the address signals. In accordance with the control by mode register 1046, change in burst address counter 1060 occurs in different manners.

In the DDR-SDRAM operation mode, data must be output two times in one cycle of the external clock signal. Accordingly, the internal circuits operates in the DDR-SDRAM operation mode such that two data are read out from the selected memory array block in one clock cycle. Therefore, the address signals issued from burst address counter 1060 must simultaneously provide two addresses for reading the two data.

The initial state of the burst address, i.e., the externally applied column address signal may provide the address of either an even number or an odd number. Therefore, such a fact must be taken into consideration in the above operation that the burst address cannot be produced merely by successively incrementing the input address.

For example, "1" may be externally applied as the column address signal. Even in this case, the paired internal column address signal to be produced is (1, 2) in the case of the sequential mode, but is (1, 0) in the case of the interleave mode.

Accordingly, the location where the column selection is performed with the address of an even number differs from the location where the column selection is performed with the address of an odd number (the column corresponding to the activated column select signal is present).

Accordingly, each of the memory cell array block in SDRAM 1000 is divided into regions corresponding to the even addresses and the odd addresses, and the decoder for the column select signals corresponding to the even addresses and the decoder for the column select signals corresponding to the odd addresses are separated from each other and operate independently of each other.

For example, the memory array block in memory cell array bank 0 is divided into regions 100a0 and 100a1 corresponding to the even addresses and regions 100a2 and 100a3 corresponding to the odd addresses.

Taking the above into consideration, the write and read operations in the DDR-SDRAM operation mode will now be described again.

As the address signal in the first column access cycle, a value itself which is externally applied is transmitted to column predecoder 34.

In the next burst cycle, the signals are transmitted to column-related predecoder 34 after being subjected to appropriate processing corresponding to the address counter for the even address and the address counter for the odd address.

When the SDRAM operates as the DDR-SDRAM, the data input operation is performed in synchronization with the externally applied DQS clock in the case of bidirectional synchronization (which will be referred to as a "bidirectional mode" hereinafter).

The data output operation is performed in synchronization with the synchronous clock produced by internal control clock producing circuit 18 in SDRAM 1000.

In the write operation, the command and the first address are first input. Data is input at double the frequency of the external clock with a slight delay from these command and first address. Although the delay from the external clock occurs, this delay causes no problem provided that the data is taken in accordance with timing determined by the externally applied DQS clock.

When the write command input is recognized, mode decoder 20 activates write flag WRITE, and internal control clock producing circuit 18 generates a write clock signal WCLK correspondingly to external clock signal ext.CLK. Since input of the data is slightly delayed, the write clock signal must be delayed correspondingly.

In FIG. 4, the write clock signal is activated with phases delayed by two clocks from the external clock signal for providing an appropriate margin. Through data I/O terminal 1070, the write data is taken into data I/O circuit 1086 in synchronization with internal clock signal int.CLK1 of double the frequency of the external clock signal. The write data thus taken is transmitted through global I/O bus G-I/O and a main I/O line pair M-I/O in synchronization with write clock signal WCLK in such a manner that two bits, which correspond to the even and odd addresses, respectively, are transmitted simultaneously. In response to activation of the column select signal for a predetermined column in the selected memory array block, the data is written into the memory cells through the selected bit line pair. Second and subsequent accesses in the burst cycle, burst address counter 1060 issues the internal column address signal which changes in accordance with the type of burst, and bits of the write data are successively written two by two in accordance with write clock signal WCLK.

In the read operation, the command and the first address are input, and mode decoder 20 recognizes the input of read command and thereby activates read flag READ. Thereby, read clock signal RCLK is issued in response to internal clock signal int.CLK2 having the same frequency as the external clock signal which is issued from internal control clock producing circuit 18. In accordance with read clock signal RCLK, a column select signal YS is activated, and two bits (even address group and odd address group) of the data are simultaneously read out from the sense amplifiers.

The data of two bits thus read is transmitted, as the read data, to data I/O circuit 1086 through main I/O line pair M-I/O and global I/O bus G-I/O, and are latched therein. In data I/O circuit 1086, the read data of 2 bits which are input in parallel is subjected to serial conversion, and is output in synchronization with internal clock signal int.CLK1, which is issued from internal control clock producing circuit 18 and changes at double the frequency of the external clock signal, and in accordance with clock timing slightly leading the timing of the CAS latency.

The second and subsequent accesses in the burst cycle, burst address counter 1060 issues the internal column address signal which changes in accordance with the type of burst address. In response to this, the read data is successively read from the memory cell block (bank), which is selected in accordance with read clock signal RCLK.

[Correspondence Between Data I/O Pins and Write/Read Data in Double Data Rate Operation]

Figure 5:
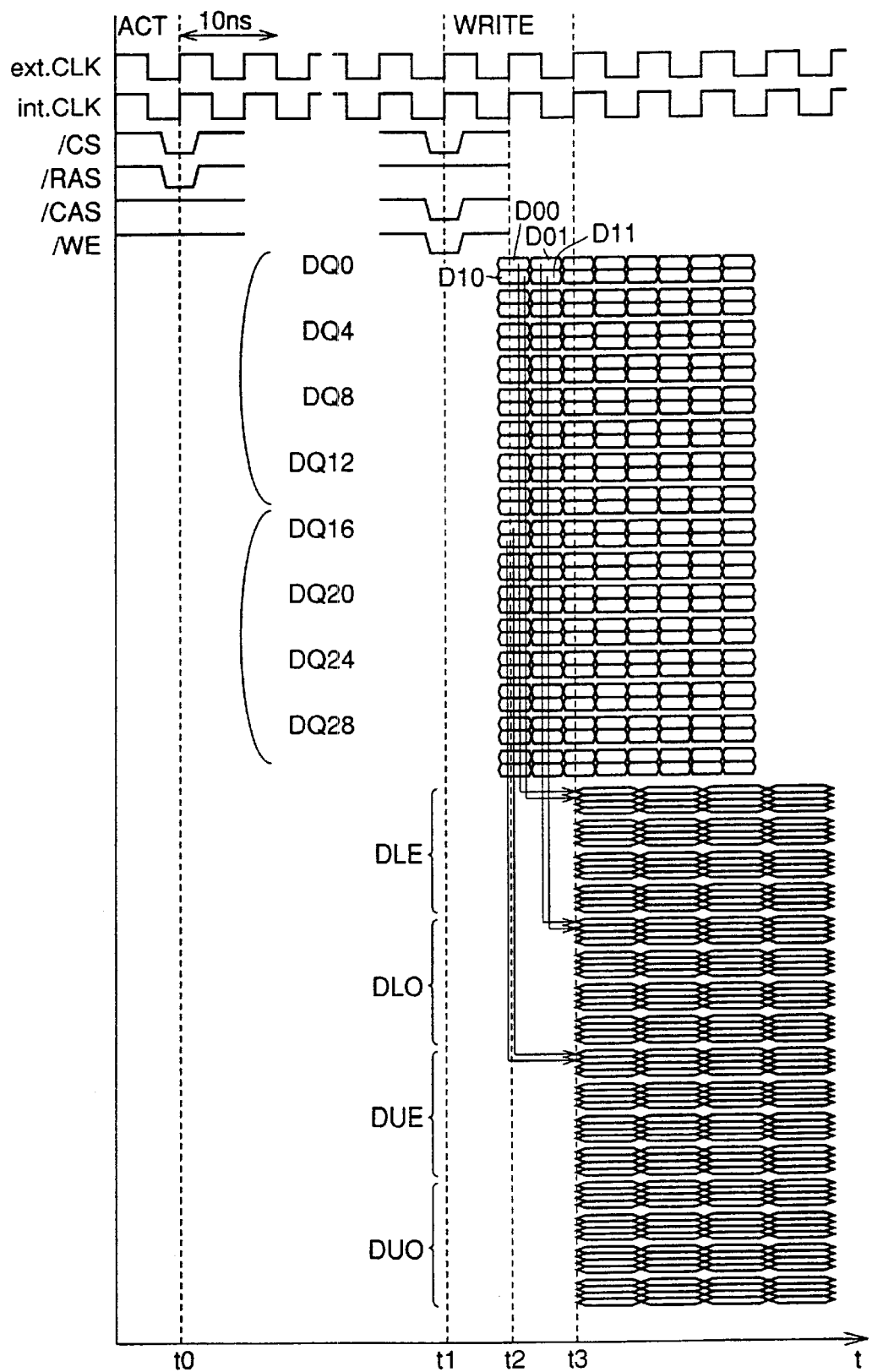
FIG. 5 is a timing chart showing more specifically a relationship between the data I/O pins of SDRAM 1000 and internal data to be written.
Figure 6:
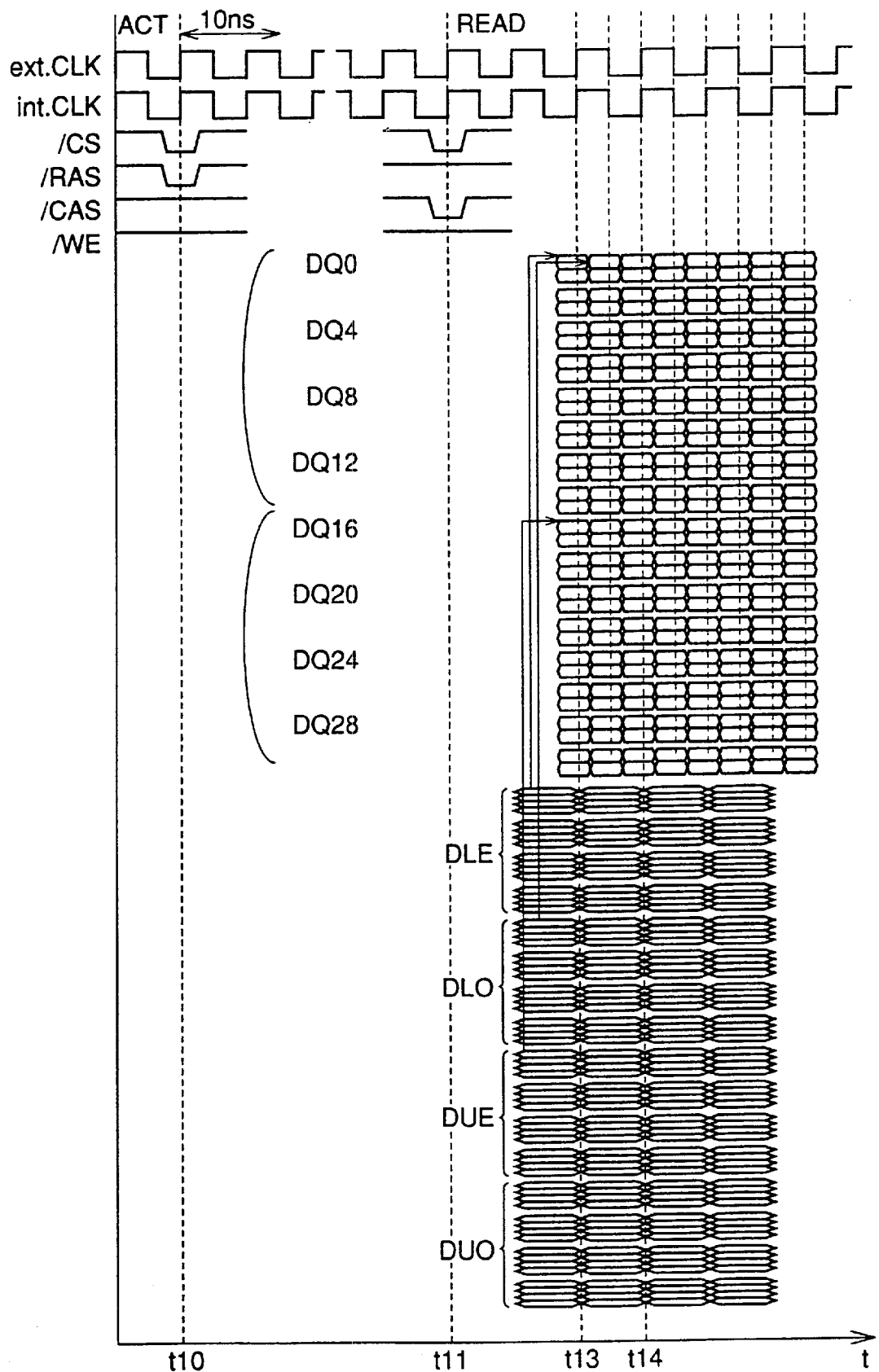
FIG. 6 is a timing chart showing more specifically a relationship between the data I/O pins of SDRAM 1000 and read internal data.

FIGS. 5 and 6 are timing charts showing more specifically the correspondence or relationship between the data I/O pins and the internal data written or read during the double data rate operation of SDRAM 1000 shown in FIG. 4.

FIG. 5 shows the write operation in the operation of SDRAM 1000 shown in FIG. 4.

Referring to FIGS. 4 and 5, an ACT command is applied to SDRAM 1000 at time t0 in accordance with the active state of signals /CS and /RAS.

At time t1, the WRITE command is applied to SDRAM 1000 in response to the active states of signals /CS, /CAS and /WE.

Data D00, D10, D20 and D30, which are applied to data I/O terminals DQ0–DQ3 in response to the rising edge of external clock signal ext.CLK at time t2, respectively, are converted into parallel data by data I/O circuit 1086 and, at time t3, are output to global I/O bus G-I/O.

In the following description, data which is written into the even address regions (i.e., regions corresponding to the even addresses) in banks 0–7 of SDRAM 1000 shown in FIGS. 1A and 1B will be referred to as data DLE, and data written into the odd address regions will be referred to as data DLO.

Likewise, data written into the even address regions in banks 8 to 15 will be referred to as data DUE, and data written into the odd address regions in banks 8 to 15 will be referred to as data DUO.

Accordingly, data D00–D30 which are applied to data I/O terminals DQ0–DQ3, respectively, are simultaneously written at time t3 into four memory cells, which are simultaneously selected in response to activation of one column select line in the even address regions of the corresponding bank (e.g., regions 100a0 and 100a1 in bank 0).

Writing is likewise performed for the other terminals and, more specifically, data D40–D70, D80–D110 and D120–D150, which are written into data I/O terminals DQ4–DQ7, DQ8–DQ11 and DQ12–DQ15 simultaneously with data D00 already described, are written into the even address regions in the corresponding banks, respectively.

Data which are applied to data I/O terminals DQ16–DQ31 simultaneously with data D00 are written, as data DUE, into the corresponding banks.

In the period of external clock signal ext.CLK starting from time t2, data D01–D31 which are written into data I/O terminals DQ0–DQ3 in synchronization with the falling edge of the clock signal are converted into parallel data by data I/O circuit 1086, and are written into odd address regions in the corresponding banks (e.g., regions 100a2 and 100a3 in bank 0), respectively.

Regarding data I/O terminals DQ4–DQ15, data which are applied through them simultaneously with data D01 are written, as data DLO, into odd address regions in the corresponding banks, respectively.

Further, the data applied to data I/O terminals DQ16–DQ31 simultaneously with data D01 are written, as data DUO into the odd address regions in the corresponding banks.

Thereafter, writing is performed in a similar manner. More specifically, data which is applied to the data I/O terminals in response to the rising edge of external clock signal ext.CLK is written into the even address regions in the corresponding bank, and data which is applied to the data I/O terminals in response to the falling edge of external clock signal ext.CLK is written into the odd address regions in the corresponding bank.

FIG. 6 is a timing chart showing more specifically a flow of data applied to the data I/O terminals in the read operation of SDRAM 1000 shown in FIG. 4.

Referring to FIGS. 4 and 6, SDRAM 1000 is supplied with the ACT command at time t10, and thereafter is supplied with the READ command at time t11. In response to this READ command, data is simultaneously read from the even and odd address regions in each bank. The data thus read from the bank is transmitted to data I/O circuit 1086 through global I/O bus D-I/O, and is first held in the latch circuit of data I/O circuit 1086.

Subsequently, data DLE and DUE which are read from the even address regions in each bank are output to the corresponding data I/O terminals at time t13, respectively.

Subsequently, data DLO and DUO read from the odd address regions in each bank is output to the corresponding data I/O terminals in response to the falling edge of the clock signal in the cycle of external clock signal ext.CLK starting from time t13.

Thereafter, the operation is performed in a similar manner in accordance with the period of internal clock signal int.CLK synchronized with external clock signal ext.CLK. More specifically, the data read out in parallel from each bank is held in data I/O circuit 1086, and thereafter the data is successively converted into serial data and is sent to the corresponding data I/O terminals in response to the rising and falling edges of external clock signal ext.CLK.

The usual data input/output operations described above require the input pins and data I/O pins which are 59 in total number per one chip, as described above. This restricts the number of chips which can be simultaneously tested in parallel by one tester.

[Data Write Operation and Data Read Operation in Test Mode Operation]

Figure 7:
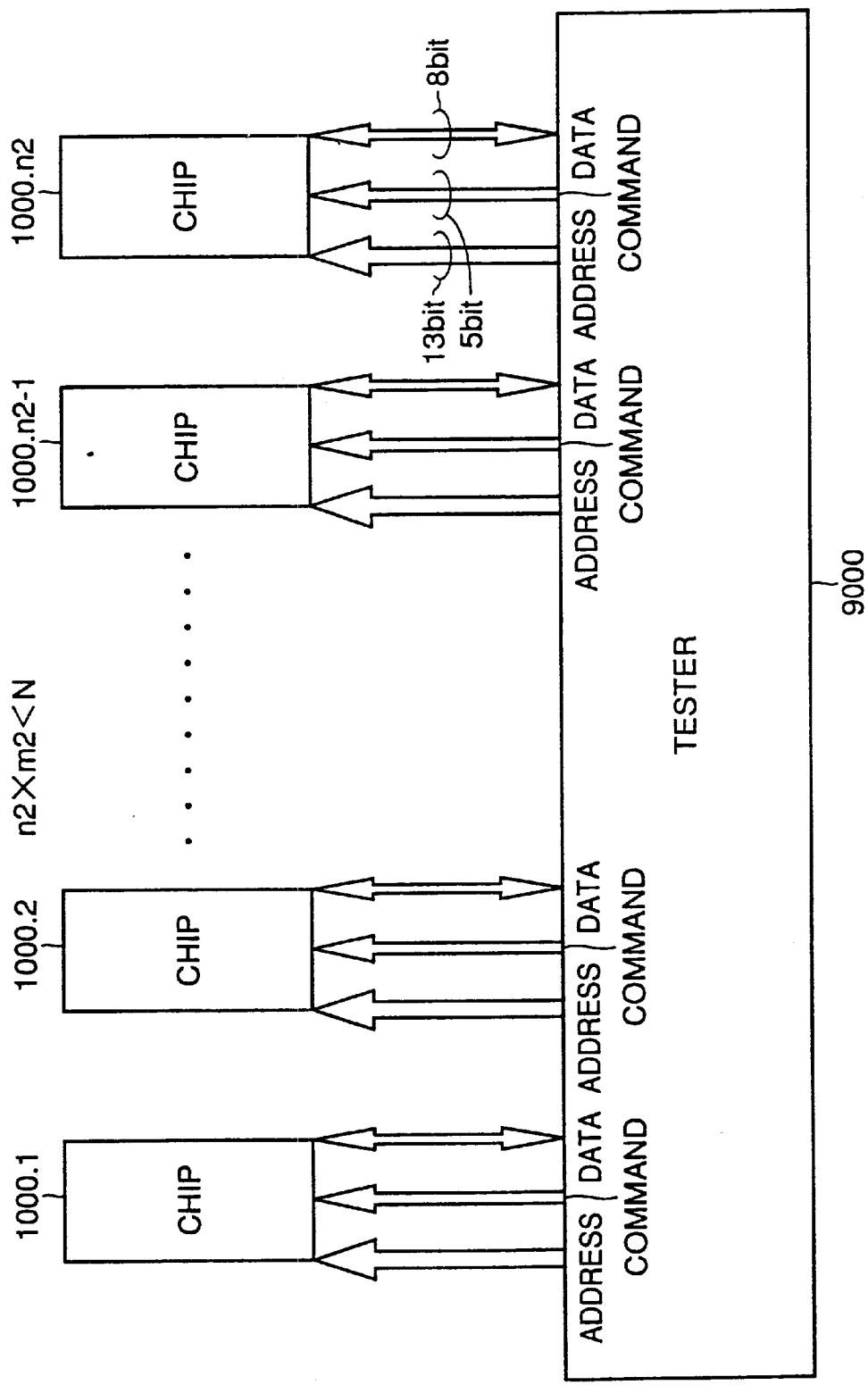
FIG. 7 conceptually shows a structure for carrying out a simultaneous parallel test on SDRAM 1000 by a tester 9000 in a test operation mode.

FIG. 7 conceptually shows a structure for simultaneously testing SDRAMs 1000 in FIGS. 1A and 1B, which operate in the test mode, in parallel by tester 9000.

In the structure shown in FIG. 7, as will be described later, the address signal input terminals use pins equal in number to those shown in FIG. 3, but the control signal input terminals and data I/O terminals required in the test mode are reduced in number.

Therefore, the pins required per chip is m2 (<m1) in number so that the number n2 of chips which can be simultaneously tested can be increased even if the total number N of pins which can be simultaneously controlled by tester 9000 remains unchanged.

Figure 8:
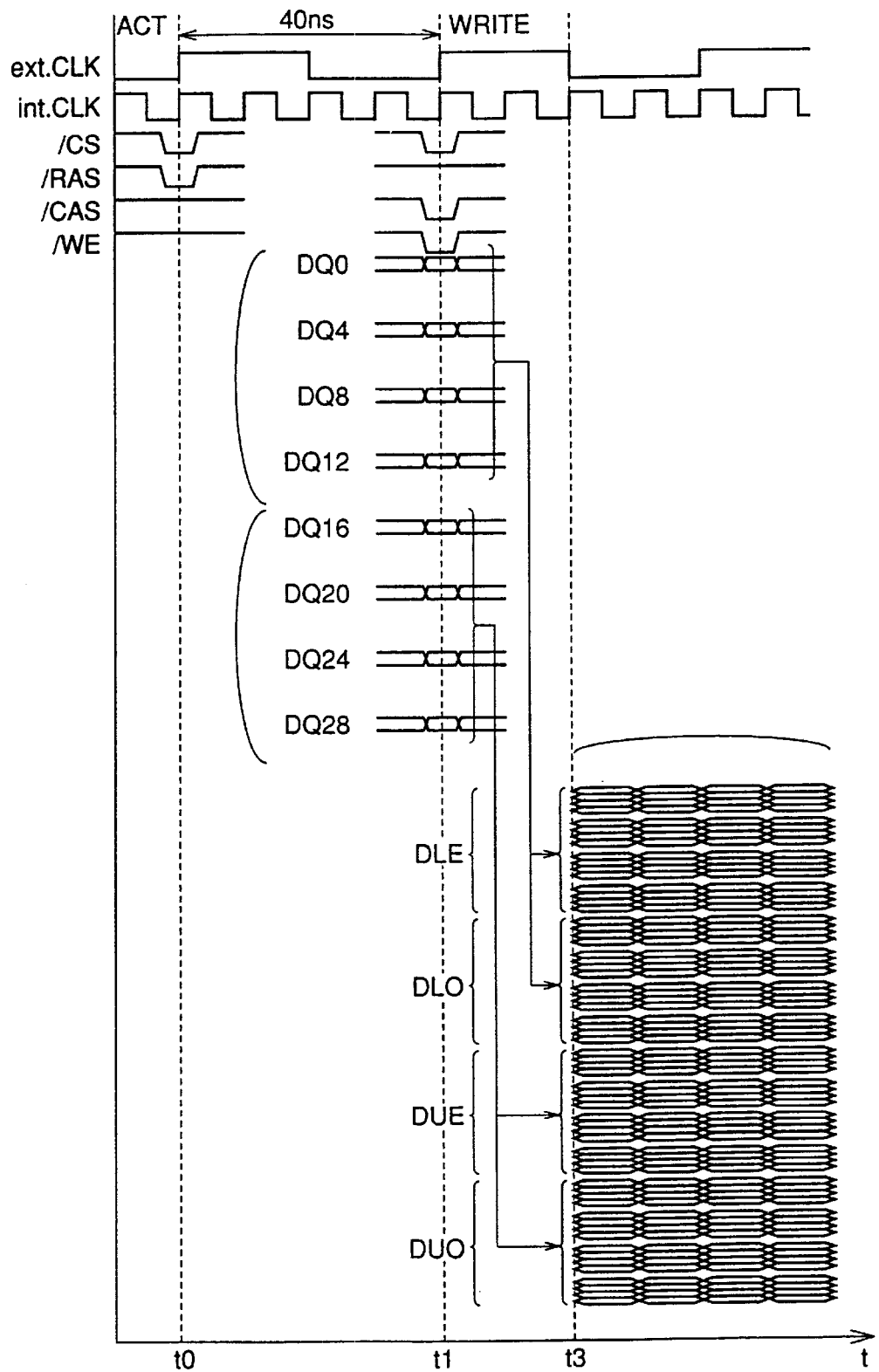
FIG. 8 is a timing chart showing a write operation of SDRAM 1000 in the test operation mode.

FIG. 8 is a timing chart, which shows the operation of SDRAM 1000 in the test operation mode already described with reference to FIG. 7, and is comparable with the timing chart of FIG. 5 showing data writing in the normal operation.

The test mode operation differs in the following two points.

First, external clock signal ext.CLK has a period, e.g., of 40 ns, and changes in the cycle larger than the operable frequency of the internal circuits of SDRAM 1000.

As will be described later, SDRAM 1000 internally produces internal clock signal int.CLK having a larger frequency than external clock signal ext.CLK in synchronization with external clock signal ext.CLK, and performs the circuit operations based on the internal clock signal int.CLK thus produced.

In the structure shown in FIG. 8, internal write data for the test operation is produced based on the data applied to eight data I/O pins among data I/O terminals DQ0–DQ31, i.e., data I/O terminals DQ0, DQ4, DQ8, DQ12, DQ16, DQ20, DQ24 and DQ28.

Accordingly, the ACT command is applied to SDRAM 1000 at the rising edge of external clock signal ext.CLK at time t0, and the WRITE command is applied to SDRAM 1000 at time t1 after one cycle of the external clock signal and, in other words, after four cycles of the internal clock signal from the application of the ACT command. At time t1, the write data is applied to each of eight data I/O terminals DQ0, DQ4, . . . and DQ28 described above.

Based on the data of 4 bits applied to data I/O terminals DQ0, DQ4, DQ8 and DQ12, data of 32×4 bits to be written into the corresponding banks are produced as data DLE and data DLO. Based on the data of 4 bits applied to data I/O terminals DQ16, DQ20, DQ24 and DQ28, data of 32×4 bits to be written into the corresponding banks are produced as data DUE and DUO.

More specifically, at time t3, data of 4×4 bits is produced as data DLE, and data of 4×4 bits is produced as data DLO. These are written into the even and odd address regions in the corresponding banks. Likewise, at time t3, data of 4×4 bits is produced as data DUE, and data of 4×4 bits is produced as data DUO. These are also written into the even and odd address regions of the corresponding banks.

In other words, the applied data is formed of 8 bits, but data of 64 bits is produced based on the externally applied data at time t1 for simultaneous writing. Thereafter, data each formed of 64 bits are produced in accordance with the period of internal clock signal, and are successively written into the even address regions and odd address regions of the corresponding banks.

In FIG. 8, external clock signal ext.CLK changes much more slowly than the operable frequency of SDRAM 1000 in contrast to the normal operation mode shown in FIG. 5. Therefore, the write data is shown to be applied to SDRAM 1000 simultaneously with the write command.

Figure 9:
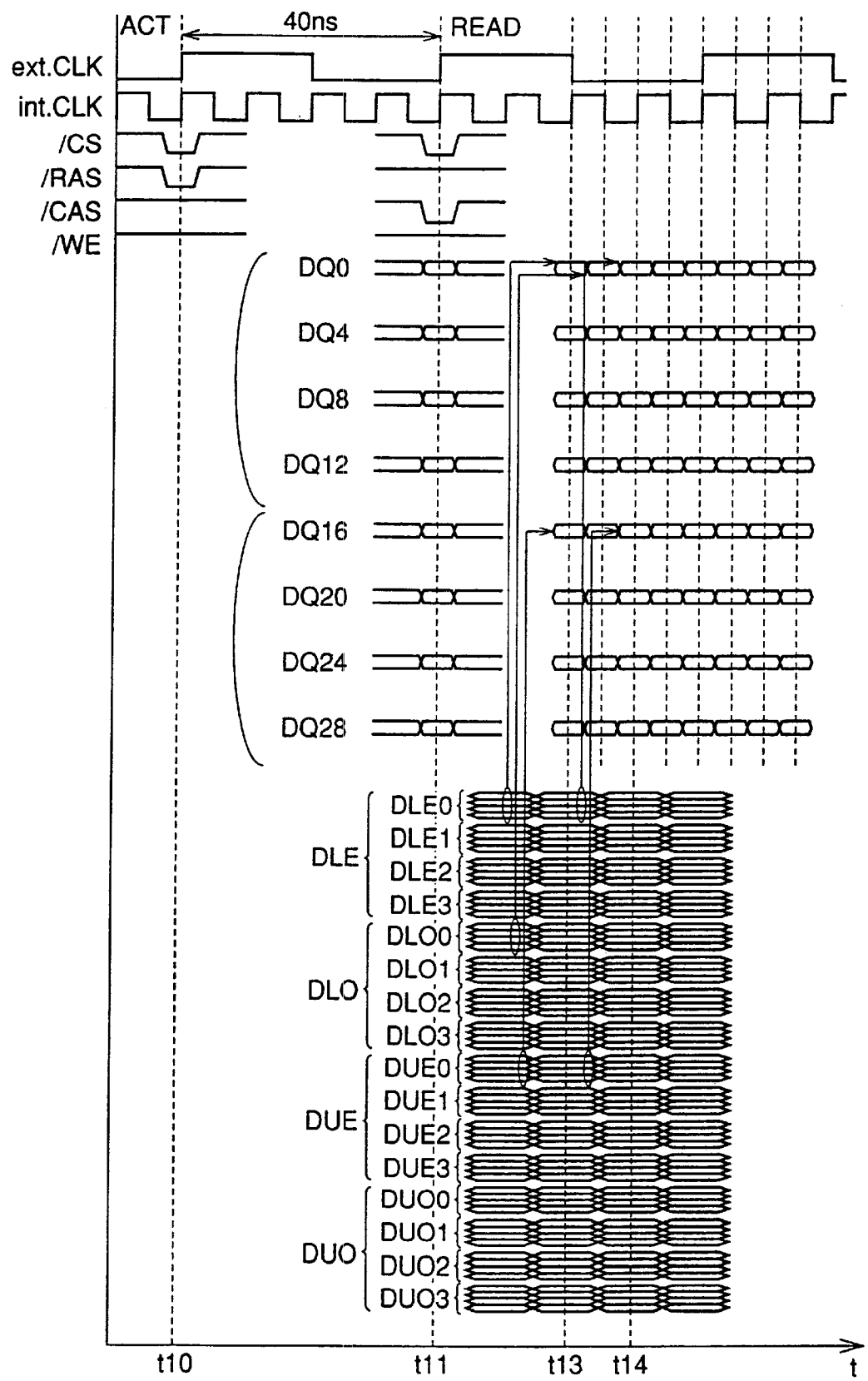
FIG. 9 is a timing chart showing a read operation of SDRAM 1000 in the test mode operation.

FIG. 9 is a timing chart showing an operation of SDRAM 1000 in the test mode operation.

At time t10, i.e., at the rising edge of external clock signal ext.CLK, SDRAM 1000 is supplied with the ACT command. At time t11 after one cycle of external clock signal ext.CLK from time t10, the READ command instructing the read operation is applied to SDRAM 1000 and, at the same time, data similar to that applied in the data write operation in FIG. 8 is applied to eight data I/O terminals DQ0, DQ4, ... and DQ28 used in the data write operation.

As will be described later, SDRAM 1000 issues data representing a result of comparison between the expected value data, which is produced based on the data applied at time t11, and the read data which is read from each bank.

More specifically, after the READ command is applied at time t11, data of 64 bits are read out in parallel from the even and odd address regions in each bank. The data thus read is compared with the expected values in the following manner. The comparison with the expected value is made on data of 4 bits, which corresponds to, e.g., data DLE in the read data and, in particular, is read out from the memory cells simultaneously activated by the single column select line. More specifically, the comparison is made between, e.g., data DLE0 of 4 bits, which is to be applied correspondingly to data I/O terminals DO1–DQ3 in the normal read operation, and the expected value to be read based on the data applied to data I/O terminals DQ0, DQ4, DQ8 and DQ12 at time t11. At time t13, data of 1 bit representing the result of comparison between the expected value and the 4-bit data is issued to data I/O terminal DQ0.

Likewise, at the rising edge of the clock signal in the cycle of internal clock signal int.CLK starting from time t13, data of 4 bits in data DLO and, more specifically, data of 4 bits issued to data I/O terminals DQ0–DQ3 in the normal operation mode is compared with the expected value produced in SDRAM 1000 based on the data which is applied to data I/O terminals DQ0–DQ12 at time t11. Data of 1 bit representing the result of comparison is applied to data I/O terminal DQ0.

At time t14, data I/O terminal DQ0 is supplied with data representing a result of comparison between data of 4 bits, which is included in data DLE and is read out in accordance with the next cycle of internal clock signal int.CLK, and the expected value produced based on the data, which is applied to data I/O terminals DQ0–DQ12 at time t11.

Thereafter, a result of comparison made between the value of data DLE0 of 4 bits, which is included in data DLE and is issued to data I/O terminals DQ0–DQ3 in the normal operation, and the above expected value as well as a result of comparison made between the value of data DLO0 of 4 bits, which is included in data DLO and is issued to data I/O terminals DQ0–DQ3 in the normal operation, and the above expected value are issued from data I/O terminal DQ0 in response to the rising edge and falling edge of internal clock signal int.CLK, respectively.

Operations are performed similarly to the above with respect to other data I/O terminals DQ4, DQ8 and DQ12.

Data representing a result of comparison made between the read data, which is to be issued to respective data I/O terminals DQ16–DQ19 in the normal operation mode, and the above expected value is successively issued from data I/O terminal DQ16.

Operations. are performed similarly to the above with respect to other data I/O terminals DQ20, DQ24 and DQ28.

By the above operations, internal clock signal int.CLK changes faster than externally applied external clock signal ext.CLK in the test operation mode even if external clock signal ext.CLK has a large cycle. Since the internal circuits of SDRAM 1000 operate in synchronization with internal clock signal int.CLK, it is possible to reduce a load on the tester device testing SDRAM 1000.

Further, the test operation mode requires only the data I/O terminals of 8 bits among the data I/O terminals of 32 bits in total. Therefore, it is possible to reduce the total number of the input pins and data I/O pins, which must be controlled by the tester, per one chip of SDRAM 1000, and it is possible to increase the number of chips which can be simultaneously tested in parallel by tester 9000.

[Allocation of I/O Pins in Test Operation Mode]

FIG. 10 shows a situation of use of the input pins and data I/O pins of SDRAM 1000 shown in FIGS. 1A and 1B in the test operation mode.

In the test operation mode described with reference to FIGS. 8 and 9, both external clock signals ext.CLK and /ext.CLK are in use. In control signal input terminal group, terminals for signals CKE, /CE, /RAS, /CAS and /WE are used, but the input pins for data mask signals DM0–DM3 designating the data mask operation are not used. Also, the input terminal for signal QS which is externally applied for specifying the data input timing is not used.

Further, data reference potential input terminal Vref for receiving the reference potential of input data is not used. In this case, such a structure may be employed, for example, that the data reference potential is produced based on power supply potential Vcc within SDRAM 1000. Thereby, the data level can be determined even if data reference potential Vref is not externally applied.

Address signal input terminal group A0–A12 is entirely used for designating the row and column addresses as already described. However, bank signal input terminal group BA0–BA2 can be set unused by employing such a structure that all the banks are simultaneously activated for writing the test data thereinto.

With respect to the data I/O terminal group, 4×2 bits in 16×2 bits are used as already described. Thus, the number of the data I/O pins used in the test mode is reduced to a quarter compared with the normal operation mode, and this structure is employed for the following reason.

As already described, the memory cells of 4 bits are simultaneously selected in SDRAM 1000 by activation of one column select line. Since this unit of selection by the column select line is generally a unit of substitution with a redundant column, the manner in which data writing and reading are performed by producing the data patterns each for 4 bits can improve an efficiency, and is advantageous in determination of substitution with the redundant column.

The data I/O terminal group may be partially used as a part of input pins for inputting the row address when the row-related operation is enabled. This allows further reduction of the number of the address signal input terminals required in the test. This is because, in SDRAM 1000 shown in FIGS. 1A and 1B, the bits of the address signal applies as the column address is larger in number than the bits of the address signal applied as the row address.

All the terminals for external power supply VddQ for output, ground potential VssQ for output, external power supply potential Vdd and ground potential Vss are in use.

[Flow of Processing in Test Operation Mode]

Figure 11:
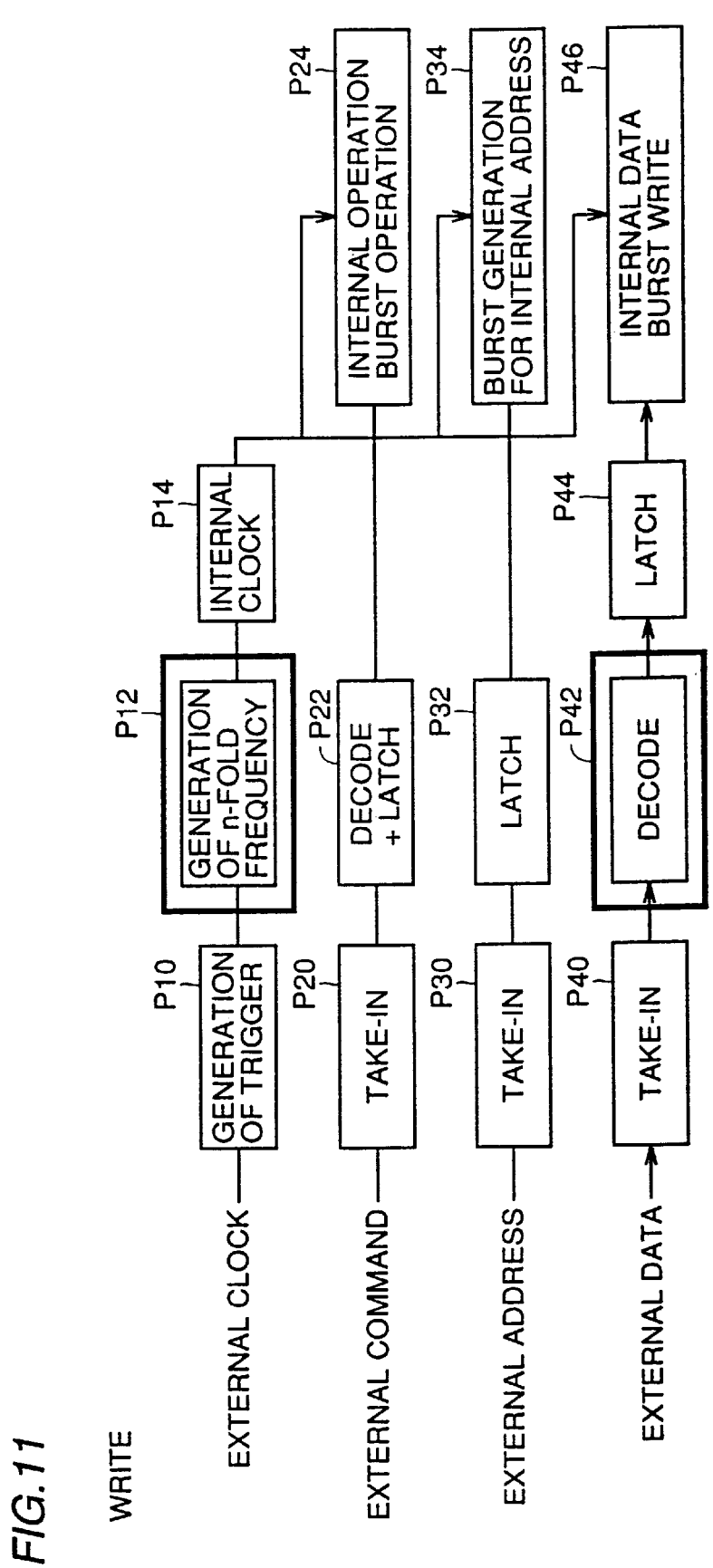
FIG. 11 shows a flow of processing blocks for producing internal addresses and producing write data in the test operation mode.

FIG. 11 shows processing performed by the SDRAM in the test operation mode shown in FIGS. 8 and 9, and particularly shows a flow of processing blocks for producing the internal address and write data.

Based on external clock signals ext.CLK and /ext.CLK, a trigger is issued for producing internal clock signal int.CLK (step P10). In the normal operation mode, generation of internal clock signal int.CLK is performed directly based on this trigger. In contrast to this, a signal of an n-fold frequency is first generated based this trigger in the test operation mode (step P12). Then, internal clock signal int.CLK is produced based on the signal having the frequency n times larger than that of external clock signals ext.CLK and /ext.CLK (step P14).

The external command is taken into the device in synchronization with the external clock signal (step P20), and is decoded and latched (step P22).

In response to the command data and internal clock signal int.CLK, SDRAM 1000 internally performs writing (step P24).

The external address signal is likewise taken into the device in synchronization with external clock signal ext.CLK (step P30), and the address signal is latched in row or column address latch 250 or 550 (step P32).

Based on the address signal, burst address counter 1060 synchronized with internal clock signal int.CLK produces the internal address signal corresponding to the burst operation (step P34).

The external data is taken into the device through eight data I/O terminals DQ0, . . . DQ28 in synchronization with external clock signal ext.CLK, as already described (step P40). Subsequently, data of 64 bits, which is to be written simultaneously, is decoded and produced based on the data of 8 bits (step P42).

Figure 12:
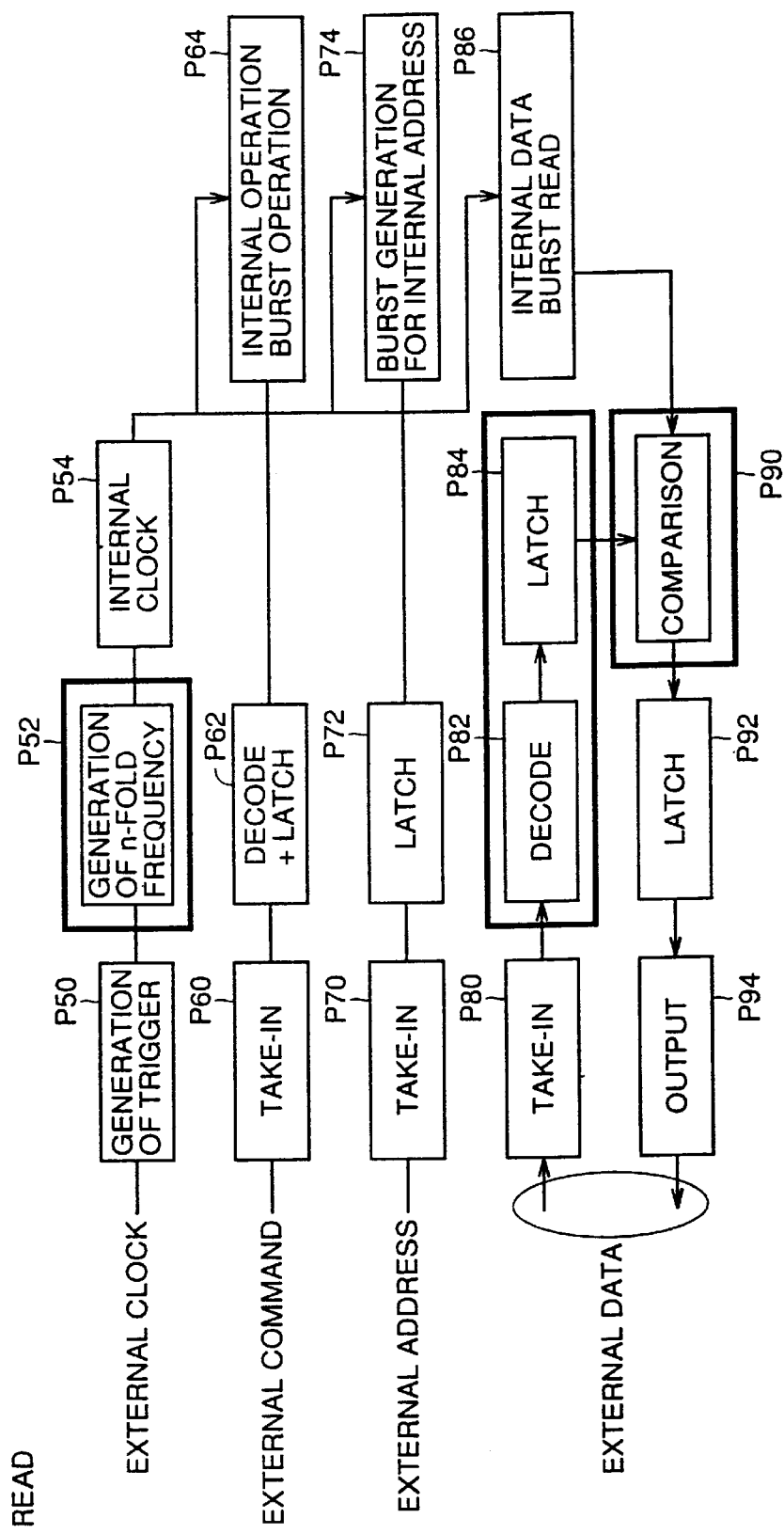
FIG. 12 shows processing steps of the read operation in the test operation mode.

FIG. 12 shows processing steps of the read operation in the test operation mode already described with reference to FIG. 9.

Similarly to the operation in FIG. 11, a trigger signal for producing the internal clock is produced in accordance with external clock signals ext.CLK and /ext.CLK (step P50). In accordance with the trigger thus generated, a signal having a frequency which is n times larger than that of external clock signal ext.CLK is produced (step P52), and internal clock signal int.CLK is produced based on the signal having the n-fold frequency (step P54).

The external control signal is taken into mode decoder 20 in accordance with external clock signal ext.CLK (step P60) for decoding and latching (step P62). In accordance with the internal control signal thus decoded, SDRAM 1000 internally performs reading in synchronization with internal clock signal int.CLK (step P64).

The external address signal is taken into row address latch 250 and column address latch 550 in synchronization with external clock signal ext.CLK (step P70), and the address values thereof are held therein (step P72). In accordance with the column address held in column address latch 550, burst address counter 1060 produces the internal address signal for the burst operation (step P74).

Regarding the data I/O terminal, data is taken in through eight data I/O terminals DQ0–DQ28 for producing the expected value data at time t11 shown in FIG. 9 (step P80). The expected value data is produced by decoder circuit 1088 based on the data of 8 bits thus taken (step P82), and is held by the latch circuit (step P84).

In accordance with the internal address signal, data is read from each bank (step P86), and the read data is compared with the expected value data held in step P84 (step P90). The result of this comparison is held in the latch circuit provided correspondingly to each of data terminals DQ0–DQ31 (step P92), and is externally output from corresponding one of data I/O terminals DQ0–DQ31 in response to each of the rising and falling edges of internal clock signal int.CLK.

Figure 13:
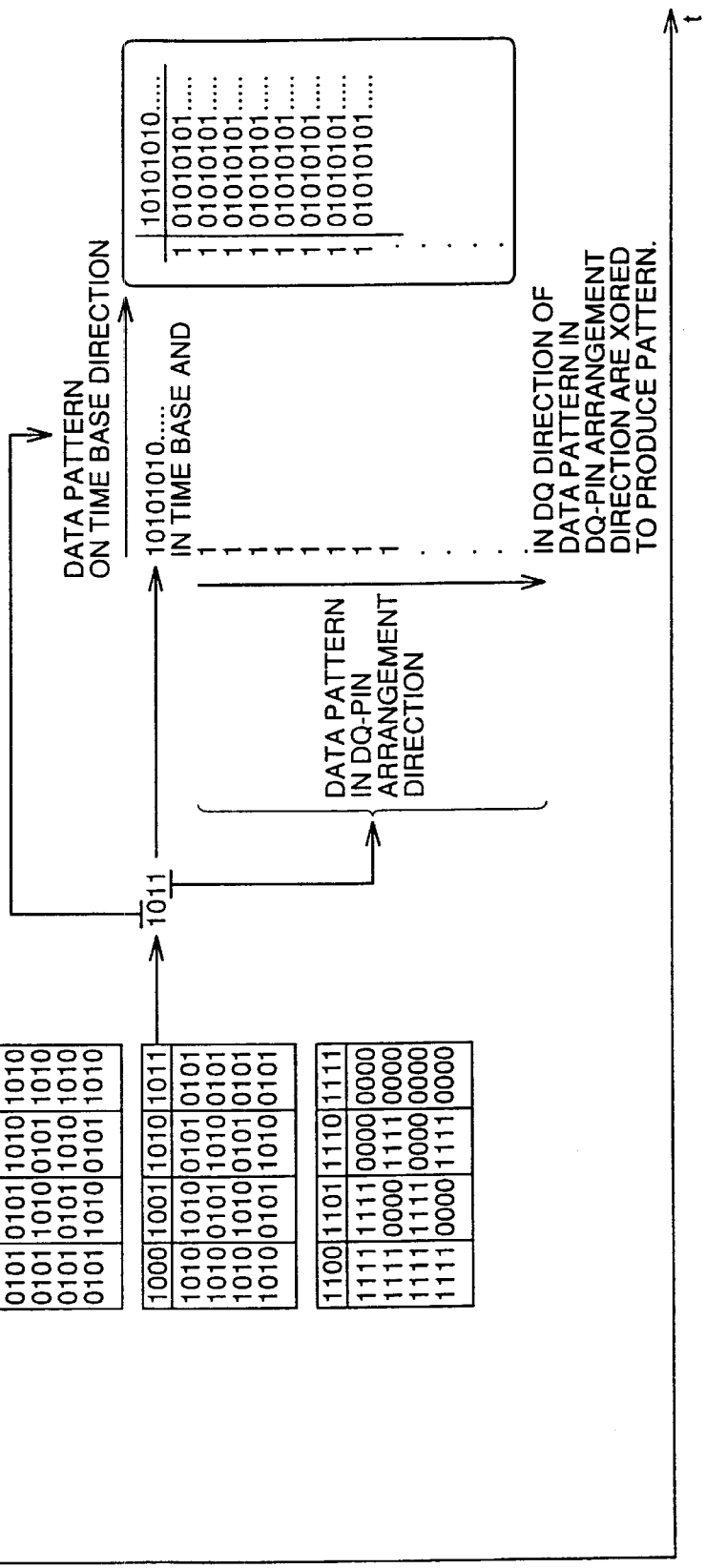
FIG. 13 conceptually shows a process of decoding and thereby producing the write data based on externally applied data in the test mode.

FIG. 13 conceptually shows a process performed in the steps shown in FIGS. 11 and 12, and more specifically shows, in detail, a process for producing the write data by decoding based on the externally applied data in the test mode.

In this case, the write data is produced in such a manner that the data I/O terminals are divided into groups each including 16 data I/O terminals DQ0–DQ15 or DQ16–DQ31.

Description will now be given on the internal write data which is produced correspondingly to data I/O terminals DQ0–DQ15 in the test operation mode.

In the completely same manner, the internal write data is produced correspondingly to data I/O terminals DQ16–DQ31 in the test operation mode.

Among data I/O terminals DQ0–DQ15, data of 4 bits is applied to data I/O terminals DQ0, DQ4, DQ8 and DQ12 in the test operation mode. The four bits of this data can be combined in sixteen manners as shown in FIG. 13. In the test operation mode, the data pattern in the time base direction is determined by higher two bits in the 4-bit data, i.e., the data applied to data I/O terminals DQ12 and DQ8. The data pattern of the write data corresponding to each of data I/O terminals DQ0–DQ15 is produced on the basis of the data applied to the lower two bits in the 4-bit data, i.e., data applied to data I/O terminals DQ4 and DQ0.

For example, when the 4-bit data is "1011", the data formed of repetitions of the data "10" provides the reference in the time base direction, and the data formed of repetitions of data "11" of the lower 2 bits in the 4-bit data provides the reference for each of the data I/O terminals DQ0–DQ15.

Thus, an exclusive-OR (XOR) is obtained between the data of "1010 . . . " running in the time base direction and the data of "1111 . . . " running in the direction of the data I/O terminals, respectively, whereby the write data in the test operation mode is produced.

For example, if the 4-bit data is "1011", the data written into respective data I/O terminals DQ0–DQ15 is "0101 . . . " in the time base direction.

Figure 14:
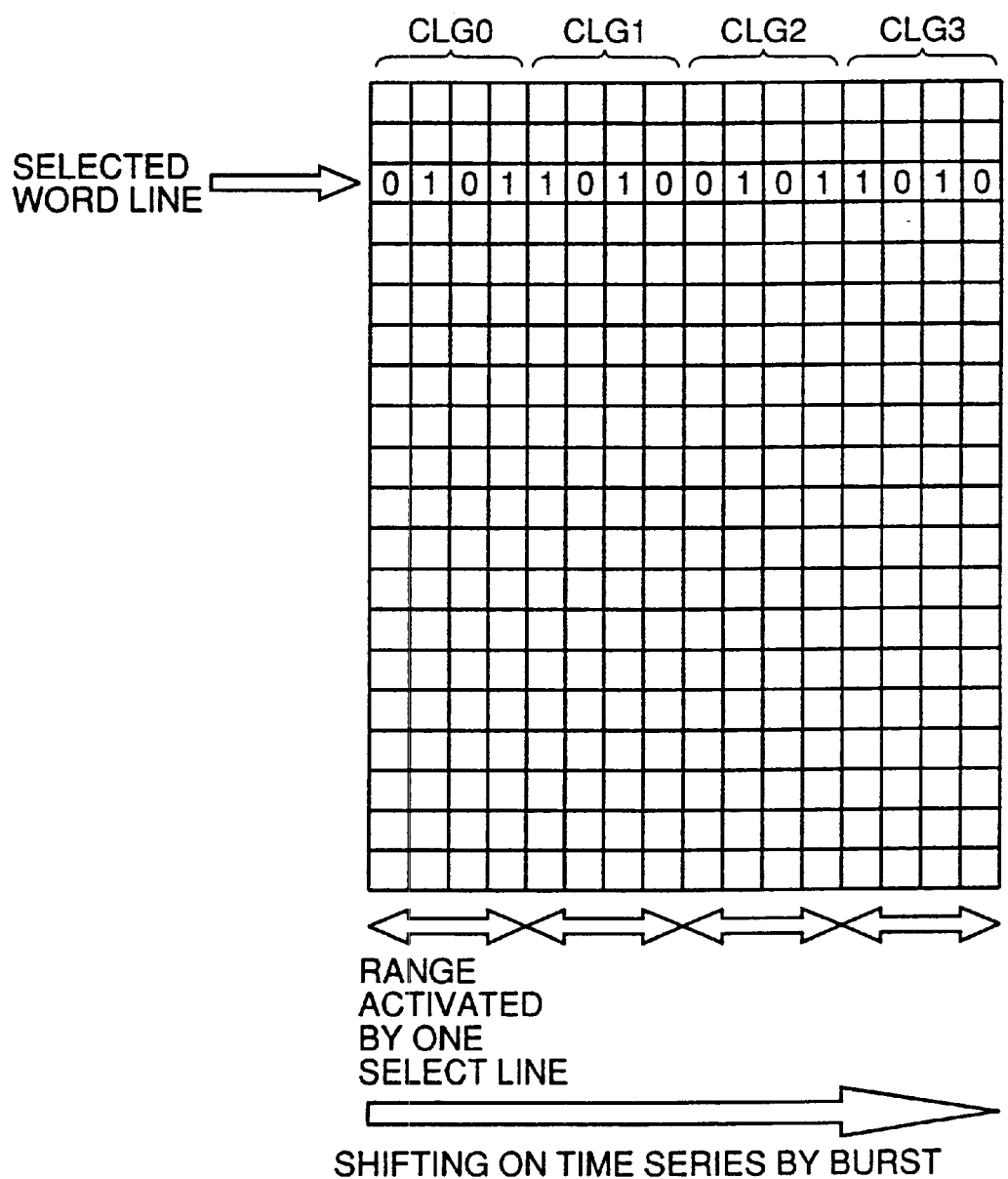
FIG. 14 conceptually shows a manner of writing the write data into memory cell arrays in respective banks in the test operation mode.

FIG. 14 conceptually shows a situation wherein the write data thus produced in the test operation mode is written into the memory cell array in each bank.

As already described, the memory cell columns corresponding to 4 bits are selected by activation of one column select line in each bank. In accordance with the externally applied address signal, one row (word line) is selected. Data pattern of, e.g., "0101" which is produced when data of 4 bits is "0101" is simultaneously written into a group CLG0 of the columns which are selected in response to activation of one column select line SCL0.

Data pattern of "1010" is written into a group CLG1 of columns which are selected in the later cycle of internal clock signal int.CLK, because it is assumed that the data pattern applied to data I/O terminals DQ0–DQ12 is "0101".

Thereafter, data pattern "0101" is likewise written into a column group CLG2 which is successively selected in the next cycle in time series by the burst operation, and data pattern "1010" is written into a column group CLG2 selected in the next cycle.

Figure 15:
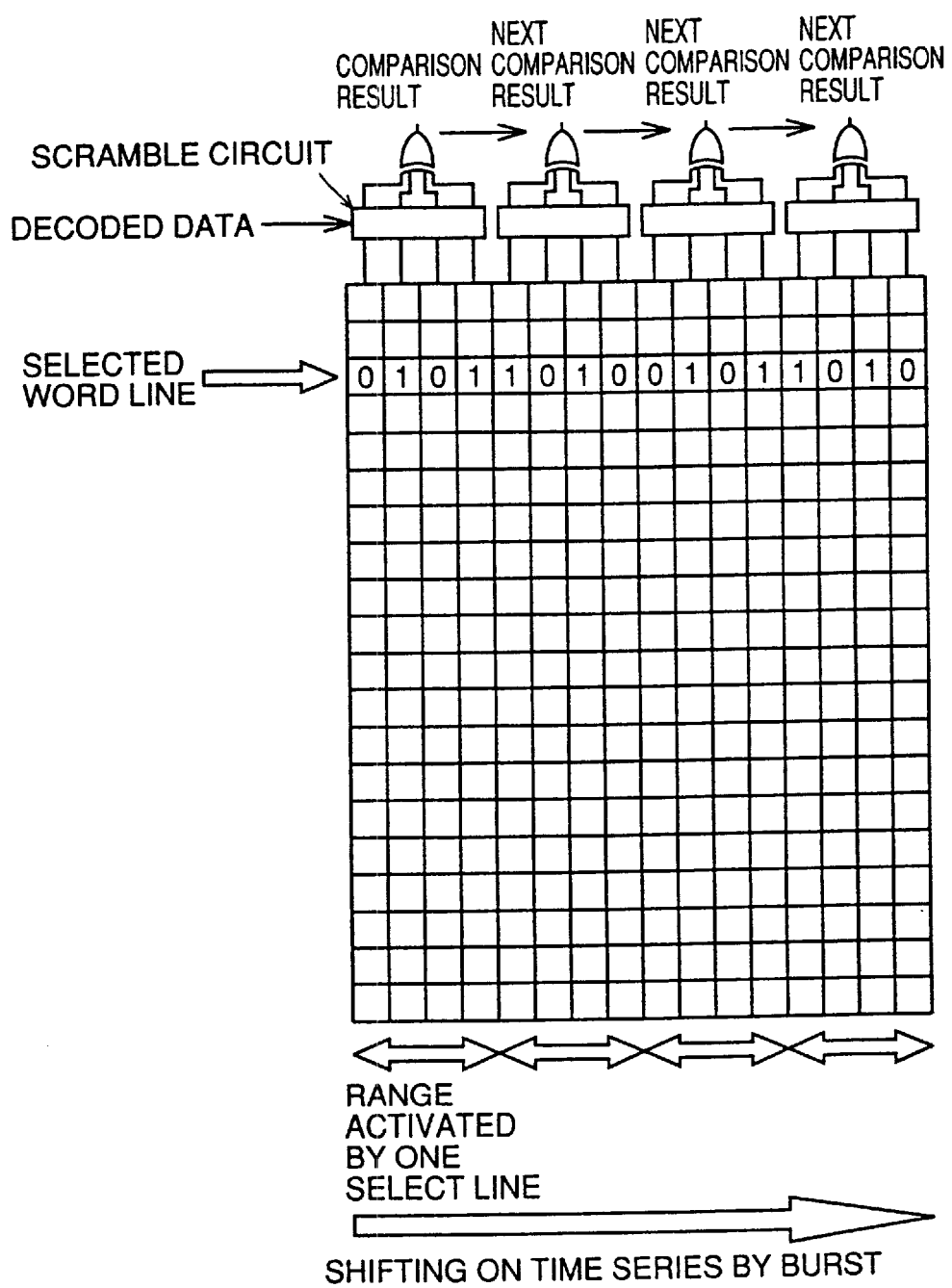
FIG. 15 conceptually shows an operation of issuing results of comparison of date with expected values during the read operation in the test operation mode.

FIG. 15 conceptually shows an operation of issuing a result of comparison made between the data, which is written into the memory cells in the test operation mode, and the expected value in the read operation.

When column group CLG0 is selected in the first read cycle in the read operation and the selected memory contains no defect, data pattern "0101" written in the operation in FIG. 14 is read out in parallel. In the cycle wherein the read command is applied during the read operation, bits of read data are compared four by four with the expected value data produced by the same decode operation as that in the write operation based on the data applied to data I/O terminals DQ0–DQ12, and the result of comparison is issued to data I/O terminal DQ0. In the next cycle of the read operation, memory cell column group CLG1 is selected, and the read data is compared with the expected value data. Thereby, the data of comparison result is likewise issued to data I/O terminal DQ0. The comparison of the data of 4 bits is performed by an exclusive-OR operation.

Accordingly, when all the read data match the expected value data, the data of "0" level is issued from the corresponding data I/O terminal. However, if any one of the read data is different from the expected data, data "1" is issued from the corresponding data I/O terminal.

With respect to other data I/O terminals DQ4, DQ8 and DQ12, the operation is performed in a similar manner.

Further, the operation is performed similarly with respect to data I/O terminals DQ16, DQ20, DQ24 and DQ28.

Owing to the above operations, SDRAM 1000 can perform the internal operation in accordance with internal clock signal int.CLK having a sufficiently short period even if the external clock signal does not have a high frequency. Further, the data written by the write operation in the test operation mode is compared with the expected value, and each result of the comparison which is issued at one time relates to 4 bits. Therefore, it is possible to reduce the number of data I/O terminals, to or from which the tester must transmit the data in the test operation mode.

[Specific Structure of SDRAM 1000]

Figure 16:
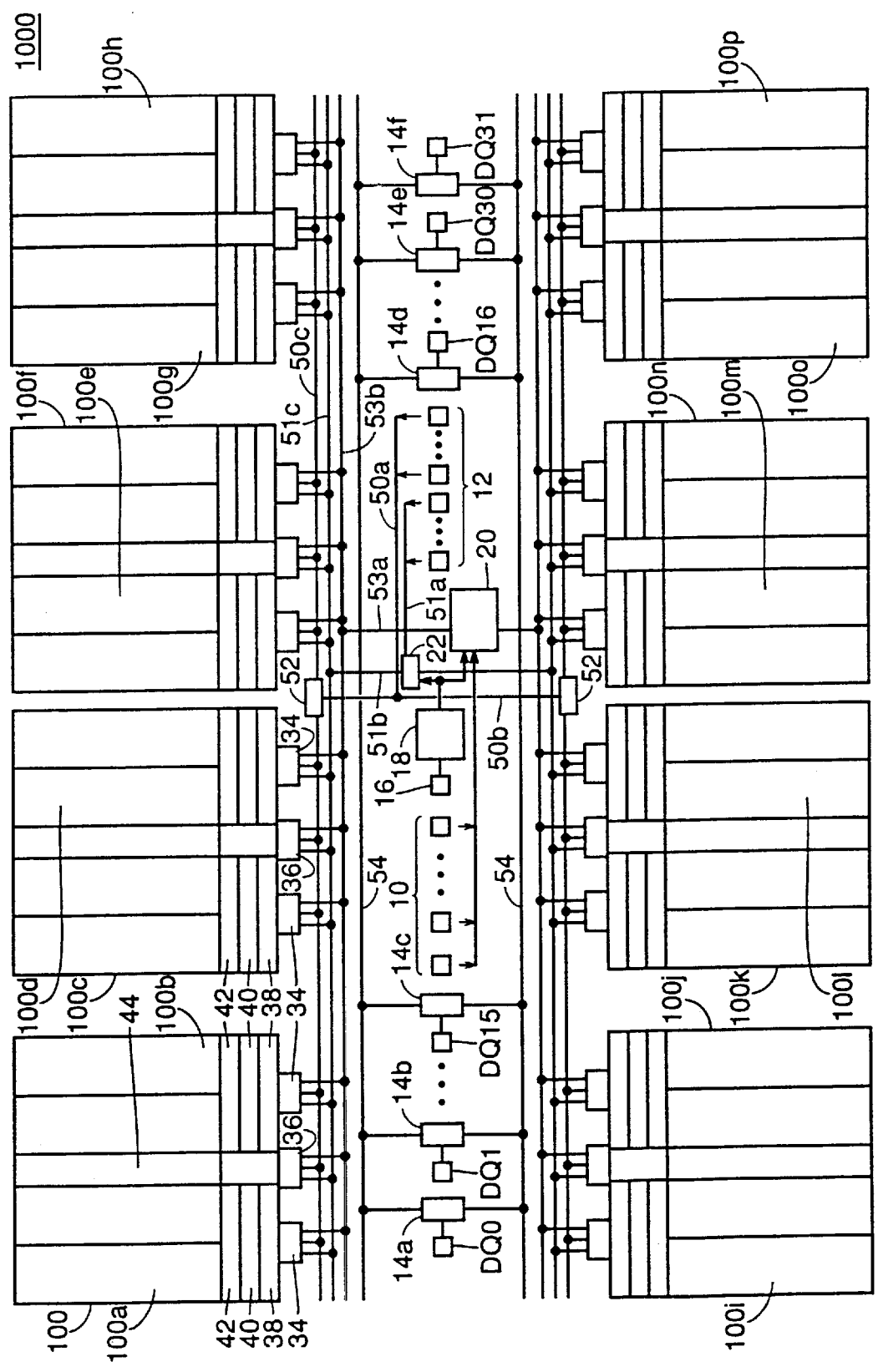
FIG. 16 is a schematic block diagram showing more specifically the structure of SDRAM 1000.

FIG. 16 is a schematic block diagram showing more specifically the structure of SDRAM 1000 shown in FIGS. 1A and 1B.

Referring to FIG. 16, SDRAM 1000 includes mode decoder (control circuit) 20, which receives and decodes external control signals /RAS, /CAS, /W, /CS and others through external control signal input terminal group 10 for issuing the internal control signals, command data buses 53a and 53b transmitting the internal control signals issued from mode decoder 20, and a memory cell array 100 including the memory cells arranged in rows and columns.

The memory cell array 100 is divided into 16 memory cell blocks 100a–100p as shown in FIG. 16. If SDRAM 1000 has a storage capacity of, e.g., 1 Gbits, each memory cell block has a storage capacity of 64 Mbits. Each block has a structure allowing operation as an independent bank.

SDRAM 1000 further includes internal control clock producing circuit 18, which receives mutually complementary external clock signals ext.CLK and /ext.CLK applied to respective clock signal input terminals 16a and 16b, and starts the synchronous operation under control of control circuit 20 to issue internal clock signals int.CLK1 and int.CLK2.

External address signals A0–Ai (i: natural number) applied through address signal input terminal group 12 are taken into synchronous semiconductor memory device 1000 under the control of control circuit 20 in synchronization with second internal clock signal int.CLK2.

Among external address signals A0–Ai, the data of a predetermined number of bits is applied to bank decoder 22 through an address bus 51a. From bank decoder 22, decoded bank addresses B0–B7 are transmitted to the respective banks through address buses 51b and 51c.

Other external address signals applied to address signal input terminal group 12 are transmitted to address driver 52 through address buses 50a and 50b. The address signals are transmitted from address driver 52 to the respective banks (memory cell blocks) through an address bus 50c.

SDRAM 1000 further includes row predecoder 36 which latches and predecodes the row address transmitted through address bus 50c under the control of mode decoder 20, row decoders 44 which select the corresponding rows (word lines) in the memory cell blocks selected in accordance with the outputs of row predecoders 36, respectively, column predecoders 34 for latching and predecoding the column addresses transmitted through address bus 50c under the control of mode decoder 20, column predecoder lines 40 transmitting the outputs of predecoders 34, respectively, and column decoders 42 which select the corresponding columns (bit line pairs) in the selected memory cell blocks in accordance with the outputs of column predecoder lines 40, respectively.

SDRAM 1000 further includes data input terminals DQ0–DQ15 and DQ16–DQ31 arranged in central regions of the chip, which extend in a lengthwise direction of the chip and are located at the opposite sides of a region provided with external control signal input terminal group 10 and address signal input terminal group 12, I/O buffer circuits 14a–14f provided correspondingly to the respective data I/O terminals DQ0–DQ31, a data bus 54 for transmitting data between the I/O buffer and the corresponding memory cell block, and read/write amplifiers 38 which are provided correspondingly to memory cell blocks 100a–100b for transmitting data between data bus 54 and the selected memory cell columns, respectively.

I/O buffer circuits 14a–14f correspond to bidirectional I/O buffers 1072–1082 shown in FIG. 1A, and transmit data to and from memory cells 100 through data I/O circuit 1086.

The data transmission through data I/O terminals DQ0–DQ31 is performed in synchronization with first or second internal clock signal int.CLK1 or int.CLK2 depending on whether the operation is in the SDR-SDRAM operation mode or the DDR-SDRAM operation mode. Further, the operation of taking in data may be performed in synchronization with externally applied signal DQS, depending on the operation mode.

Figure 17:
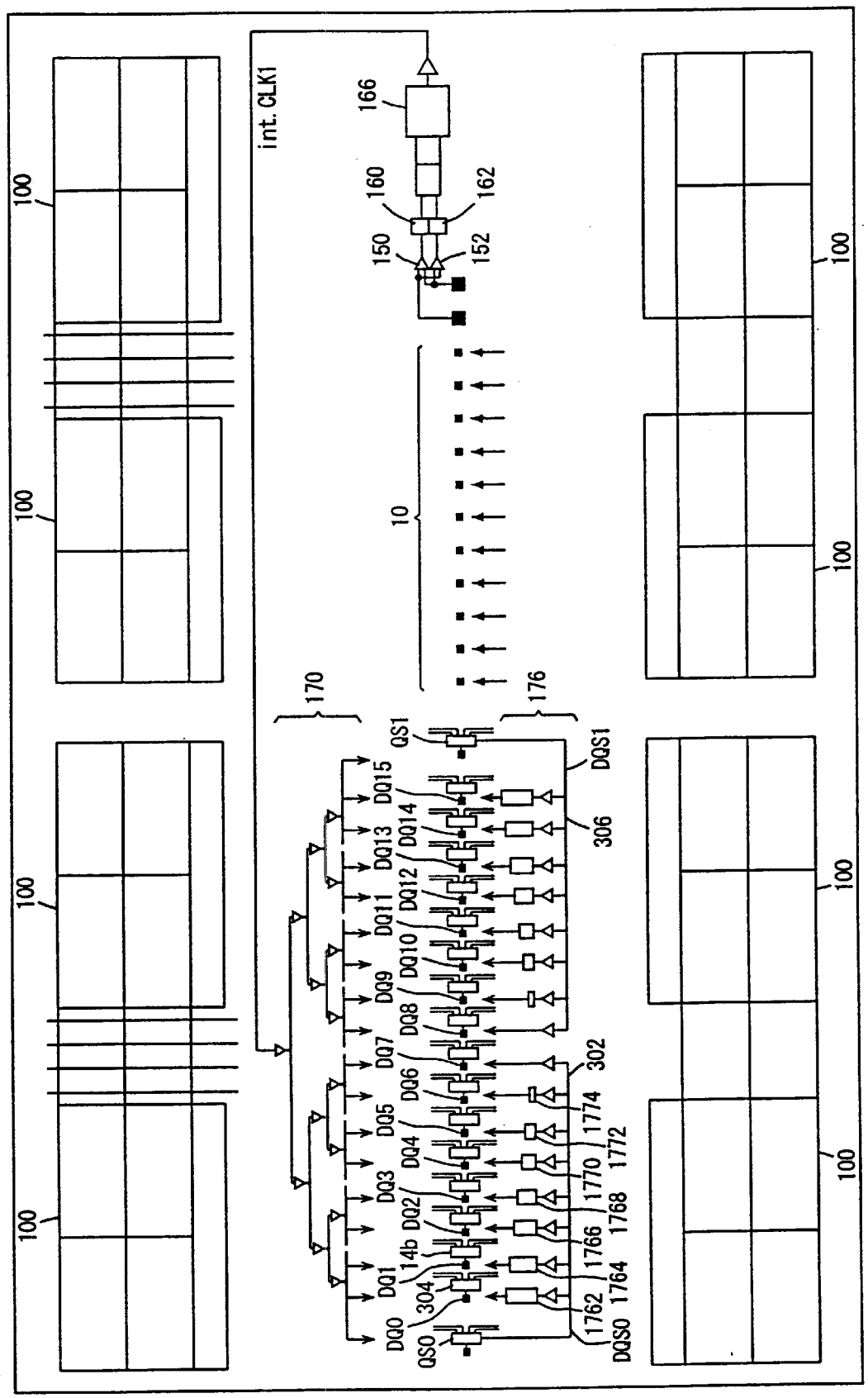
FIG. 17 is a schematic block diagram showing structures of clock trees 170 and 176.

FIG. 17 is a schematic block diagram showing structures of clock trees 170 and 176.

Clock tree 170 governing the data output has the following structure. Clock signal int.CLK1, which has a frequency twice as large as that of external clock signal ext.CLK and is issued from a synchronous mirror delay circuit 166 receiving complementary external clock signals ext.CLK and /ext.CLK, is successively halved in a tree-like manner through a clock tree 168 finally producing 16 divided internal clock signals, which are distributed to corresponding data I/O terminals DQ0–DQ7 and DQ8–DQ15, respectively.

The divided signal is also sent to data strobe terminal QS through a dummy delay circuit having the same delay time.

If data strobe terminal QS is located close to data I/O terminal DQ0 or DQ15, it is possible to ignore a difference in phase between the clock signal applied to the data I/O terminal described above and the clock signal applied to the DQS signal I/O terminal. Therefore, the above dummy delay circuit can be eliminated. The data output operation can be controlled by internal clock signal int.CLK1 distributed in the above manner.

Description will now be given on a structure of a clock tree 176, which distributes the clock when data input is performed in the bidirectional mode and others.

Clock tree 176 is provided on a signal distribution path with an element 1762, which is located dosed to DQS signal input terminal QS0 and has the largest delaying amount, as well as elements 1764, . . . and 1774, which are arranged so that each element can provide a smaller delay amount than that in the preceding position, i.e., position closer to input terminal QS0. Owing to this structure, clock tree 176 can transmit externally applied signal DQS0 to the respective data input terminals with equal delays. Through delay elements 1762–1774, signal DQS0 is supplied to the corresponding data input terminals, respectively.

In the structure shown in FIG. 17, signal DQS0 is transmitted through a bus 302 to corresponding data I/O terminals DQ0–DQ7. Signal DQS0 transmitted through bus 302 is applied to corresponding data I/O terminal DQ0 through buffer circuit 304 and delay element 1762 having the largest delay amount.

Also, signal DQS0 is transmitted through the delay elements each having a smaller delay amount than the preceding one, in the order of data I/O terminals from DQ1 to DQ7, to corresponding data I/O terminals DQ1–DQ7, respectively.

Externally supplied signal DQS1 is distributed to data I/O terminals DQ8–DQ15 through a similar structure.

Figure 18:
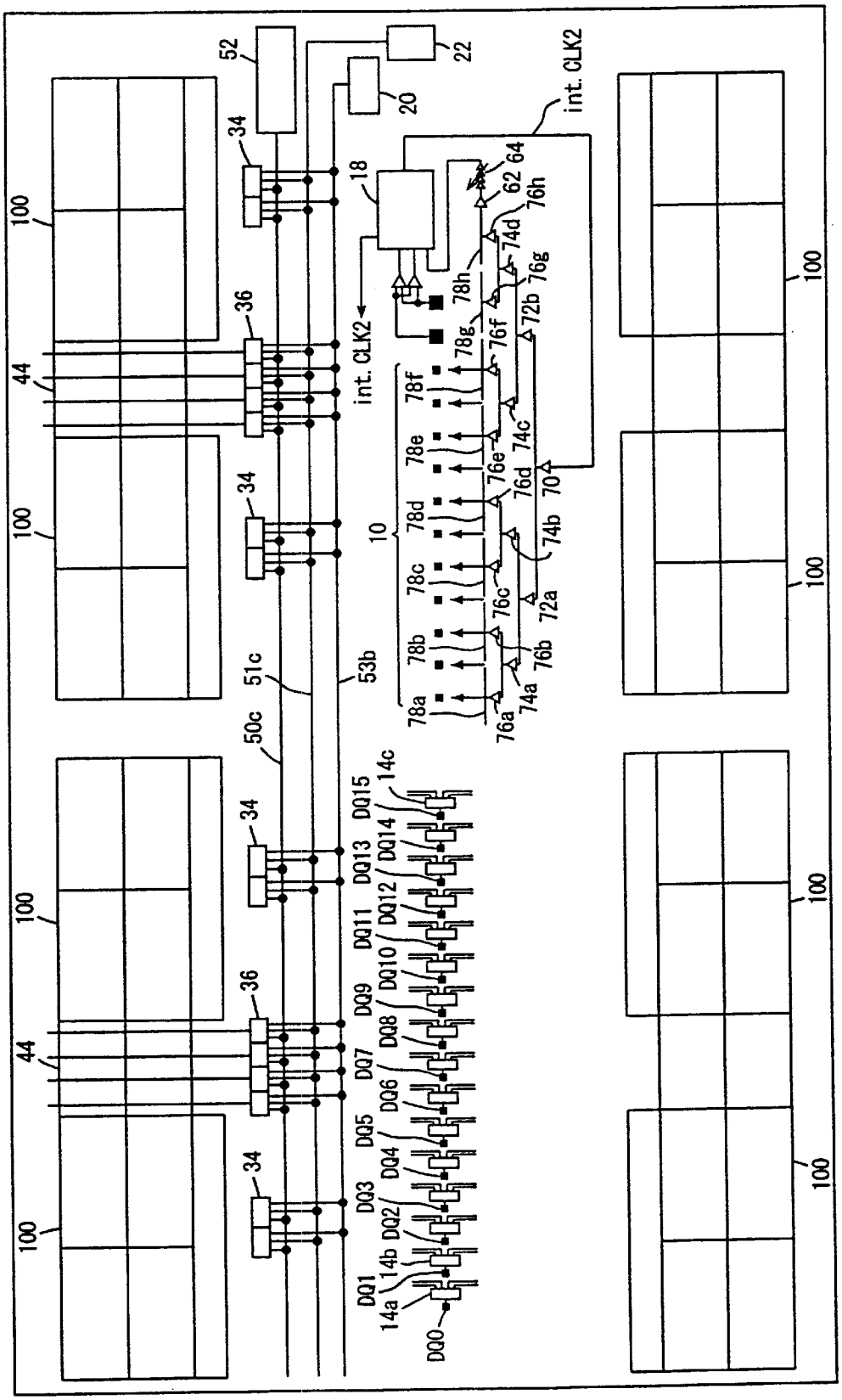
FIG. 18 is a schematic block diagram showing a structure of a clock tree 168.

FIG. 18 is a schematic block diagram showing a structure (which will be referred to as a "clock tree 168" hereinafter) in SDRAM 1000 shown in FIG. 16, which is employed for distributing second internal clock signal int.CLK2 to the input terminals in external control signal input terminal group 10.

Referring to FIG. 18, external clock signals ext.CLK and /ext.CLK applied to the clock signal input terminals are applied to internal control clock producing circuit 18 through buffer circuits 150 and 152, respectively.

Internal clock signal int.CLK2 issued from internal control clock producing circuit 18 is first applied to buffer circuit 70.

The output of buffer circuit 70 is divided into two, which are applied to buffer circuits 72a and 72b, respectively.

The output of buffer circuit 72a is divided into two, which are applied to buffer circuits 74a and 74b, respectively.

The output of buffer circuit 72b is likewise divided into two, which are applied to buffer circuits 74c and 74d, respectively.

Each of the outputs of buffer circuits 74a, 74b, 74c and 74d is divided into two, which are applied to corresponding buffer circuits 76a and 76b, buffer circuits 76c and 76d, buffer circuits 76e and 76f, or buffer circuits 76g and 76h.

Thus, the output of buffer circuit 70 is successively divided to produce finally eight clock signals. The eight clock signals are applied to interconnections 78a–78h, respectively. In synchronization with the clock signals supplied from ends of interconnections 78a–78h, external control signals are taken in from external control signal input terminal group 10.

The clock signal sent from the end of interconnection 78h is applied to internal control clock producing circuit 18 through a replica buffer circuit 62 and a delay adjust circuit 64. Internal control clock producing circuit 18 produces second internal clock signal int.CLK2 in synchronization with the phases of the output of delay adjust circuit 64 and external clock signal ext.CLK applied from buffer circuit 150.

If delay adjust circuit 64 were not present, buffer circuit 150 and replica buffer circuit 62 would have similar structures. As a result, external clock signal ext.CLK applied to buffer circuit 150 and the clock signal on interconnection 78h applied to replica buffer circuit 62 are adjusted to have equal phases. In this structure, phases of the clock signals on other interconnections 78a–78g are also equal to that of the clock signal on interconnection 78h.

Thus, the operation of taking in the external control signals would be performed in synchronization with external clock signal ext.CLK.

Since the amplitude level of external clock signal ext.CLK as well as a ratio of the active period of the clock signal with respect to the period thereof are different from those of internal clock signal int.CLK, they must be adjusted. Delay adjust circuit 64 is provided for this purpose.

With reference to FIG. 18, description has been given on the structure of distribution of internal clock signal int.CLK2 to external control signal input terminal group 10. A similar structure is provided for address signal input terminal group 12. Owing to this, the operation of taking in the address signal is performed in synchronization with external clock signal ext.CLK.

Figure 19:
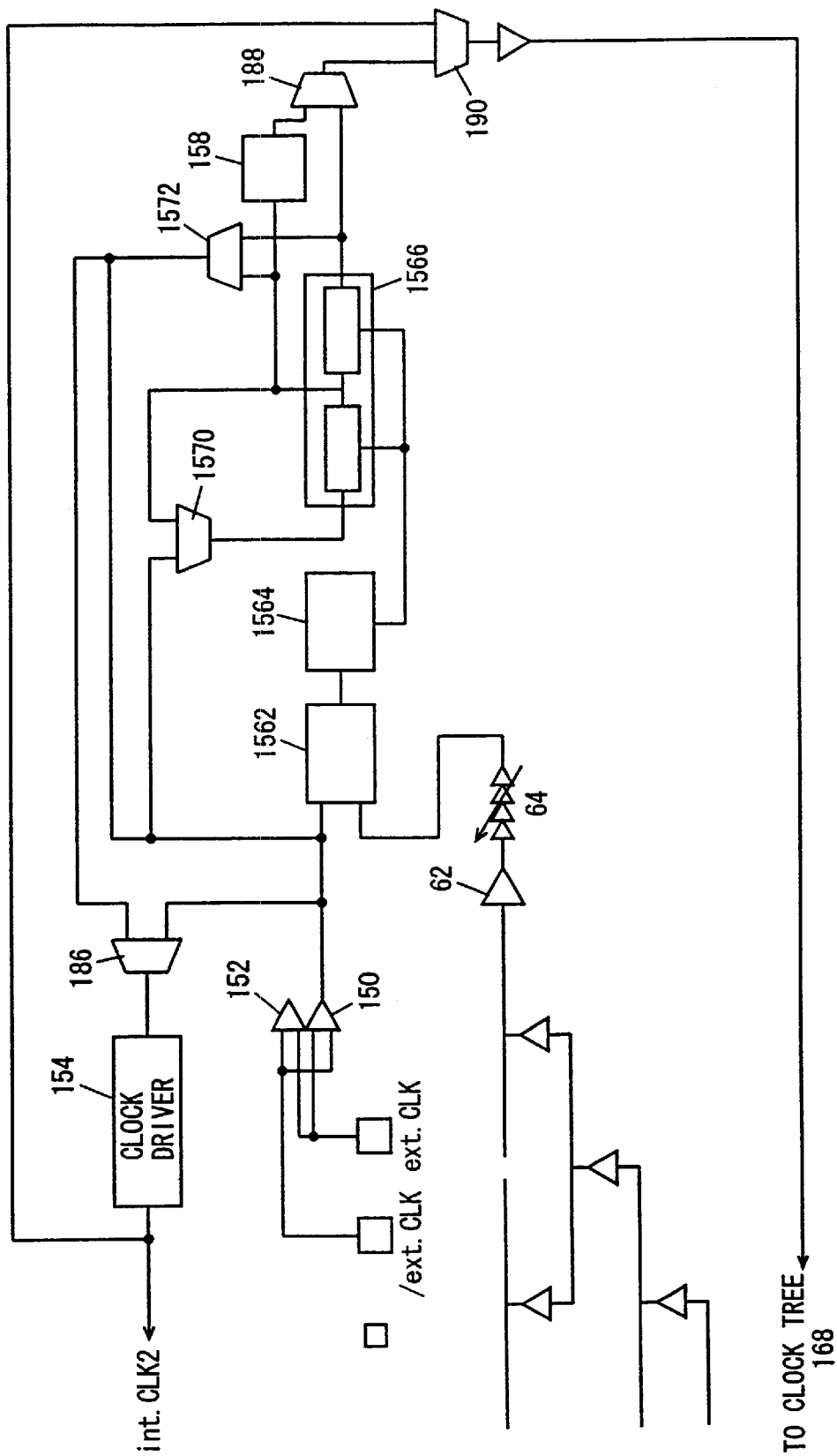
FIG. 19 is a schematic block diagram showing a structure of a synchronous circuit 156 in an internal control clock producing circuit 18.

FIG. 19 is a schematic block diagram showing a structure of a synchronous circuit 156 in internal control clock producing circuit 18 shown in FIG. 18.

Synchronous circuit 156 includes a phase comparator 1562 which receives the output of differential amplifier 150 and the output of delay adjust circuit 64, and compares the phases of them with each other, and a delay control circuit 1564 which controls the delay amount of a variable delay circuit 1566 in accordance with the output of phase comparator 1562.

Variable delay circuit 1566 includes a plurality of delay circuits, which are connected together in series and each have a delay time controlled by the delay control signal sent from delay control circuit 1564.

Synchronous circuit 156 also includes multiplexers 1570 and 1572. Multiplexer 1570 applies the output of differential amplifier 150 to variable delay circuit 1566 when synchronous circuit 156 operates as a DLL circuit, and also applies to the input of variable delay circuit 1566 the output signal obtained from a middle point of the series of multiple delay circuits included in variable delay circuit 1566 when synchronous circuit 156 operates as a PLL circuit. Multiplexer 1572 applies the output of variable delay circuit 1566 to a switching circuit 186 when synchronous circuit 156 operates as the DLL circuit, and applies to switching circuit 186 the output of the delay circuit in the center position among the plurality of delay circuits included in variable delay circuit 1566 when synchronous circuit 156 operates as the PLL circuit.

A divider circuit 158 receives the output of the delay circuit in the central position among the plurality of delay circuits included in variable delay circuit 1566, and issues a signal prepared by dividing the frequency of the received signal with a predetermined dividing ratio.

Switching circuit 188 receives the output of divider 158 and the output of variable delay circuit 1566, and selectively issues them.

Switching circuit 190 receives the output of clock driver 154 and the output of switching circuit 188, and selectively issues them as internal clock signal int.CLK2.

Switching circuit 186 receives the output of differential amplifier 150 and the output of multiplexer 1572, and selectively transmits them to clock driver 154.

In the structure shown in FIG. 19, synchronous circuit 156 supplies internal clock signal int.CLK2 for the operation of taking in the address signal and external control signal.

In the test operation mode, the internal synchronous circuit changes from the DLL operation mode to the PLL operation mode. Therefore, this synchronous circuit will be referred to as a "DPLL circuit" hereinafter.

An integer, by which the frequency of the externally applied clock is multiplied in the test operation mode, is equal to 4 in the following description, although not restricted thereto.

In the following description, the external clock signals are complementary clock signals ext.CLK and /ext.CLK.

It is also assumed that the operation of taking in the address signal and the external control signal is performed at the rising edge of internal clock signal int.CLK2.

However, such a structure may be employed that the output signal of synchronous circuit 156, i.e., signal int.CLK2 is used for control of input/output of data when it is in the mode operating as the DLL circuit. Also, the frequency of clock externally applied in the test operation mode may be multiplied by 8, 16 or more.

The operation will be briefly described below.

The output of variable delay circuit 1566 is distributed to the internal circuits by clock driver 154. External clock signal ext.CLK passed through the differential amplifier circuit (input buffer) is selected by switching circuit 186, and is distributed to the internal circuitry as a reference signal of the control signals after its drive power is increased by clock driver 154.

The output of differential amplifier 150 is selected by multiplexer 1570, and is input as a trigger signal of variable delay circuit 1566.

In the normal operation, the output of variable delay circuit 1566 is applied by priority to clock tree 168 by switching circuits 188 and 190.

The clock signal, of which drive power is increased by driver circuit 191 after passing through switching circuit 190, is distributed to respective I/O terminals DQ0–DQ31 through clock tree 168. The phases of internal clock signals int.CLK2 distributed by clock tree 168 are controlled to be substantially equal on the respective data I/O terminals.

The clock signal passed through clock tree 168 is supplied to a phase comparator 1562 through a replica buffer 362 of the input buffer of the clock signal. Phase comparator 1562 makes a comparison between phases of internal clock signal int.CLK2 sent from this replica buffer and the external clock signal sent from differential amplifier 150.

The operation in the test operation mode will now be described below.

In this case, variable delay circuit 1566 receives on its input an output, which is selected by multiplexer 1570, of the delay circuit having half the total delay amount of variable delay circuit 1566, instead of the external clock signal. Therefore, variable delay circuit 1566 forms a closed loop.

Multiplexer 1570 includes a circuit corresponding to one inverter. Owing to the presence of this inverter, multiplexer 1570 has such a structure that the loop formed of the variable delay circuit 1566 and this inverter circuit includes odd delay stages. Accordingly, this loop forms a ring oscillator, and starts the free-running oscillation.

In the above structure, the output is taken out from a portion providing half the total delay amount of variable delay circuit 1566. The purpose of this is to equalize the delay amount for one period of the ring oscillator to the delay amount of the variable delay circuit. The output of ring oscillator is sent through divider 158 dividing its frequency into a quarter, and thereafter is selected by switching circuits 188 and 190. Then, it is distributed through clock tree 168 to the address signal input terminal group and the external control signal input terminal group. The phase comparator 1562 and delay control circuit 1564 control the delay amount of variable delay circuit 1566 so that the internal clock signal int.CLK2 supplied to the address signal input terminal group or external control signal terminal group may have the phase of frequency matching with that of the external clock signal.

When the phases match each other, therefore, the output of the ring oscillator has a frequency four times larger than that of external clock signal ext.CLK.

Internal clock signal int.CLK2 of the quadruple frequency is selected by multiplexer 1572 and switching circuit 186, and is distributed to the internal circuitry after its drive power is increased by clock driver 154.

Owing to the above structure, the internal circuits automatically perform the operation corresponding to four bursts within a time period corresponding to one clock of external clock signal ext.CLK even while the read operation is being performed.

In the above operation mode, the internal circuits themselves can perform fast operations even when the frequency of external clock signal ext.CLK is not high.

[Structure for Switching Operation Clock of DDR-SDRAM]

Figure 20:
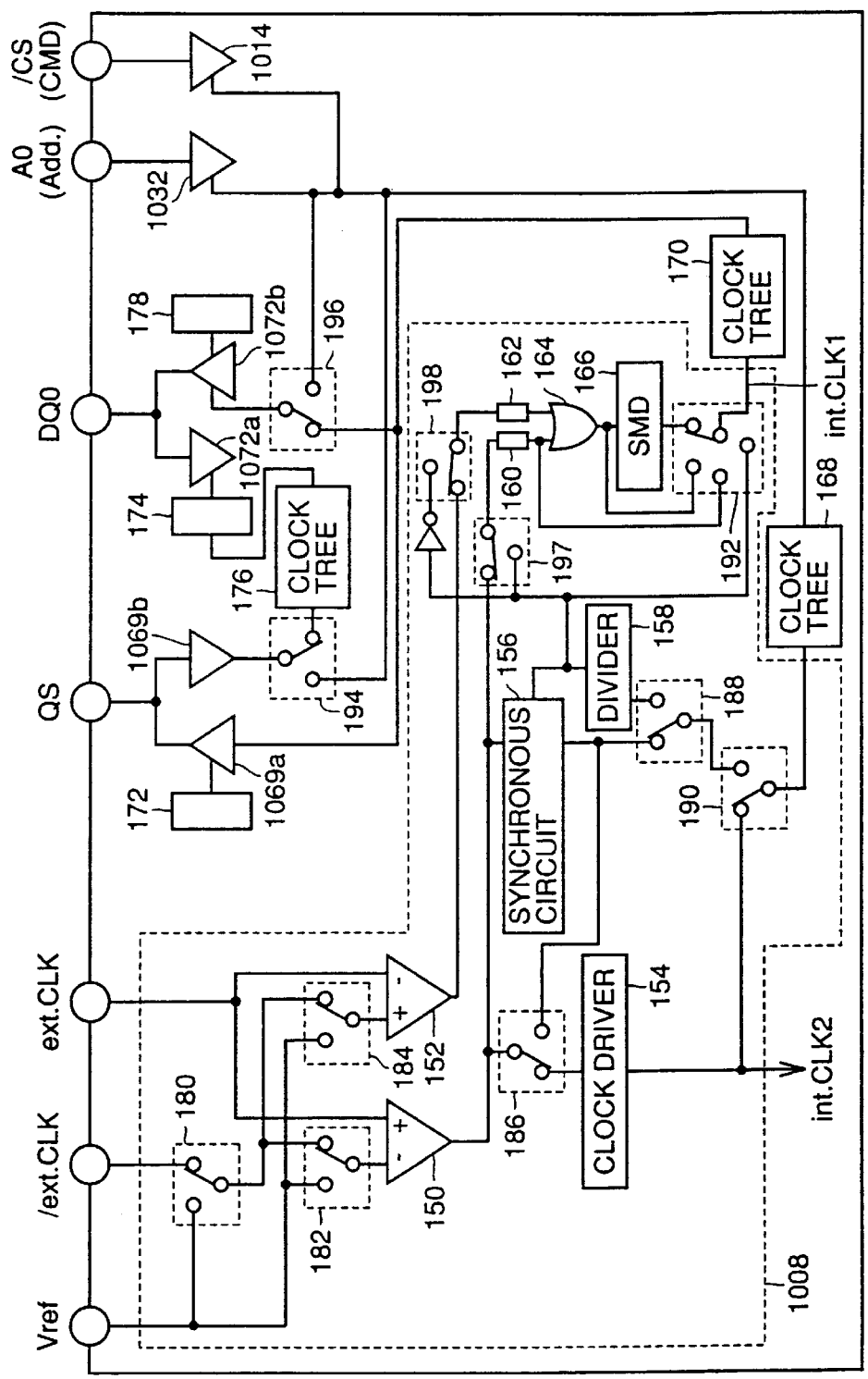
FIG. 20 is a schematic block diagram showing more specifically the structure of the internal clock producing circuit 18.

FIG. 20 is a schematic block diagram showing more specifically the structure of internal clock producing circuit 18 shown in FIG. 1A.

Internal clock producing circuit 18 switches the frequencies of internal clock signals int.CLK1 and int.CLK2 produced there from as well as the synchronous operations thereof with respect to external clock signal ext.CLK depending on operation mode data applied to the mode register 1046, i.e., depending on the operations in the DDR-SDRAM operation mode, SDR-SDRAM operation mode and test operation mode.

In the following description, the structure and operation will be described below.

Internal control clock producing circuit 18 includes switching circuit 180 which receives reference potential Vref and inverted external clock signal /ext.CLK, and is controlled depending on the operation mode data, a switching circuit 182 which receives reference potential Vref and the output of switching circuit 180, and is controlled in accordance with the operation mode data, a switching circuit 184 which receives reference potential Vref and the output of switching circuit 180, and is controlled in accordance with the operation mode data, differential amplifier 150 which receives external clock signal ext.CLK on its positive input node and also receives the output of switching circuit 182 on its negative input node, differential amplifier 152 which receives the output of switching circuit 184 on its positive input node and also receives external clock signal ext.CLK on its negative input node, synchronous circuit 156 which receives the output of differential amplifier 150, and produces the synchronous signal by switching the mode between the DLL and PLL operation modes in accordance with the data held by mode register 1046, switching circuit 186 which receives the outputs differential amplifier circuit 150 and synchronous circuit 156, and is controlled by the operation mode data, and clock driver 154 which receives and buffers the output of switching circuit 186, and issues internal clock signal int.CLK2.

Internal clock signal int.CLK2 issued from clock driver 154 is an internal clock signal for the internal circuits of SDRAM 1000, and operates to control, e.g., the operation of selecting rows and columns in the memory array blocks (banks) and the operation of reading data from the memory array blocks (banks) to I/O ports 1106–1126.

Internal control clock producing circuit 18 further includes divider circuit 158 which receives the output of synchronous circuit 156 and divide the same n-fold, switching circuit 188 which receives the outputs of synchronous circuit 156 and divider circuit 158, and is controlled in accordance with the operation mode data, and switching circuit 190 which receives the outputs of switching circuit 188 and clock driver 154, and is controlled in accordance with the operation mode data.

Internal control clock producing circuit 18 further includes a switching circuit 197 which receives the output of differential amplifier 150 and the signal applied to divider circuit 158, and is controlled in accordance with the operation mode data, a one-shot pulse producing circuit 160 which issues a one-shot pulse signal in response to the edge of activation of the output sent from switching circuit 197, a switching circuit 198 which receives the output of differential amplifier 152 and an inverted signal of the signal applied to divider circuit 158, and is controlled in accordance with the operation mode data, a one-shot pulse producing circuit 162 which receives the output of switching circuit 198, and produces a one-shot pulse in response to the edge of activation of the received output, an OR circuit 164 which receives the outputs of one-shot pulse producing circuits 160 and 162, synchronous mirror delay circuit 166 which receives the output of OR circuit 164, and produces a signal synchronized with the received signal, and a switching circuit 192 which receives the output of OR gate 164, the output of one-shot pulse producing circuit 160 and the signal applied to divider circuit 158, and is controlled in accordance with the operation mode data.

FIG. 20 shows, as typical example, the address signal input terminal receiving address signal A0 among address signal input terminals 12, the external control signal input terminal receiving chip select signal /CS among control signal input terminals 10, and the data I/O terminal transmitting data DQ0 in data I/O terminals 1070.

The output of switching circuit 190 is applied to address input buffer 1032 and external control signal buffer 1014 through clock tree 168 provided for supplying the clock signals, which have phases matching each other, to the address signal input terminal group and the external control signal input terminal group.

The output of switching circuit 192 is supplied to switching circuits 194 and 196 through clock tree 170 provided for supplying the internal clock signals, which have phases matching each other, to the data I/O terminals included in the data I/O terminal group, respectively.

The output of clock tree 170 is applied to output buffer 1069a, which is controlled by output control circuit 172 and applies clock signal QS to the signal QS I/O terminal. The signal sent from the clock signal QS input terminal is applied to switching circuit 194 through input buffer 1069b.

The output of switching circuit 194 is applied to a data take-in control circuit 174 through clock tree 176 provided for matching the phases of the clock signals, which are issued from switching circuit 194, with each other and supplying them to the respective data I/O terminals included in data I/O terminal group 1070. An input buffer 1072a receives the write data applied to data I/O terminal group 1070 under the control of data take-in circuit 174.

In accordance with the output of switching circuit 196, which receives the outputs of clock trees 170 and 168 and is controlled by the operation mode data, a data output buffer 1072b for the data I/O terminals outputs the read data. The operation of output buffer 1072b is controlled by a data output control circuit 178.

In the above structure, synchronous mirror delay circuit 166 is specifically disclosed in IEEE Journal OF SOLID-STATE CIRCUITS, Vol. 31, No. 11, November 1996, pp. 1656–1665 (T. Saeki, et al.).

[State of Internal Control Clock Control Circuit in DDR-SDRAM Operation Mode]

Referring to FIG. 20, the operation of switching circuits 180–198 in the DDR-SDRAM operation mode will now be described below more in detail.

FIG. 20 shows a state of internal control clock producing circuit 18 in the DDR-SDRAM operation mode and, more specifically, in the case where the synchronous mirror delay circuit (SMD circuit) is used, the data output is performed in synchronization with the rising and falling edges of external clock signal ext.CLK, synchronous circuit 156 is unused, complementary clock signals are used as the input signals, and the bidirectional mode is set as the mode of the data I/O operation.

In this state, switching circuit 180 is set to the side for receiving inverted clock signal /ext.CLK and issuing the same to switching circuits 182 and 184. Switching circuit 182 is set to the side for receiving the output of switch circuit 180 and applying the same to the negative input node of differential amplifier 150. Switching circuit 184 is set to the side for receiving the output of switching circuit 180 and applying the same to the positive input node of differential amplifier 152.

Switching circuit 186 is set to the side for receiving the output of differential amplifier 150 and applying the same to clock driver 154.

Switching circuit 188 is set to the side for receiving the output of synchronous circuit 156 and applying the same to switching circuit 190. Switching circuit 190 is set to the side for receiving the output of clock driver 154 and applying the same to clock tree 168.

Switching circuit 197 is set to the side for receiving the output of differential amplifier circuit 150 and applying the same to one-shot pulse producing circuit 160. Switching circuit 198 is set to the side for receiving the output of differential amplifier circuit 152 and applying the same to one-shot pulse producing circuit 162.

Switching circuit 192 is set to the side for receiving the output of synchronous mirror delay circuit 166 and applying the same to clock tree 170.

Switching circuit 194 is set to the side for receiving the output of QS signal input buffer 1069b and applying the same to clock tree 176. Switching circuit 196 is set to the side for receiving the output of clock tree 170 and applying the same to data output buffer 1072b.

According to the setting of switching circuits 182–196 described above, the DDR-SDRAM operation mode is set as follows.

In this operation mode, the synchronous clock signal for the data output is formed of the signal issued from the synchronous mirror delay circuit. By using the clock signal issued from synchronous mirror delay circuit 166, appropriate data I/O operation can be performed in such cases that SDRAM 1000 is operating with a high frequency and a skew of the clock signal may cause a problem in the control of output of the clock from the input buffer to data I/O terminal 1070, and that the controller side is requested to take in the data in accordance with the same timing as the external clock.

However, the output signal of synchronous circuit 156 operating as a DLL circuit is not used for input data control.

In this case, the applied external clock signals are complementary signals ext.CLK and /ext.CLK.

Further, the structure supports the bidirectional mode, in which the QS signal output terminal issues signal QS in the data output operation, and take-in of the data is performed in accordance with signal DQS applied from the controller side in the data read operation.

Internal clock signal int.CLK2 controlling the operation of internal circuits is produced by clock driver 154 in accordance with the output sent from differential amplifier 150. Internal clock signal int.CLK2 issued from clock driver 154 is transmitted through clock tree 168 to address signal input terminal group 12 and external control signal input terminal group 10, and is used for control of the input timing of these signals.

Further, one-shot pulse producing circuits 160 and 162 issue the oneshot pulses in accordance with the edges of activation of the output signals sent from differential amplifiers 150 and 152, and OR circuit 164 issues the signal of double the frequency of external clock signal ext.CLK. In accordance with the output signal of OR circuit 164, synchronous mirror delay circuit 166 produces internal clock signal int.CLK having double the frequency of external clock signal ext.CLK.

Internal clock signal int.CLK1 is applied to data output buffer 1072b and QS signal output buffer 1069a through clock tree 170.

In the following description, it is assumed that first internal clock signal int.CLK has double the frequency of external clock signal ext.CLK. However, the invention is not restricted to this. Generally, first internal clock signal int.CLK1 may have a frequency which is N times larger than that of external clock signal ext.CLK.

In the normal operation mode, it is not necessary to use a DLL circuit for input control when the chip operates with a relatively low frequency and a sufficient operation margin is present. When the chip operates with a high frequency and a skew of the clock may cause a problem when taking in the address, command, data and others from the input buffers, the DLL circuit is used, and the outputs of the DLL circuit is used as the clock signal for taking in such control signals and address signals.

A structure wherein the timing of data output is determined based on the external clock is employed for such a mode that the chip operates with a relatively low frequency, a sufficient margin is present in the operation and particularly between the output of data from the chip and subsequent take-in of data into the memory controller, and it is not necessary to use the SMD circuit. In contrast to this, the chip side must start the output operation several nanoseconds before the external clock in such cases that the chip operates with a high frequency, and a skew of the clock signal may cause a problem in the output signal sent from the input buffer of the clock to data I/O terminal DQ, and that the controller side is requested to take in the data in accordance with the same timing as the external clock. Accordingly, SMD circuit 166 is used, and the output of SMD circuit 166 is used as the reference of timing for controlling the data output from the input buffer.

[State of Internal Control Clock Producing Circuit in Test Operation Mode]

In the test operation mode, the clock signal having a higher frequency than the external clock and is issued by the DLL circuit is used as the master clock of the chip operation.

Figure 21:
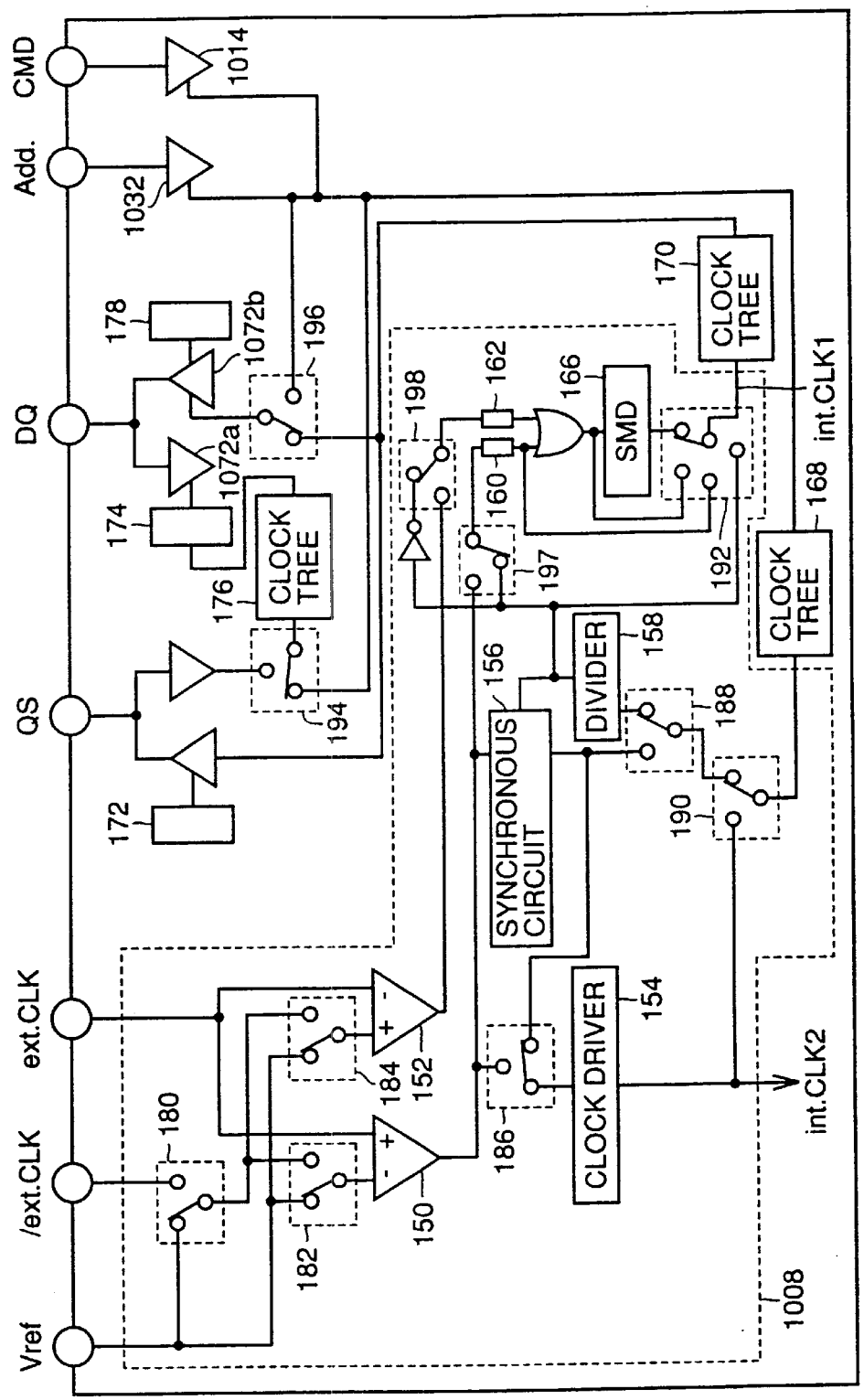
FIG. 21 conceptually shows operations of switching circuits 180–198 of a DDR-SDRAM in the test operation mode.

FIG. 21 conceptually shows the operation of switching circuits 180–198 of the DDR-SDRAM in the test operation mode.

FIG. 21 shows the state of internal control clock producing circuit 18 in the DDR-SDRAM operation mode and, in particular, in such a case that the synchronous mirror delay circuit (SMD circuit) is used, the data output is performed in synchronization with the rising and falling edges of internal clock signal int.CLK, synchronous circuit 156 is used as the PLL circuit, the input clock signal is formed of a single-phase clock signal, and the unidirectional mode is set as the mode of data I/O operation.

Thus, switching circuit 180 is set to the side for receiving reference potential Vref and issuing the same to switching circuits 182 and 184. Switching circuit 182 is set to the side for receiving reference potential Vref and applying the same to the negative input node of differential amplifier 150. Switching circuit 184 is set to the side for receiving the reference potential Vref and applying the same to the positive input node of differential amplifier 152.

Accordingly, differential amplifier 150 activates the output signal at the rising edge of external clock signal ext.CLK, and differential amplifier 152 activates the output signal at the falling edge of external clock signal ext.CLK.

Switching circuit 186 is set to the side for receiving the output of synchronous circuit 156 and applying the same to clock driver 154.

Accordingly, the internal circuits operate in synchronization with internal clock signal int.CLK2 of a frequency which is n times larger than that of external clock signal ext.CLK produced by synchronous circuit 156.

Switching circuit 188 is set to the side for receiving the output of divider circuit 158 and applying the same to switching circuit 190. Switching circuit 190 is set to the side for receiving the output of switching circuit 188 and applying the same to clock tree 168.

Thus, the external control signals and address signals are taken into the device in synchronization with internal clock signal int.CLK1 which has the same frequency as external clock signal ext.CLK and is synchronized with external clock signal ext.CLK.

Switching circuit 197 is set to the side for receiving the output of divider circuit 158 and applying the same to one-shot pulse producing circuit 160. Switching circuit 198 is set to the side for receiving the inverted signal of the signal applied to divider circuit 158 and applying the same to one-shot pulse producing circuit 162.

Switching circuit 192 is set to the side for receiving the output of synchronous mirror delay circuit 166 and applying the same to clock tree 170.

Switching circuit 194 is set to the side for receiving the output of clock tree 170 and applying the same to clock tree 176. Switching circuit 196 is set to the side for receiving the output of clock tree 170 and applying the same to data output buffer 1072b.

Accordingly, the output of data is performed in synchronization with the rising and falling edges of internal clock signal int.CLK2 of a frequency n times larger than that of external clock signal ext.CLK.

Figure 22:
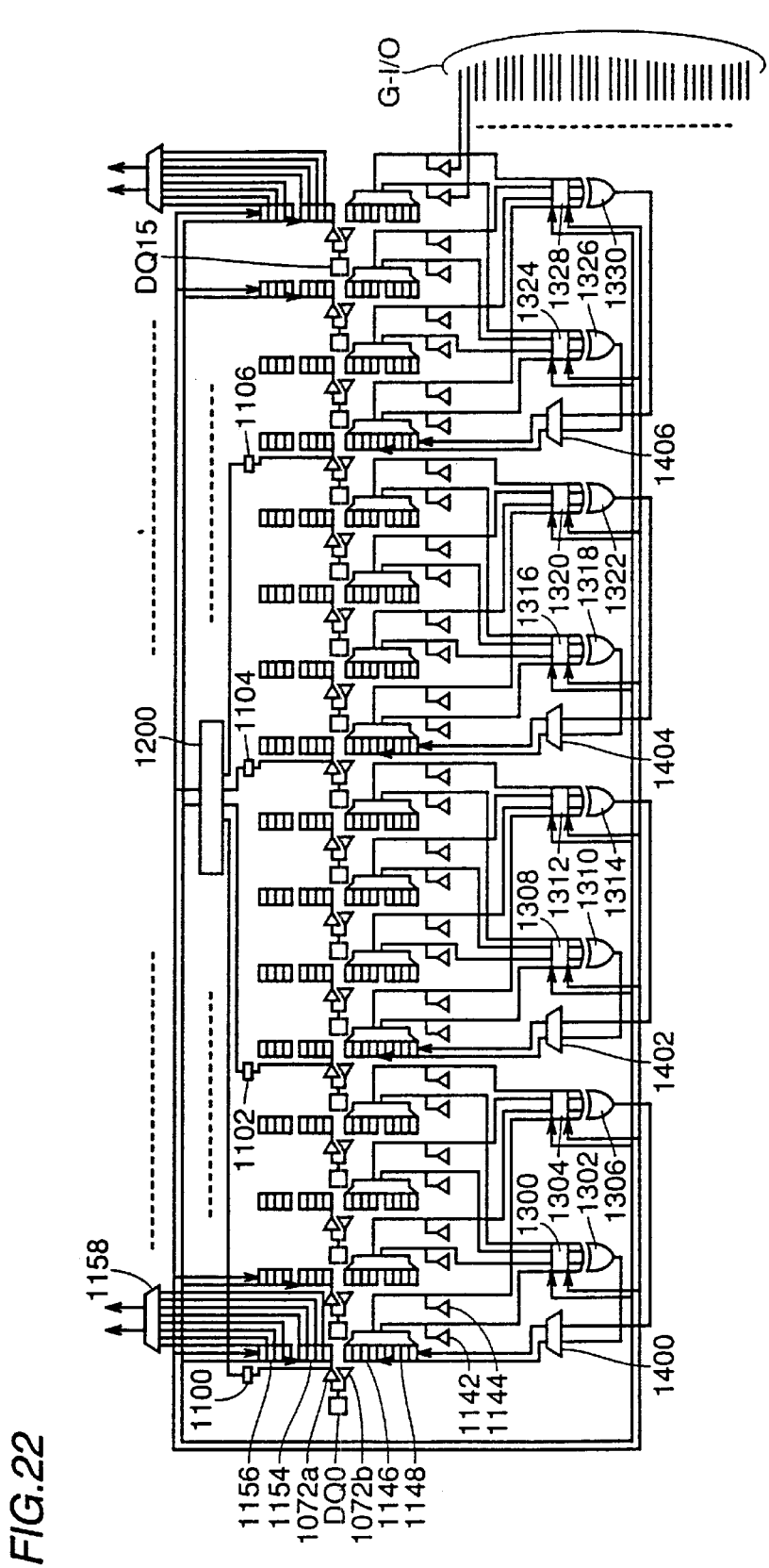
FIG. 22 is a schematic block diagram showing structures of data I/O circuits for data I/O terminals DQ0–DQ15.

FIG. 22 is a schematic block diagram showing a structure of the data I/O circuit for data I/O terminals DQ0–DQ15 in the structure shown in FIGS. 16 and 17.

The structure corresponding to data I/O terminals DQ0–DQ15 is formed by alternately arranging the structures, e.g., for data I/O terminal DQ0 which are supplied with the data in both the test operation mode and the normal operation mode, and the structures, e.g., for data I/O terminal DQ1 which are not supplied with the data in the test operation mode and are supplied with the data in the normal operation mode. Accordingly, the structure corresponding to data I/O terminal DQ0 will be first described below.

For data I/O terminal DQ0, data input buffer 1072a is provided. The output of data input buffer 1072a is held by a latch circuit 1100. In the normal operation mode, the data sent from input buffer 1072a is taken into a latch circuit 1156, which successively holds the received data in response to the rising edge of signal FC controlling the data input, and a latch circuit 1154, which successively holds the received data in response to the falling edge of signal FC, i.e., the rising edge of signal /FC having a phase opposite to that of signal FC. There is further provided a multiplexer circuit 1158 for switching the address region, to which the data held in latch circuits 1156 and 1154 is transmitted, depending on whether the externally applied address signal is an even address or an odd address.

Signal FC is a clock signal for controlling the timing of taking in the externally applied write data, and may be formed of externally applied signal DQS or the clock signal produced by internal control clock producing circuit 18.

In the test operation mode, a decode circuit 1200 produces the write data based on data sent from latch circuits 1100, 1102, 1104 and 1106, which are provided correspondingly data I/O terminals DQ0, DQ4, DQ8 and DQ12, respectively, and applies the same to latch circuits 1156 and 1154.

In the read operation, the read data transmitted from global I/O line pair G-I/O is sent through buffer circuits (data receiver amplifiers) 1142 and 1143, and is stored in latch circuits 1146 and 1148. In the normal operation mode, the data stored in latch circuits 1146 and 1148 is applied in serial to output buffer 1072b, and is issued from data I/O terminal DQ0.

For the test operation mode, the structure is provided with a scramble circuit 1300, which receives the read data corresponding to, e.g., data I/O terminals DQ0–DQ3 and, in particular, 4 bits of the data read from the even address region as well as the decode signal sent from decoder 1200, and performs the data scrambling, an exclusive-OR operation gate 1302 performing an exclusive-OR operation on the data issued from scramble circuit 1300, a scramble circuit 1304 scrambling the data in accordance with the expected value data sent from decoder 1200 and the data read form the odd address regions among the read data corresponding to data I/O terminals DQ0–DQ3, an exclusive-OR gate 1306 which issues data of a result of comparison in accordance with the data issued from scramble circuit 1304, and a multiplexer circuit 1400 which receives the outputs of exclusive-OR gate circuits 1302 and 1306, and issues them selectively to the latch circuit 1148 for the odd address region and latch circuit 1146 for the even address.

The structure corresponding to data I/O terminal DQ1 is basically similar to that corresponding to data I/O terminal DQ0 except for that latch circuit 1100 is not present, and the circuits required for data output in the test operation mode, i.e., scramble circuits 1300 and 1304, comparator circuits 1302 and 1306, and multiplexer circuit 1400 are not provided.

The structures corresponding to the other I/O terminals DQ4–DQ7, DQ8–DQ11 and DQ12–DQ15 are basically similar to that corresponding to data I/O terminal DQ0–DQ3.

Figure 23:
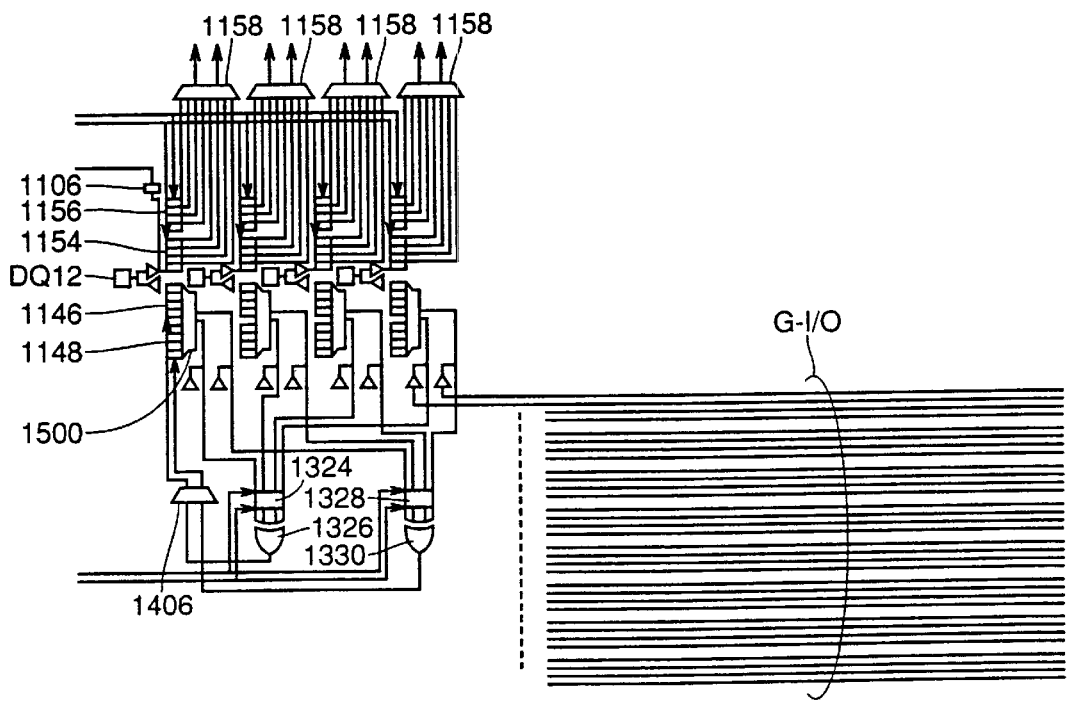
FIG. 23 is a schematic block diagram showing, on an enlarged scale, the structures corresponding to data I/O terminals DQ12–DQ15.

FIG. 23 is a schematic block diagram showing, on an enlarged scale, the structure corresponding to data I/O terminals DQ12–DQ15 in the structure shown in FIG. 22.

As already described, latch circuit 1106 is provided for data decoding required for generating the data pattern. The latch circuit 1154 is provided for latching continuous 4 bits of the data which is input at the rising edge of the clock in the normal operation, and latch circuit 1154 is provided for latching continuous 4 bits of the data which is input at the rising edge of the clock in the normal operation.

The latch circuit 1148 is provided for latching continuous 4 bits of data which is output at the even clock edges after the CAS latency in the normal operation. Latch circuit 1146 is provided for latching continuous 4 bits of data which is output at the odd clock edges after the CAS latency in the normal operation.

A multiplexer circuit 1158 is provided for distributing the data to be internally transmitted from input data latches 1156 and 1154 depending on whether the address is an even address or an odd address. A multiplexer 1500 provided for output latches 1146 and 1148 is operable to input the data to the latch before the output buffer based on whether the data sent from receivers 1142 and 1143 are data to be issued ahead or behind. A scramble circuit 1324 is provided for setting the scramble of data applied to the comparator in accordance with the input data in the test read cycle during the test read operation. A multiplexer circuit 1406 is provided for selectively writing the results of comparison into the latch before the output buffer based on whether the result data is to be output ahead or later.

[Specific Structure of Data I/O Portion]

Figure 24:
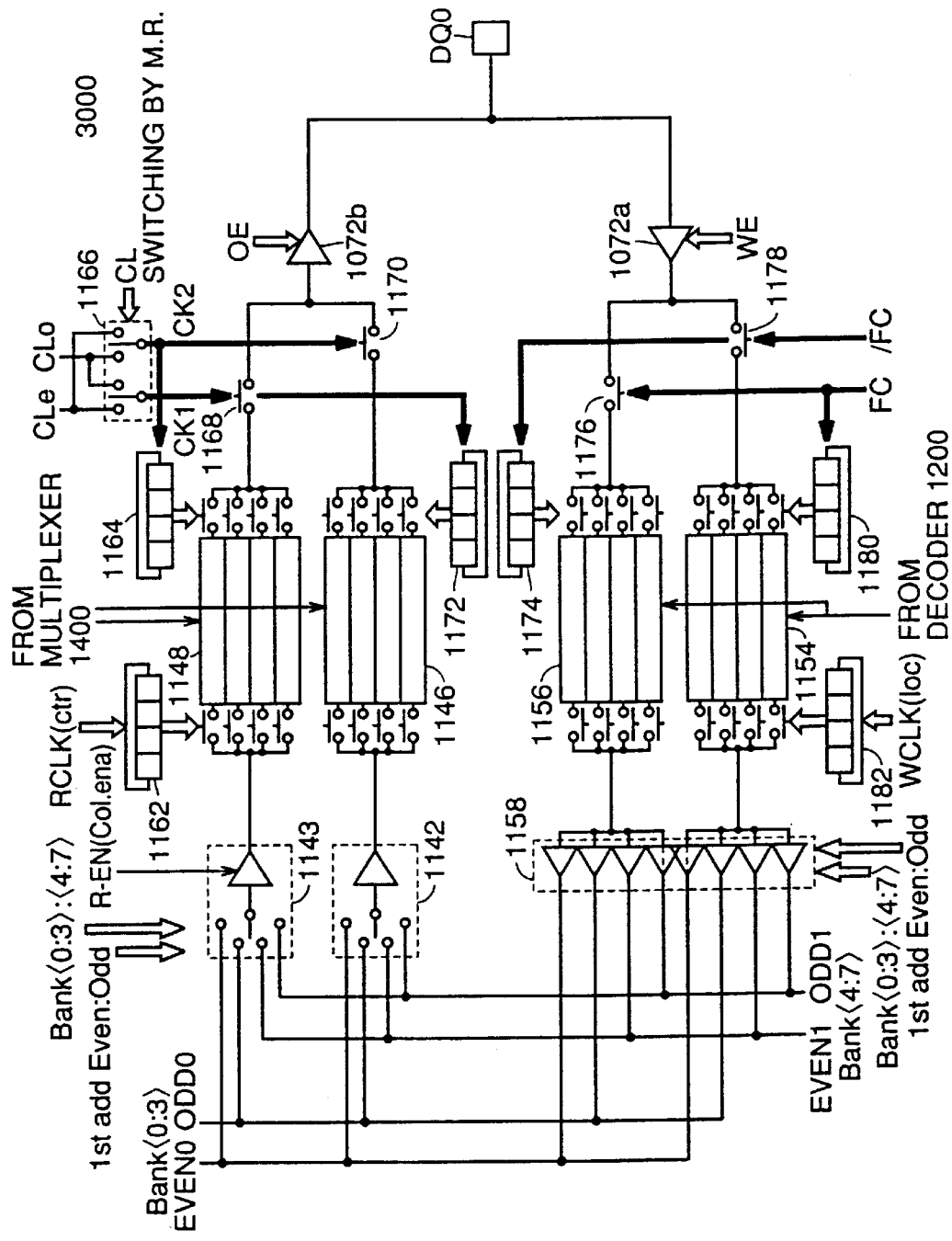
FIG. 24 is a circuit diagram showing a structure of an I/O circuit 300 corresponding to data I/O terminal DQ0.

FIG. 24 is a circuit diagram showing a structure of an I/O circuit 3000 corresponding to data I/O terminal DQ0.

Referring to FIG. 24, an address bus EVEN0 is connected to even address regions in banks 0–3, and an address bus ODD0 is connected to odd address regions in banks 0–3. An address bus EVEN1 is connected to odd address regions in banks 4–7, and an address bus ODD1 is connected to odd address regions in banks 4–7.

I/O circuit 3000 includes read data receiver circuits 1142 and 1143, each of which selects one of address buses EVEN0, ODD0, EVEN1 and ODD1 based on whether the selected bank is an even bank or an odd bank and whether the address corresponding to the data to be output first is an even address or an odd address, and issues the data transmitted from the selected address bus in accordance with a receiver activating signal R-EN, a shift register 1162 which performs the shift operation with a read clock RCLK(ctr), and issues a select signal, and latch circuits 1146 and 1148 taking in the data, which are sent from read data receivers 1142 and 1143, in accordance with the select signal issued from shift register 1162, respectively.

I/O circuit 3000 further includes a switch 1166 receiving a clock signal CLe2, which is prepared by extracting only activated portions in even ordinal positions from the clock signal sent from switching circuit 196, and a clock signal CLo, which is prepared by extracting only active portions in odd ordinal positions from the clock signal, and transmitting respective signals CLe and CLo, as data output clocks CK1 and CK2, into the I/O circuit in accordance with the CAS latency and the setting of the mode register, a shift register 1164 shifting the data in accordance with output clock CK2, and a shift register 1172 shifting the data in accordance with output clock CK1. Latches 1146 and 1148 issue the latched data in accordance with the outputs of shift registers 1172 and 1164, respectively.

I/O circuit 3000 further includes output buffer 1072b which is activated by enable signal OE to issue the data to terminal DQ0, a switch 1168 which applies the output of latch 1148 to output buffer 1072b in response to activation of output clock CK1, and a switch 1170 which applies the output of latch 1146 to output buffer 1072b in response to activation of output clock CK2.

I/O circuit 3000 further includes an input buffer 1072a which amplifies and inputs the data, which is externally applied to terminal DQ0, in accordance with enable signal WE, switches 1176 and 1178 which internally transmit the output of input buffer 152 in accordance with signals FC and /FC, respectively, a shift register 1174 which receives signal /FC as a shift clock and issues a select signal, a shift register 1180 which receives signal /FC as a shift clock and issues a select signal, latch 1156 which takes in the signal sent through switch 1176 in accordance with the select signal sent from shift register 1174, and latch 1154 which takes in the signal sent through switch 1178 in accordance with the select signal sent from shift register 1180.

I/O circuit 3000 further includes a shift register 1182 which receives a write clock WCLK(loc) as a shift clock and issues a select signal, and multiplexer circuit 1158 which receives the data sent from latches 1154 and 1156 in accordance with the select signal issued from shift register 1182. Multiplexer circuit 1158 applies, in a distributing manner, the data to data buses EVEN0, ODD0, EVEN1 and ODD1 in accordance with whether the received data is to be written into an even bank or an odd bank, and whether the address (first address) for writing the externally applied first address is an even address or an odd address, and drives the selected bus.

The operation in the normal operation mode will be briefly described below. Each of the data coming from the even and odd address regions in banks 0–3 and the data coming from the even and odd address regions in banks 4–7 is distinguished from the others by 4-point switch portions provided in the input portions of receivers 1142 and 1143, and is taken thereinto.

These receive a signal making a distinction between the upper and lower banks as well as a signal representing whether the first address for burst reading is an even address or an odd address. The path provided with receiver 1143, latch 1148 and switch 1168 transmits the data which is output first. The path provided with receiver 1142, latch 1146 and switch 1170 transmits the data which is output second.

The data passed through the switches in the input portions of receivers 1143 and 1142 are amplified by amplifiers, and are transferred to selector portions in the input portions of latches 1148 and 1146, respectively. Each selector selects one of four paths included in the corresponding latch. The selected paths are successively shifted for successively latching the supplied data in accordance with internal clock RCLK(ctr) for reading, which is applied to shift register 1162 sending the select signal to the latch.

The latched data is issued based on a clock different from the clock which was used for input to the latch. The selected paths on the output sides of the latches are successively shifted in accordance with the select signals which are issued from shift register 1164 and 1172 performing the shift operation in accordance with clocks CLe and CLo on the output side, respectively. Between the data to be issued, the data to be issued for even ordinal times is stored in latch 1148, and the data to be issued for odd ordinal times is stored in latch 1146. Accordingly, the latency from read clock RCLK(ctr), by which the read command is identified, to the external output of data determines which of clocks CLe and CLo is to be applied to switch 1168 as the control signal, and switch 1170 is supplied with the other clock as the control signal. If the latency is, e.g., 1.5, clock CLo is supplied to switch 1168 as the control signal, and clock CLe is supplied to switch 1170 as the control signal.

In the write operation, the data which is externally applied first is unconditionally transferred to latch 1156, and the next input data is unconditionally transferred to latch 1154. Thereafter, the data is supplied alternately to latches 1156 and 1154.

The latched data is transmitted to multiplexer circuit 1158 in accordance with internal clock signal WCLK(loc) for writing. Multiplexer circuit 1158 sends the data to the data bus in accordance with the bank address and the first address of the burst data.

For the write operation in the test operation mode, latch circuits 1154 and 1156 are directly supplied with the output signal in parallel from decoder circuit 1200. For the read operation in the test operation mode, the output of multiplexer circuit 1400 is successively applied to latch circuits 1146 and 1148.

In the test operation mode, read clock signal RCLK and write clock signal WCLK are produced based on internal clock signal int.CLK having a higher frequency than external clock signal ext.CLK, and have the same frequency as internal clock signal int.CLK.

[First Example of Structure of Decoder Circuit]

Figure 25:
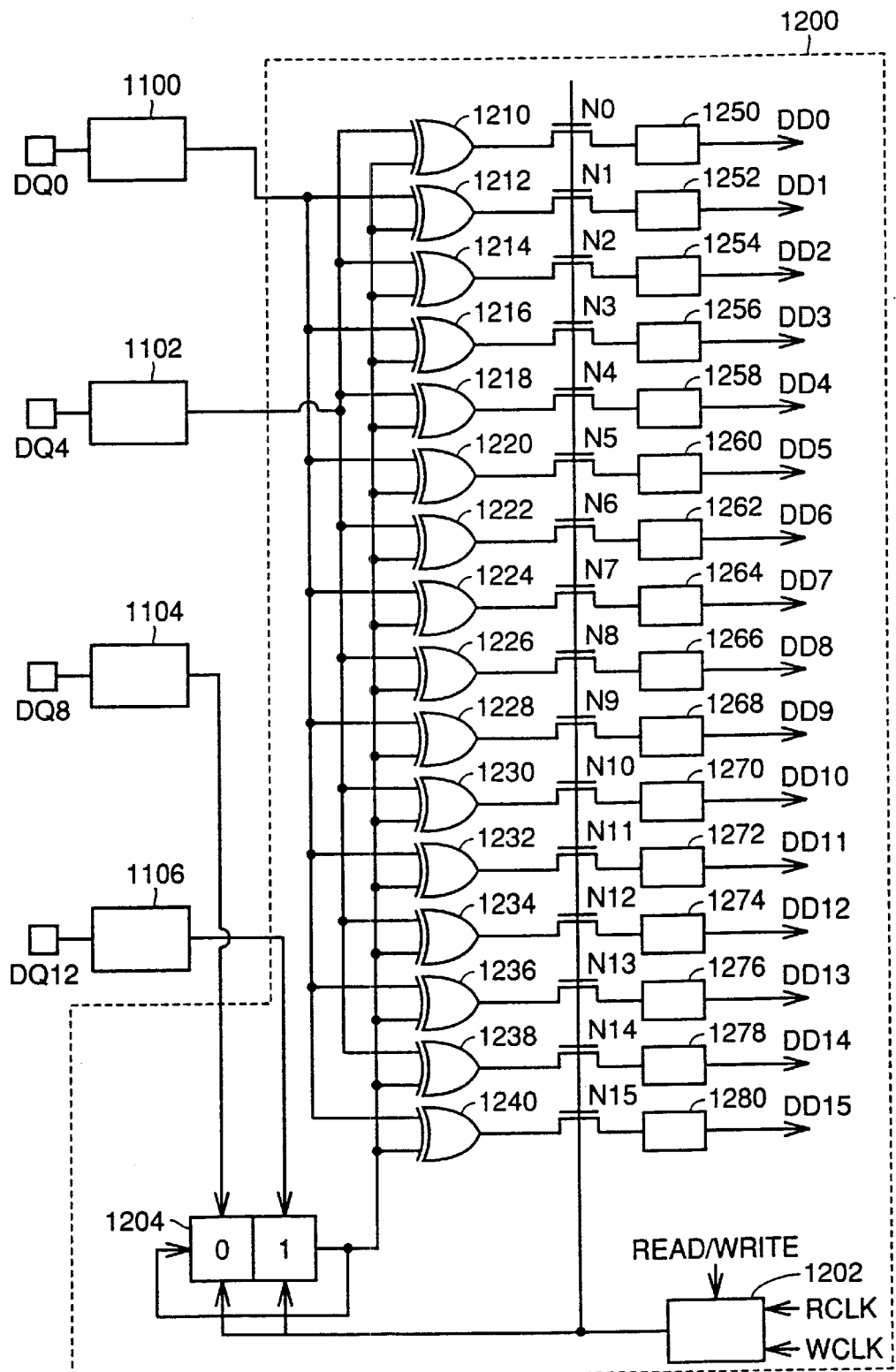
FIG. 25 is a schematic block diagram showing a structure of a decoder circuit 1200.

FIG. 25 is a schematic block diagram showing the structure of decoder circuit 1200 shown in FIG. 22.

Decoder circuit 1200 includes a multiplexer 1202 which receives read clock signal RCLK and write clock signal WCLK, and selectively outputs one of the received signals in accordance with whether the read operation mode is designated or the write operation mode is designated, a shift register 1204 which receives data applied to data I/O terminal DQ12 and held by latch circuit 1106 as well as data applied to data I/O terminal DQ8 and held by latch circuit 1104 in the test operation mode, and cyclically shifts the received data in accordance with the clock signal sent from multiplexer 1202, exclusive-OR gates 1212, 1216, 1220, 1224, 1228, 1232, 1236 and 1240, each of which receives on one of input nodes the output of latch circuit 1 100 latching the data applied to data I/O terminal DQ0, and exclusive-OR gates 1210, 1214, 1218, 1222, 1226, 1230, 1234 and 1238, each of which receives on one of input nodes the data held by latch circuit 1102.

Each of exclusive-OR gates 1210–1240 receives on the other input node the data sent from shift register 1204.

Decoder circuit 1200 -further includes N-channel MOS transistors N0–N15 which are provided corresponding to exclusive-OR gates 1210–1240, respectively, and are turned on/off in accordance with the clock signal issued from multiplexer 1202, and latch circuits 1250–1280 which are provided correspondingly to N-channel MOS transistors N0–N15, and hold the data issued through these transistors, respectively.

Latch circuits 1250–1280 issue decode data DD0–DD15 which are issued from the decoder circuit in the test operation mode.

Figure 26:
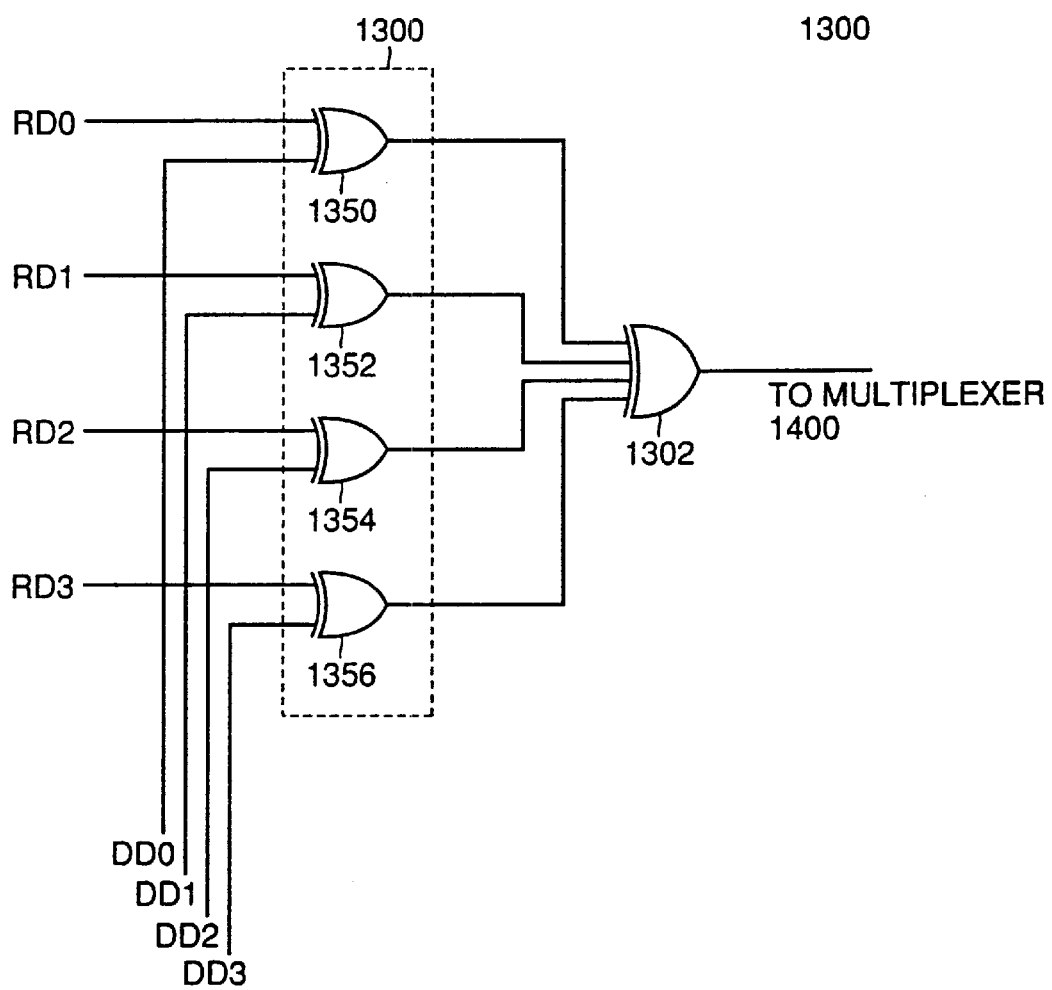
FIG. 26 is a schematic block diagram showing a structure of a scramble circuit 1300.

FIG. 26 is a schematic block diagram showing the structure of scramble circuit 1300 shown in FIG. 22.

Scramble circuit 1300 includes exclusive-OR gates 1350, 1352, 1354 and 1356 each receiving on one of input nodes the corresponding data among read data RD0–RD3 sent from the latch circuits, which are provided correspondingly to data I/O terminals DQ0–DQ3 and, particularly, hold the data issued at the even clock edges after the CAS latency. Each of exclusive-OR gates 1350–1356 receives on the other input gate the corresponding data among decode data DD0–DD3 sent from decoder circuit 1200.

The output signals of exclusive-OR gates 1350–1356 are applied to exclusive-OR gate 1302, of which operation result is applied to multiplexer circuit 1400.

Owing to the above structure, decode data DD0–DD15 having the data patterns already described with reference to FIG. 13 is produced based on the data applied to data I/O terminals DQ0–DQ12 in the test operation mode. When the read operation is performed in the test operation mode, data I/O terminal DQ0 issues data representing the result of comparison which is made between the read data corresponding to four data I/O terminals DD0–DD3 and the expected value.

As already described with reference to FIGS. 8 and 9, only eight among data I/O terminals of 32 pins are used in the test operation mode for externally outputting the test data which represents the result of comparison between the write data and the expected value.

In the foregoing description, scramble circuit 1300 performs the scrambling based on the data applied to 8 data I/O terminals DQ0–DQ28 at time t11 in FIG. 9. However, such a structure may be employed that data applied at time t1 in FIG. 8 is held in latch circuits or the like, whereby it becomes unnecessary to apply externally the data at time t11.

[Second Example of Structure of Decoder Circuit]

Figure 27:
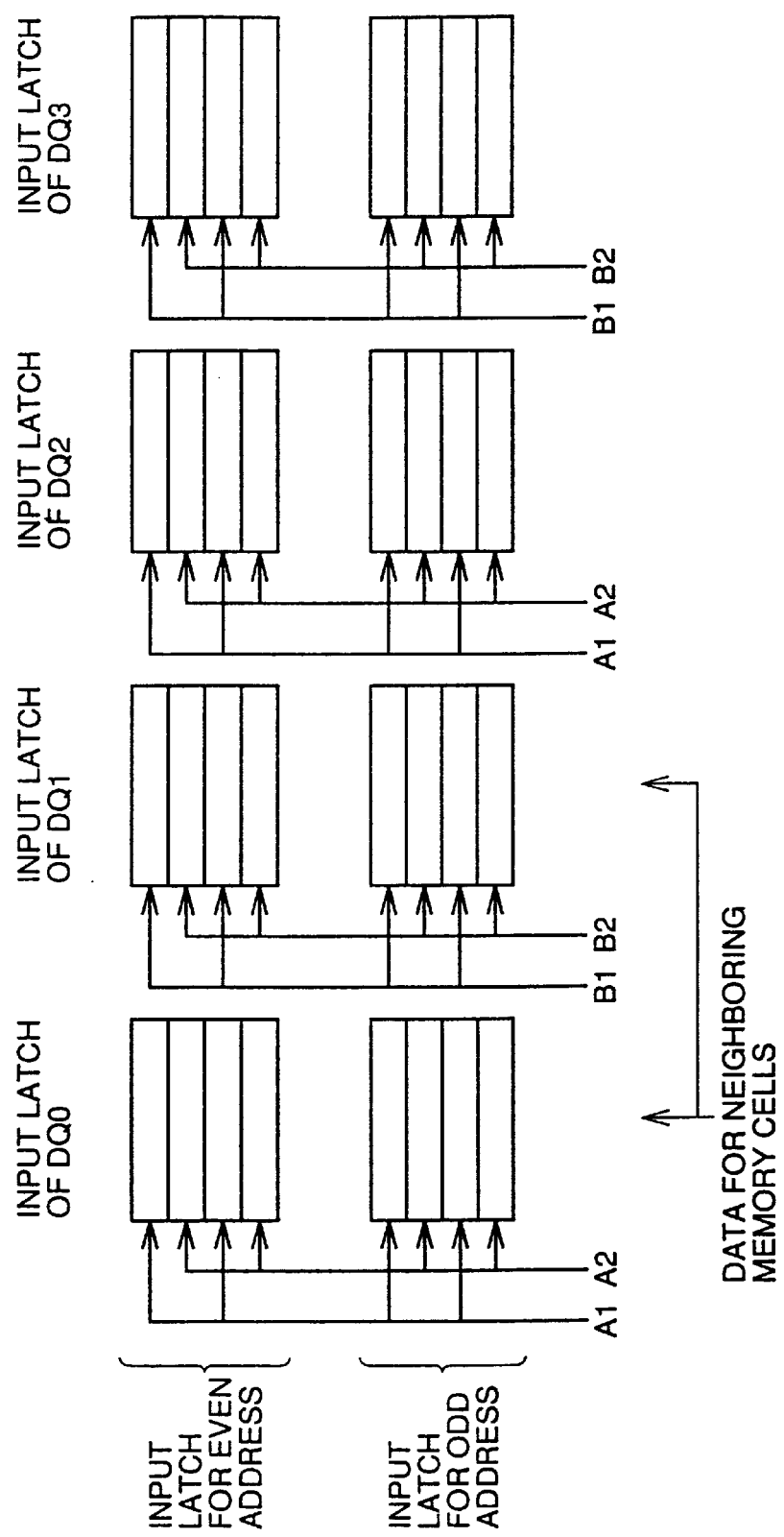
FIG. 27 conceptually shows a structure for writing another data in the test operation mode.

FIG. 27 conceptually shows another structure for data writing in the test operation mode.

One of latches 1154 and 1156 for data input shown in FIG. 24 is used as an input latch for even addresses, and the other is used as an input latch for odd addresses.

In this case, data A1 and data A2 are alternately applied to the input latch for the even addresses corresponding to data I/O terminal DQ0, and data A1 and data A2 are alternately applied to the input latch for the odd addresses.

Data B1 and data B2 are alternately applied to the input latch for the even addresses corresponding to data I/O terminal DQ1, and data B1 and data B2 are alternately applied to the input latch for the odd addresses.

In this case, data A1 and A2 held in the input latches corresponding to data I/O terminal DQ0 and data B1 and B2 held in the input latches corresponding to data I/O terminal DQ1 are written into neighboring memory cells, respectively.

The input latches corresponding to data I/O terminals DQ2 and DQ3 are supplied with the data similar to that applied to the input latches corresponding to data I/O terminals DQ0 and DQ1, respectively.

Similarly to the group of data I/O terminals DQ0–DQ3, data is applied to input latches corresponding to the data I/O terminals of each of the other groups, i.e., data I/O terminals DQ4–DQ7, DQ8–DQ11, DQ12–DQ15, DQ16–DQ19, DQ20–DQ23, DQ24–DQ27 and DQ28–DQ31.

Figure 28:
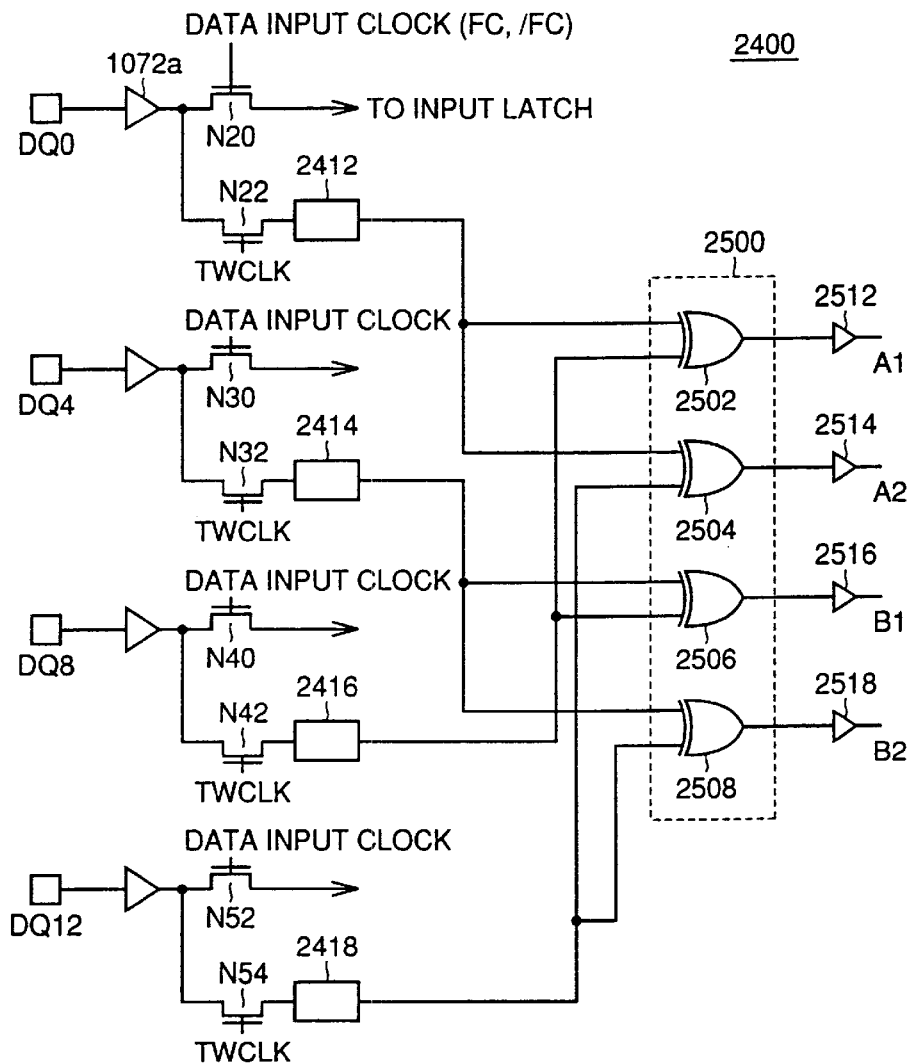
FIG. 28 is a schematic block diagram showing a structure of a decoder circuit 2400.

FIG. 28 is a schematic block diagram showing a structure of a decode circuit 2400, which is another example of decode circuit 1200 shown in FIG. 25.

In the normal operation mode, as already described with reference to FIG. 24, the data applied to data I/O terminal DQ0 is buffered by buffer circuit 1072a, and then is applied to input latches 1154 or 1156 through a transistor N20, which corresponds to switch 1176 or 1178 in FIG. 24 and is turned on/off in accordance with signal FC or /FC of the data input clock. Similar structures are provided for other data I/O terminals DQ1–DQ31.

In the test operation mode, however, the data applied to data I/O terminal DQ0 is applied to latch circuit 2412 through a transistor N22 which is turned on in accordance with an input clock TWCLK issued during the test operation. The output of latch circuit 2412 is applied to one of input nodes of each of exclusive-OR gates 2502 and 2504.

Further, in the test operation mode, the data applied to data I/O terminal DQ4 is applied to a latch circuit 2414 through a transistor N32 which is turned on/off in accordance with input clock TWCLK issued during the test operation. The output of latch circuit 2414 is applied to one of input nodes of each of exclusive-OR gates 2506 and 2508.

Likewise, the data applied to data I/O terminal DQ8 is applied to a latch circuit 2416 through a transistor N42 which is turned on/off in accordance with input clock TWCLK issued during the test operation. The output of latch circuit 2416 is applied to the other input node of each of exclusive-OR gates 2502 and 2506.

The data applied to data I/O terminal DQ12 is applied to a latch circuit 2418 through a transistor N54 which is turned on/off in accordance with input clock TWCLK issued during the test operation. The output of latch circuit 2418 is applied to the other input node of each of exclusive-OR gates 2504 and 2508.

The outputs of exclusive-OR gates 2502–2508 are applied as write data A1, A2, B1 and B2 to the input latches through buffer circuits 2512–2518 in the manner already described with reference to FIG. 27.

Figure 29:
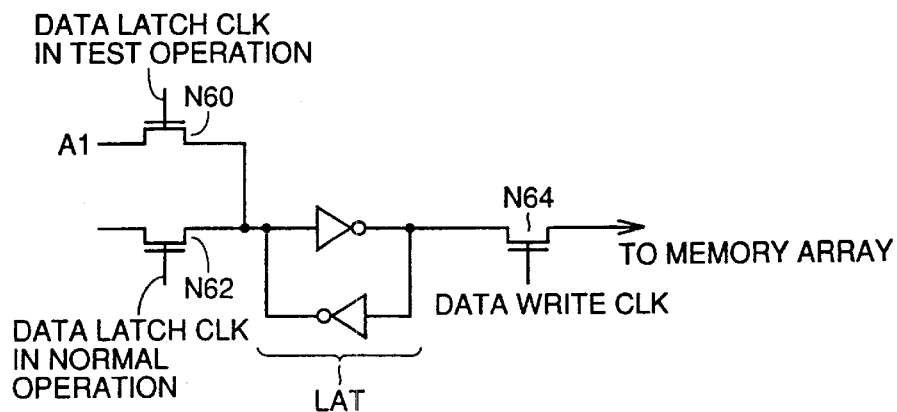
FIG. 29 is a schematic block diagram showing a structure of a data input latch for one bit.

FIG. 29 is a block diagram showing a structure of data input latch 1156 corresponding to one bit. It is assumed that data A1 is applied to the latch circuit for one bit in data input latch 1156 in the test operation mode.

In the normal operation, data is applied to a latch circuit LAT through a transistor N62 which is turned on/off in accordance with the data latch clock issued during the normal operation, and is transmitted toward the memory cell array through a transistor N64 which is turned on/off in accordance with the data write clock.

In the test operation mode, however, data is applied to latch circuit LAT through transistor N60 which is turned on/off in accordance with the data latch clock issued during the test operation, and is transmitted toward the memory cell array through transistor N64 which is turned on/off in accordance with the data write clock.

Other latch circuits each for one bit in data input latch 1154 or 1156 has a structure similar to that shown in FIG. 29 except for the data applied thereto. Further, the input latches for the other data I/O terminals have similar structures.

The structures described above can likewise perform the data writing in the test operation mode similarly to decode circuit 1200 already described with reference to FIG. 25.

[Modification of Embodiment 1]

Figure 30A:
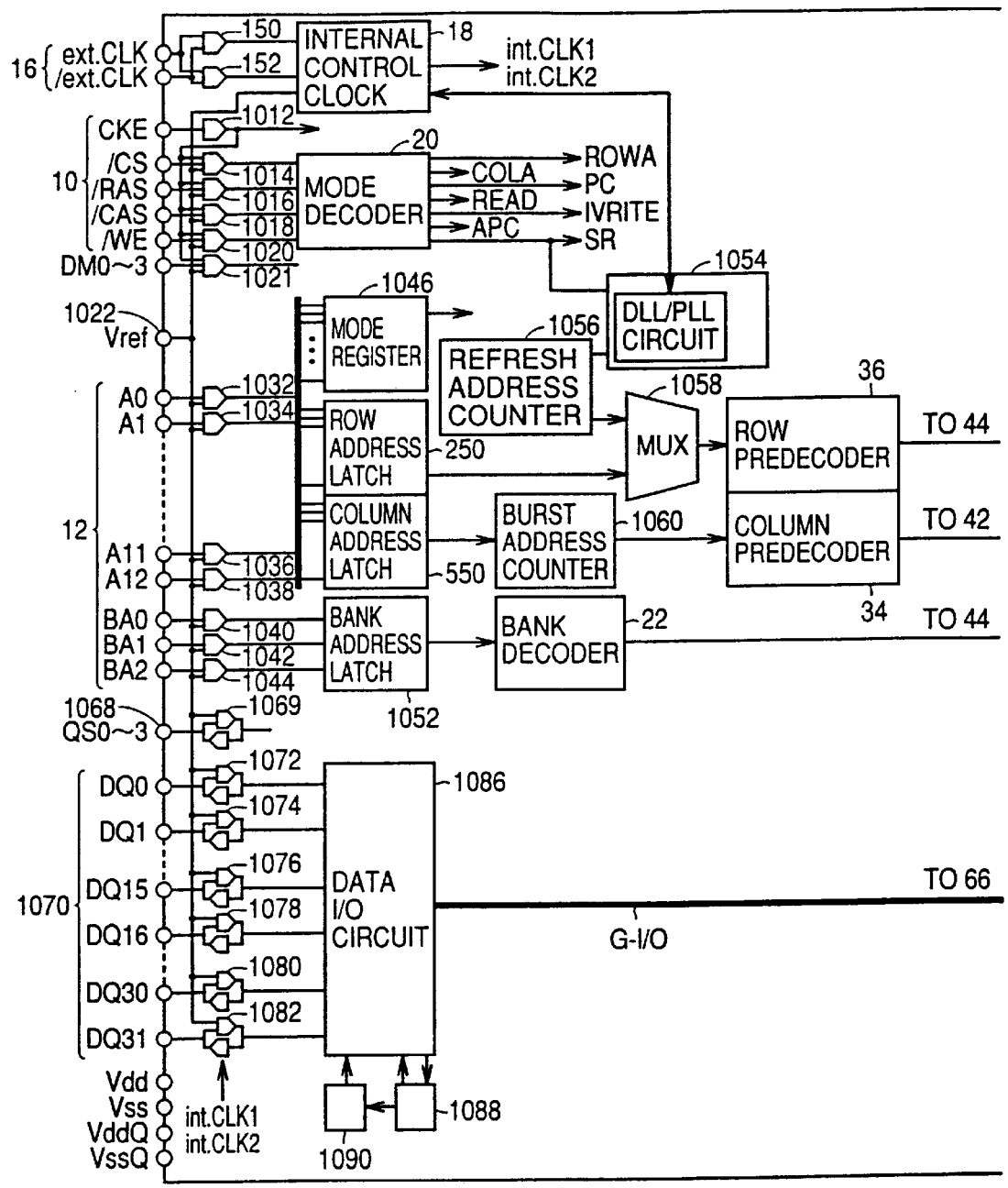
FIGS. 30A and 30B are a schematic block diagram showing a modification of SDRAM 1000.
Figure 30B:
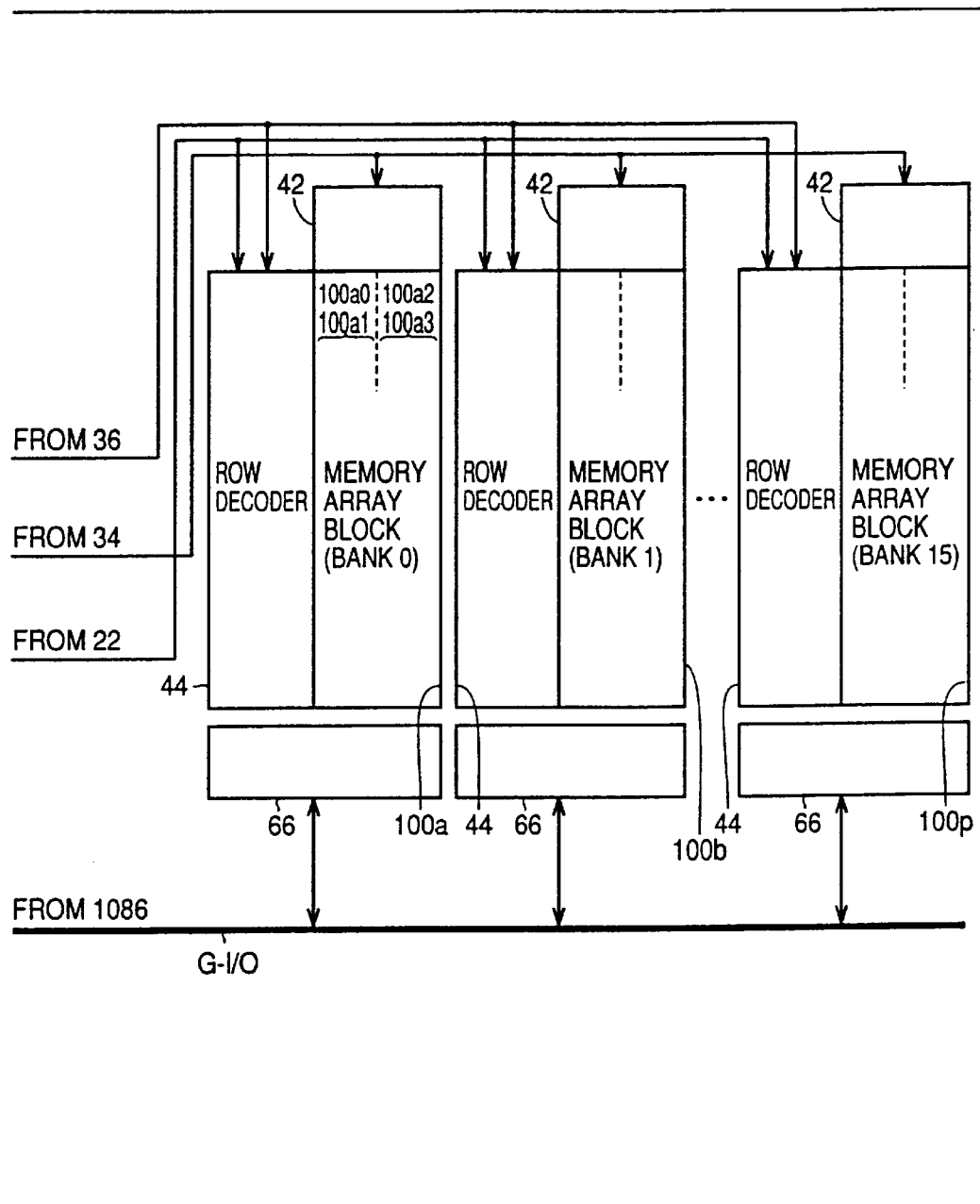

FIGS. 30A and 30B are a schematic block diagram showing a modification of SDRAM 1000 of the embodiment 1.

In the structure of SDRAM 1000 shown in FIGS. 1A and 1B, the DDL circuit included in internal clock producing circuit 18 produces fast internal clock signal int.CLK1 for the test operation mode based on external clock signals ext.CLK and /ext.CLK.

In many cases, however, self-refresh timer 1054 shown in FIG. 1A is internally provided with a DDL circuit or the like for producing a reference clock signal in the self-refresh operation. In this structure, the synchronous signal generating circuit, which is provided in internal control clock producing circuit 18 for selectively operating the DLL and PLL circuits as shown in FIG. 1A, can be eliminated by using, in the test mode operation, the DLL circuit included in self-refresh timer 1054 as a synchronous clock producing circuit, which can switch the operation between the DLL and PLL operations.

By using the circuit portion also for another purpose, i.e., for producing the synchronous clock signal as described above, increase in chip area can be suppressed while allowing the operation similar to that of the embodiment 1 already described.

[Embodiment 2]

Figure 31:
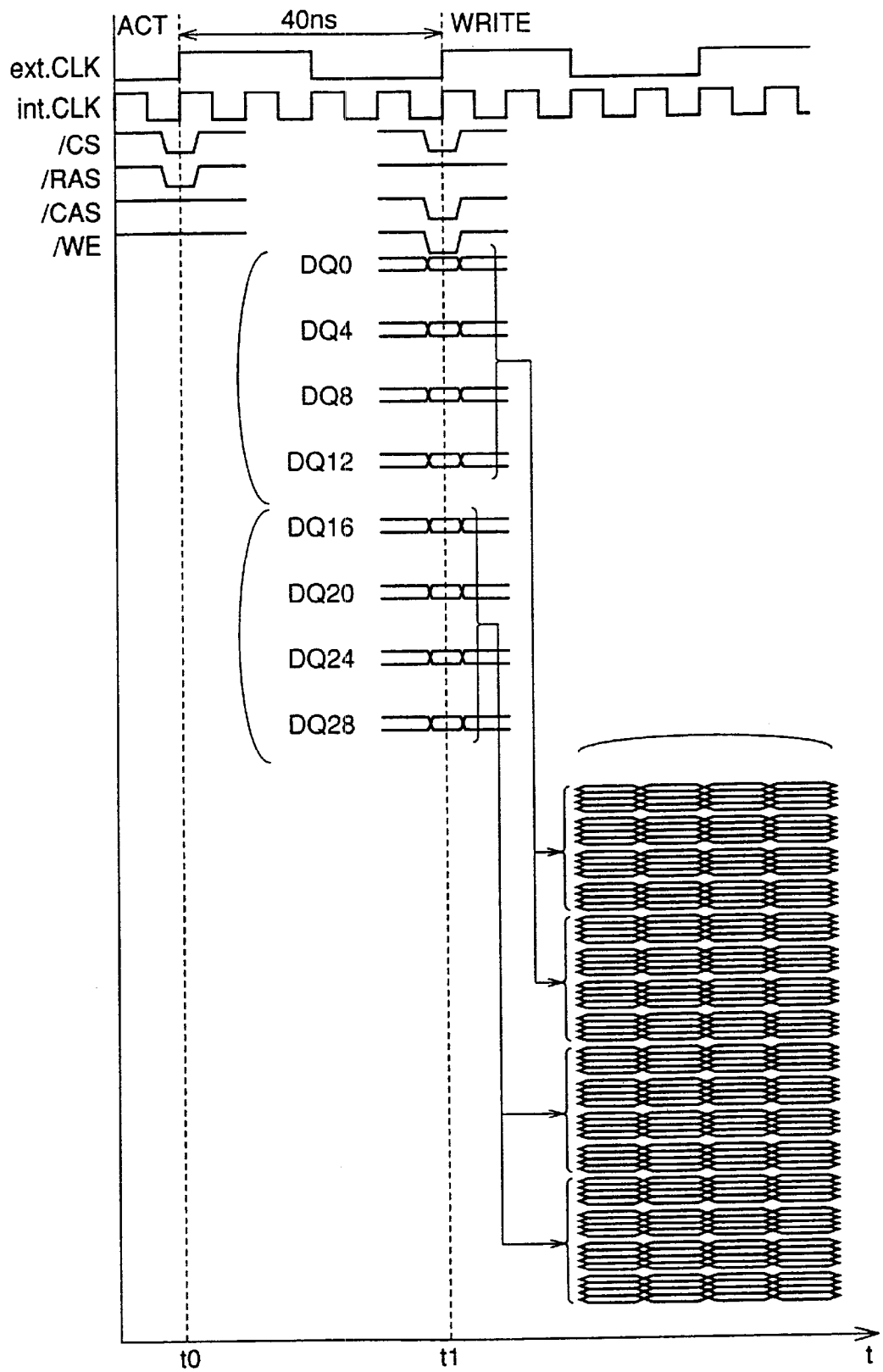
FIG. 31 is a timing chart showing a data write operation of the SDRAM of the embodiment 2 in the test operation mode.
Figure 32:
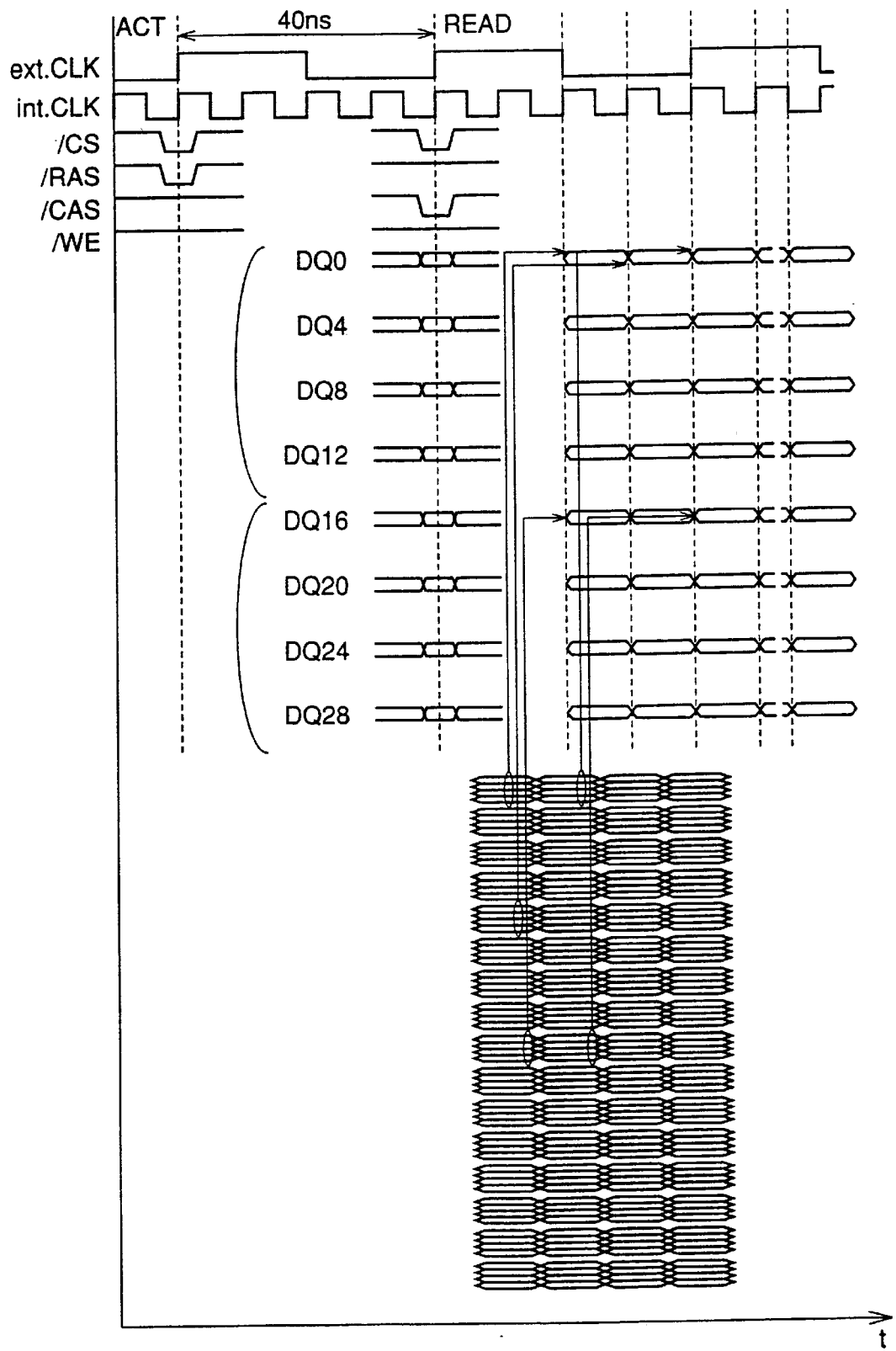
FIG. 32 is a timing chart showing a data read operation of the SDRAM of the embodiment 2 in the test operation mode.

FIGS. 31 and 32 are timing charts showing an operation in the test operation mode of an SDRAM of an embodiment 2 of the invention.

The structure of SDRAM 1000 can perform the operation shown in FIGS. 31 and 32 by switching the respective switches in internal control clock producing circuit 18 as will be described later.

Referring to FIG. 31, the data write operation in the test operation mode is similar to that already described with reference to FIG. 8, and therefore will not be described below.

FIG. 32 is a timing chart showing the read operation in the test operation mode of the SDRAM of the embodiment 2.

In FIG. 32, SDRAM 1000 operates with a single data rate. In other words, the data output is performed in response to the rising edge of internal clock signal int.CLK1.

This operation is allowed owing to the structure which can apply the clock signal for writing data internally from the SDRAM into latch circuits 1146 and 1148 independently of the clock signal for externally outputting the data from latch circuits 1146 and 1148.

In the operation mode shown in FIG. 32, data output is performed without using the SMD circuit and externally applied timing signal QS for data output.

Owing to this structure, the test can be performed with a lowered data rate for the data output, and a load on the tester device side can be reduced.

Figure 33:
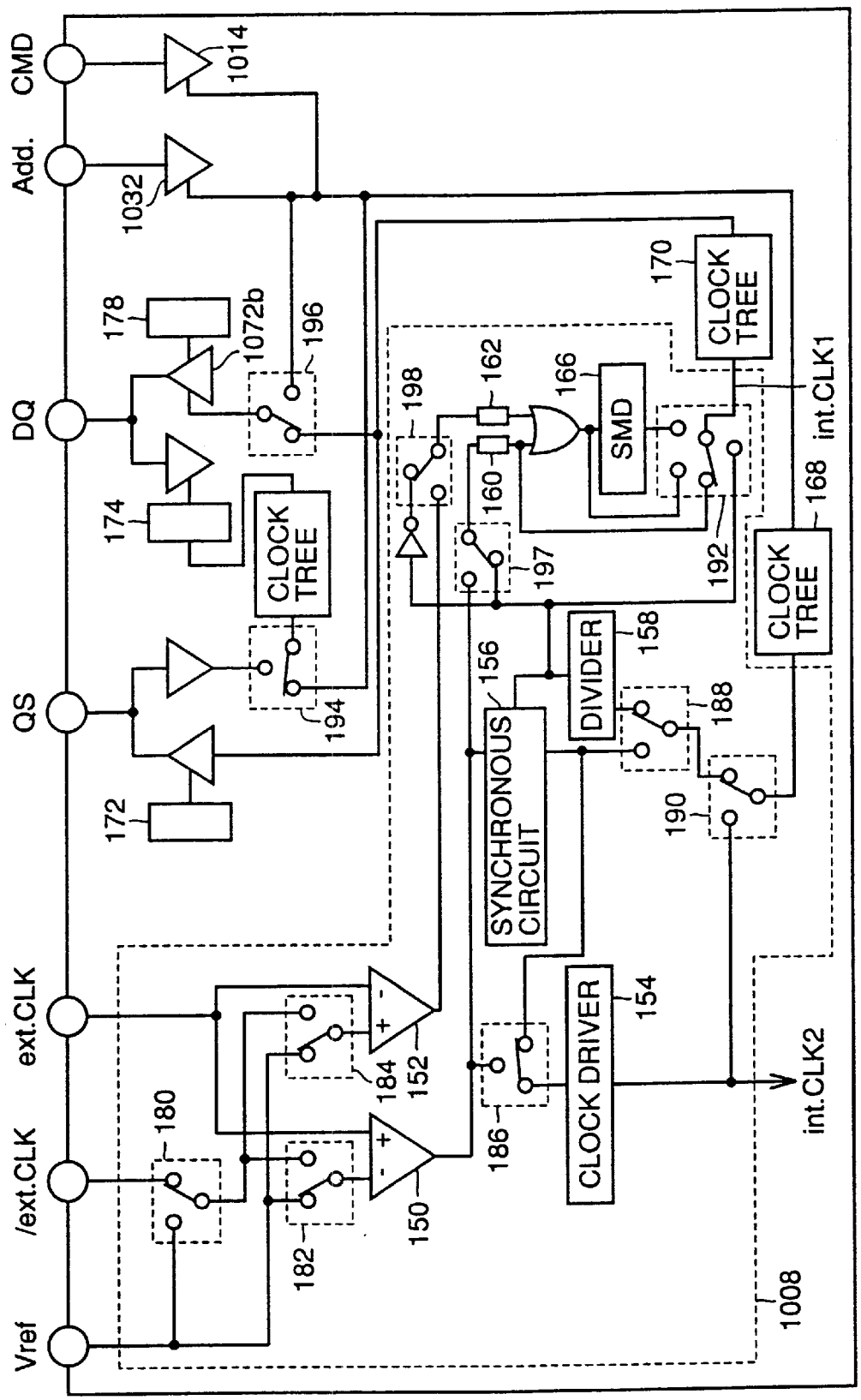
FIG. 33 shows switched states of switches in an internal control clock producing circuit 18 in the SDRAM of the embodiment 2.

FIG. 33 shows switched positions or states of the switches in internal control clock producing circuit 18 in the SDRAM of the embodiment 2.

In the structure shown in FIG. 33, differential amplifier 150 issues a signal which is active at the rising edge of external clock signal ext.CLK by using external clock signal ext.CLK of a single phase in the external clock signals, and the internal circuits operate in synchronization with internal clock signal int.CLK of a frequency four times larger than that of external clock signal ext.CLK produced by synchronous circuit 156.

The operation of taking in the address signal and the external control signal is performed in synchronization with the clock signal produced by divider circuit 158 by quartering the frequency of internal clock signal int.CLK 2, i.e., the clock signal of the same frequency as external clock signal ext.CLK.

For data output, such a structure is employed that the data output buffer is driven using, as internal clock signal int.CLK1, the output signal of one-shot pulse producing circuit 160 receiving internal clock signal int.CLK2 through switching circuit 197.

[Embodiment 3]

Figure 34:
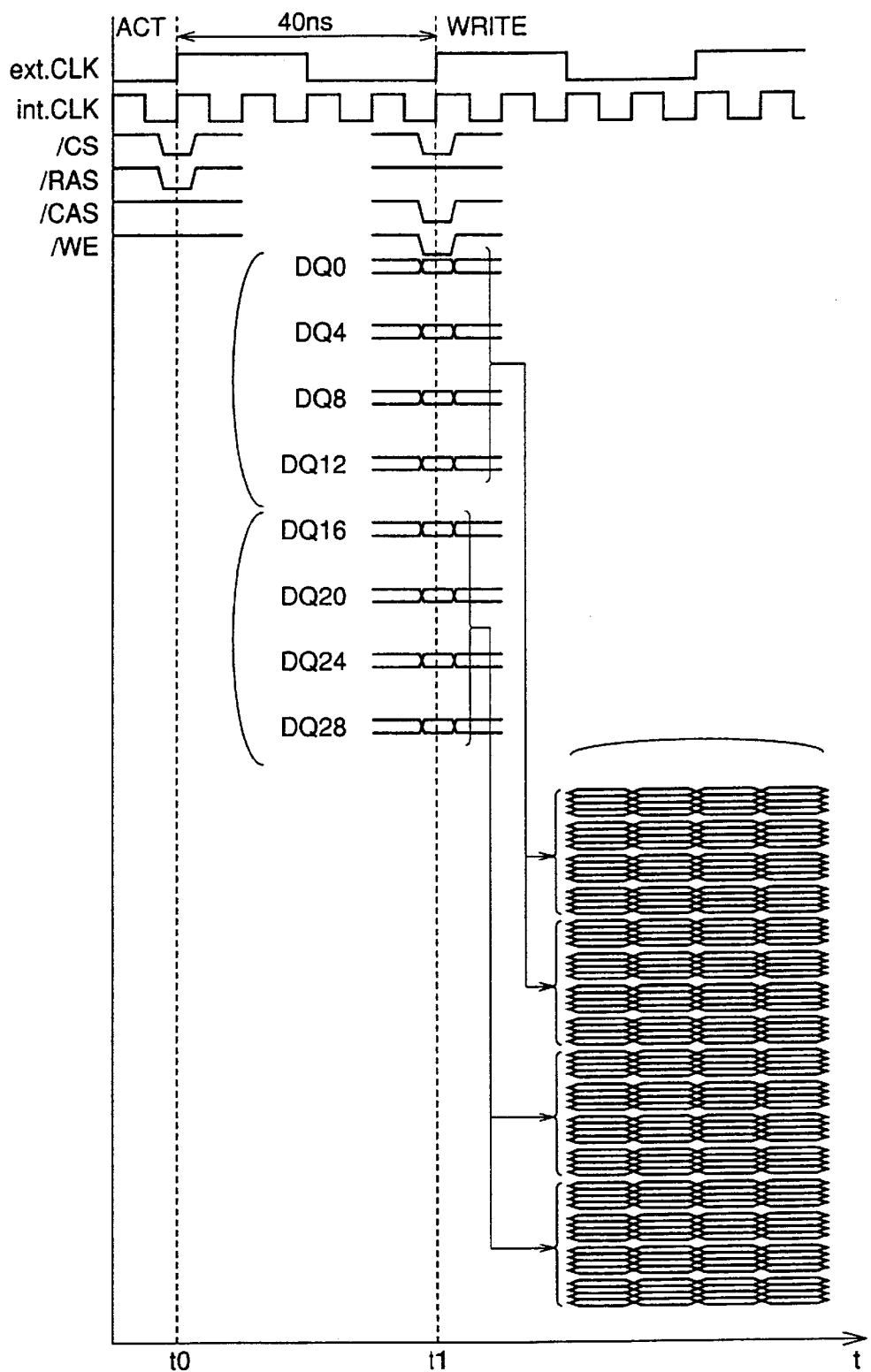
FIG. 34 is a timing chart showing a data write operation of an SDRAM of an embodiment 3 in the test operation mode.
Figure 35:
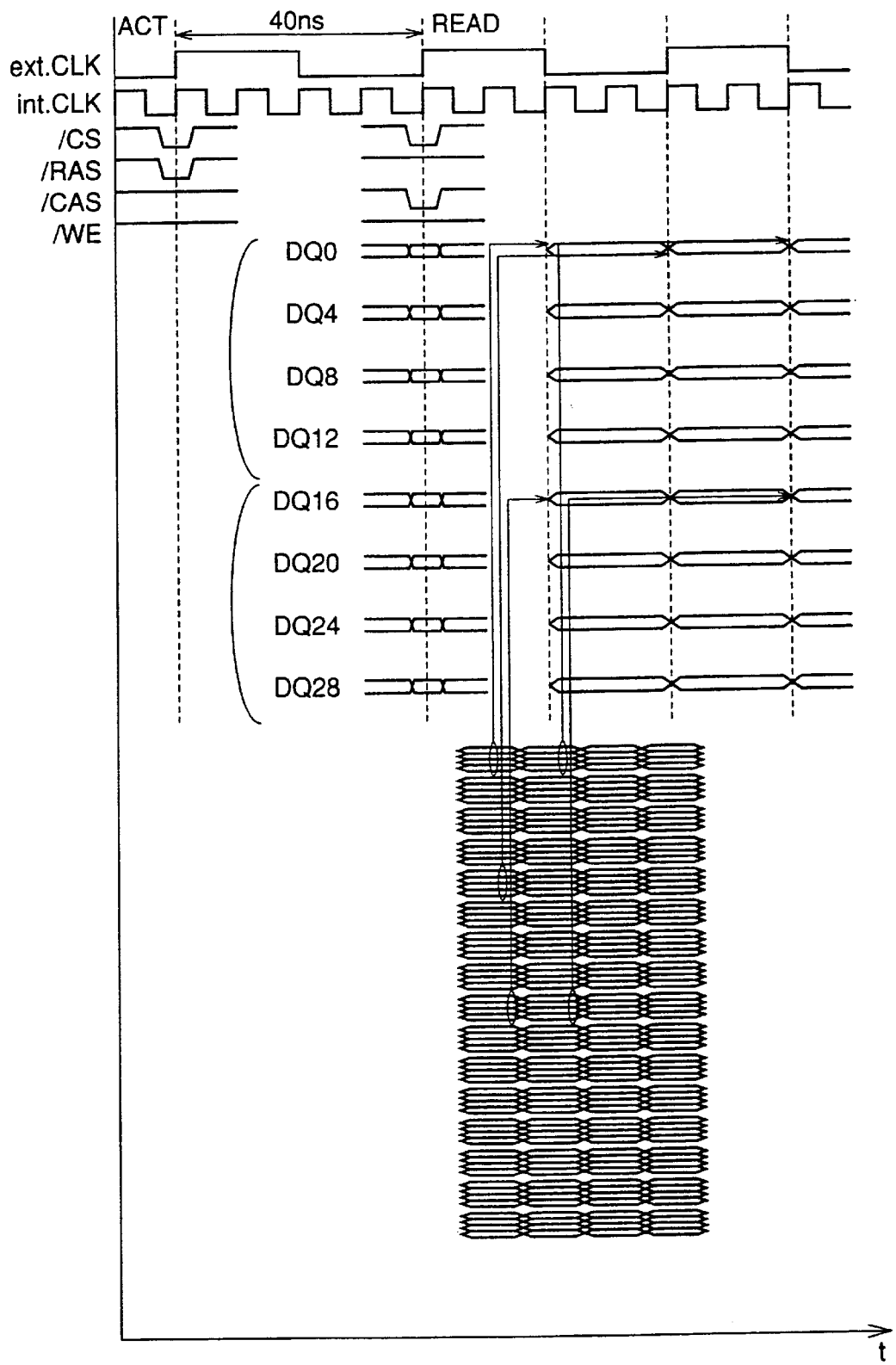
FIG. 35 is a timing chart showing a read operation of the SDRAM of the embodiment 3 in the test operation mode.

FIGS. 34 and 35 are timing charts showing operations in the test operation mode of SDRAM 1000 of an embodiment 3 of the invention.

In the embodiment 3, the structure itself of SDRAM 1000 is similar to that of the embodiment 1, and the following operations are performed by switching the switch circuits in internal control clock producing circuit 18 as described below.

Referring to FIG. 34, the data write operation in the test operation mode is similar to that already described with reference to FIG. 8, and therefore will not be described below.

In the data output operation of the embodiment 3, as shown in FIG. 35, the read data is externally sent in response to the rising and falling edges of external clock signal ext.CLK.

Each of data I/O circuits 3000 provided correspondingly to respective data I/O terminals DQ0, DQ4, DQ8, DQ12, DQ16, DQ20, DQ24 and DQ28 is provided with a latch for data output of 8 bits, and therefore data of 8×8=64 bits in total can be held. Further, as already described with reference to FIG. 24, the clock signal for writing data internally from the SDRAM into latch circuits 1146 and 1148 is applied independently of the clock signal for externally outputting the data from latch circuits 1146 and 1148. Owing to this structure, the data output operation can be performed in the above manner.

Figure 36:
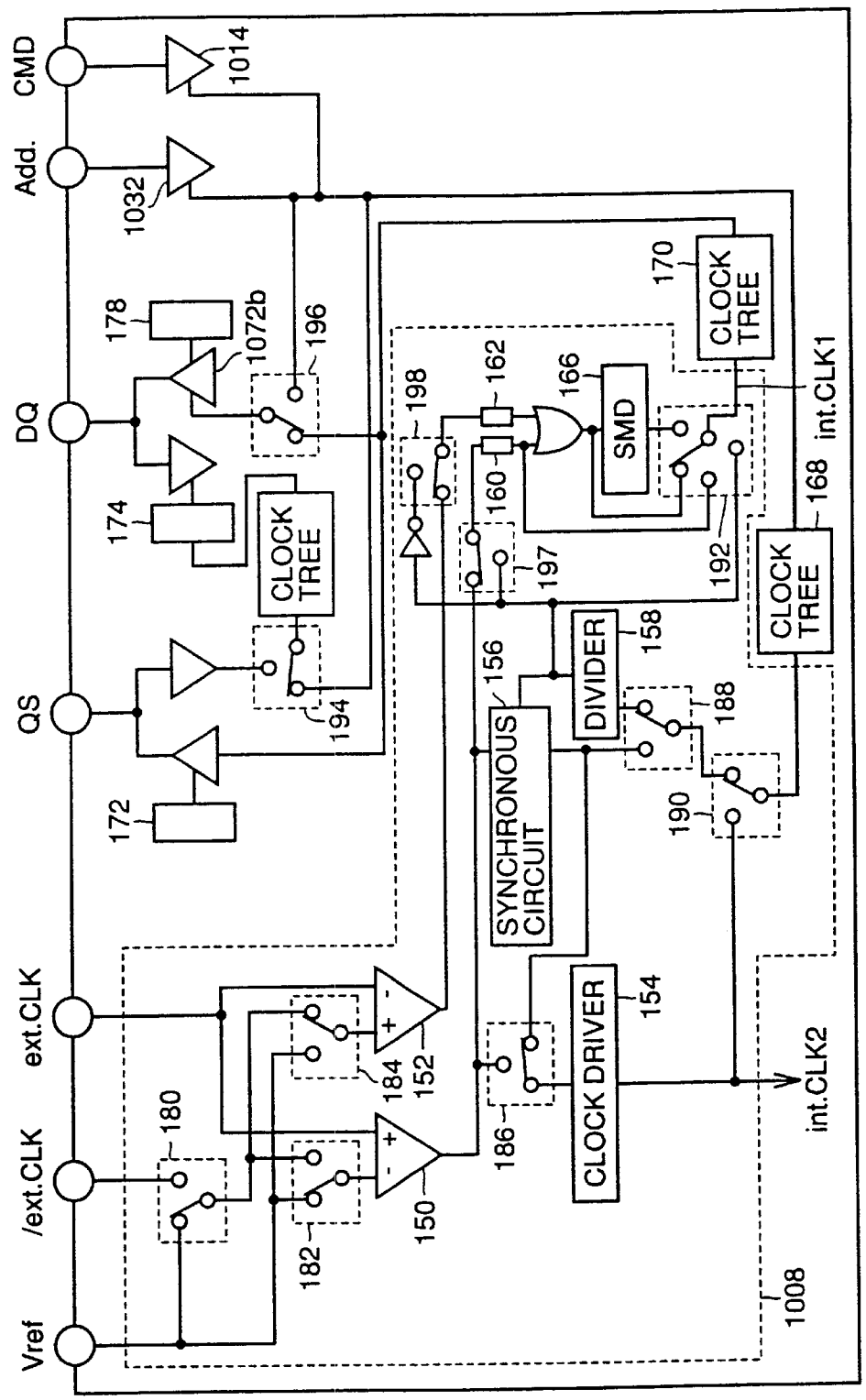
FIG. 36 shows switched states of switches in the internal control clock producing circuit.

FIG. 36 shows the switched positions of the switches in internal control clock producing circuit 18 for performing the read operation shown in FIG. 35.

In the structure shown in FIG. 36, external clock signal ext.CLK is applied to the positive input node of clock buffer circuit 150 and the negative input node of clock buffer circuit 152, and reference potential Vref is applied to the negative input node of clock buffer circuit 150 and the positive input node of clock buffer circuit 152. Owing to this structure, one-shot pulse generating circuit 160 receives the signal from clock buffer circuit 150 at the rising edge of external clock signal ext.CLK, and thereby generates a one-shot pulse. At the falling edge of external clock signal ext.CLK, one-shot pulse generating circuit 162 generates the one-shot pulse based on the output signal of clock buffer circuit 152.

Accordingly, OR circuit 164, which receives the one-shot pulse produced at both the rising and falling edges of external clock signal ext.CLK, issues a signal of double the frequency of external clock signal ext.CLK to the data output buffer portion through clock tree 170. Thereby, the data representing the result of comparison in the test operation mode is successively and externally output in response to the rising and falling edges of external clock signal ext.CLK as shown in FIG. 35.

Since the data output is performed with a frequency lower than that in the embodiment 2, a load on the tester side is further reduced, and a more inexpensive tester can be used for carrying out the test on SDRAM 1000.

[Embodiment 4]

According to the structures of the embodiments 1–3, the data writing is performed based on the data applied to the data I/O terminals of 8 bits among those of 32 pins, and then the result of comparison between the read data and the expected value data is output from these data I/O terminals of 8 pins.

In the embodiment 4, the data I/O pins used in the test operation mode are further reduced in number, and thereby the chips allowing simultaneous and parallel test can be increased in number.

As will be described later, the structure of the SDRAM of the embodiment 4 differs from the structure of SDRAM 1000 of the embodiment 1 in the structures of the data decoder, data scramble circuit and comparator arranged in the data I/O portion, and thus is similar in the other points to the structure of SDRAM 1000 of the embodiment 1.

Figure 37:
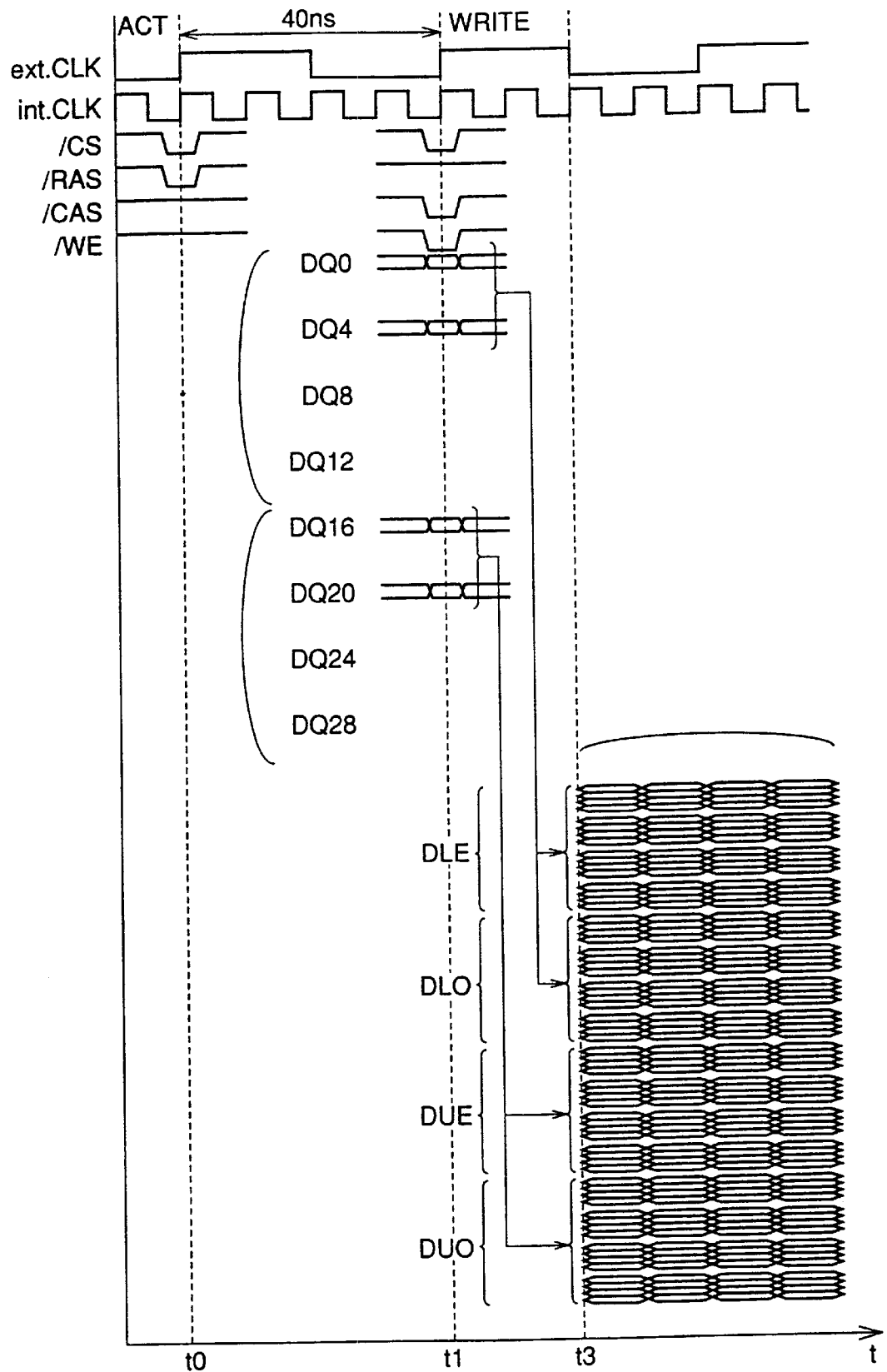
FIG. 37 is a timing chart showing an operation of writing data in the test operation mode using data I/O terminals of 4 pins.
Figure 38:
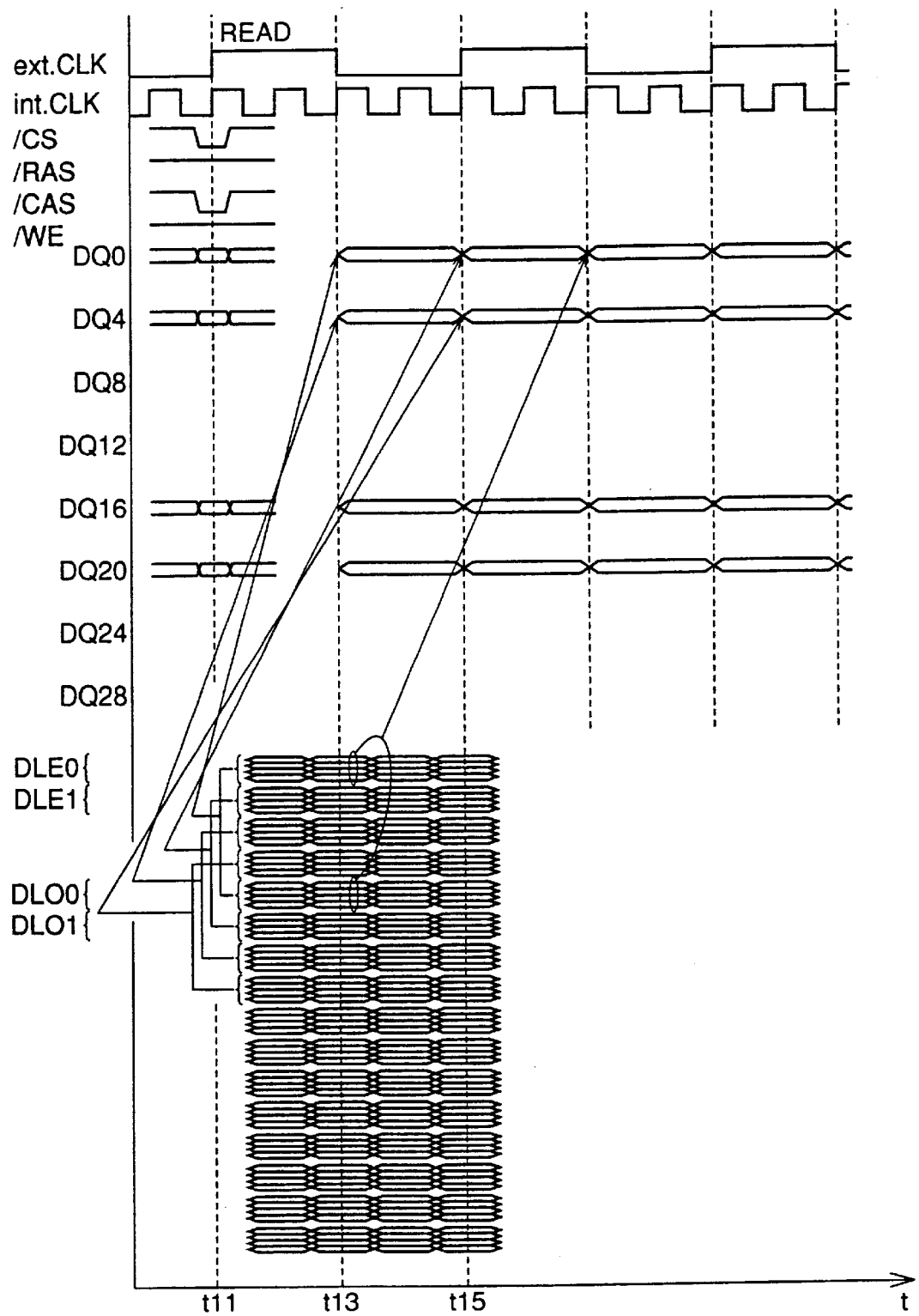
FIG. 38 is a timing chart showing a data read operation in the test operation mode using the data I/O terminals of 4 pins.

FIG. 37 is a timing chart showing an operation for performing the data writing in the test operation mode using data I/O terminals DQ0, DQ4, DQ16 and DQ20 of 4 pins among data I/O terminals DQ0–DQ31 of 32 pins. FIG. 38 is a timing chart showing the data read operation in the test mode using these data I/O terminals DQ0–DQ20 of 4 pins.

The structure shown by way of example in FIG. 37 produces the internal write data for test operation based on the data applied to four data I/O pins, i.e., data I/O terminals DQ0, DQ4, DQ16 and DQ20 among data I/O terminals DQ0–DQ31.

Accordingly, the SDRAM is supplied with the ACT command at the rising edge of external clock signal ext.CLK at time t0, and is supplied with the WRITE command at time t1 after one period of the external clock signal from time t0, i.e., after four periods of the internal clock signal from time t0. At time t1, the write data is applied to each of the foregoing four data I/O terminals DQ0–DQ20.

Based on the data of 2 bits applied to data I/O terminals DQ0 and DQ4, the structure produces data of 32×4 bits to be written as data DLE and DLO into the corresponding bank. Based on the data of 2 bits applied to data I/O terminals DQ16 and DQ20, the structure produces data of 32×4 bits to be written as data DUE and DUO into the corresponding bank.

Thus, at time t3, data of 4×4 bits is produced as data DLE, and data of 4×4 bits is produced as data DLO. These data are written into the even and odd address regions in the corresponding bank, respectively. Likewise, at time t3, data of 4×4 bits is produced as data DUO, and data of 4×4 bits is produced as data DUO. These data are written into the even and odd address regions in the corresponding bank, respectively.

As described above, the data which is externally applied at time t1 is formed of 4 bits, but the data of 64 bits to be written simultaneously is produced based on the externally applied data of 4 bits. Thereafter, data of 64 bits is repetitively produced in accordance with the period of the internal clock signal, and the data thus produced is successively written into the even and odd address regions in the corresponding bank.

In FIG. 37, external clock signal ext.CLK changes much more slowly than the operable frequency of the SDRAM in contrast to the normal operation mode shown in FIG. 5. Therefore, the write data is shown to be applied to the SDRAM simultaneously with the write command.

Referring to FIG. 38, the ACT command (not shown in FIG. 38) is applied at time t10. At subsequent time t11, the READ command is applied, and the same data as that applied during the write operation in the test operation mode is applied to data I/O terminals DQ0, DQ4, DQ16 and DQ20.

At time t11, data is simultaneously read out from the respective banks in response to application of the READ command. From the data I/O terminal DQ0, the comparison result relating to the data of 8 bits, which is to be issued correspondingly to data I/O terminals DQ0–DQ7 in the normal operation mode, i.e., the comparison result relating to data DLE0 of 4 bits among DLE and data DLO0 of 4 bits among DLO is externally output in response to the falling edge of external clock signal ext.CLK at time t13. Subsequently, the comparison result relating to the data of 8 bits, which is to be issued correspondingly to data I/O terminals DQ8–DQ15 in the normal operation mode, i.e., the comparison result relating to data DLE1 of 4 bits among DLE and data DLO1 of 4 bits among DLO is externally output from the data I/O terminal DQ0 in response to the falling edge of external clock signal ext.CLK at time t15.

Thereafter, the comparison results each relating to the read data of 8 bits is output from the corresponding data I/O pins in response to the rising and falling edges of the internal clock signal. The internal clock signal for controlling the operation of reading out the data in the above manner can be produced by setting the positions of the switches in internal control clock producing circuit 18 as already described with reference to FIG. 36 showing the embodiment 3.

Figures 39, 40:
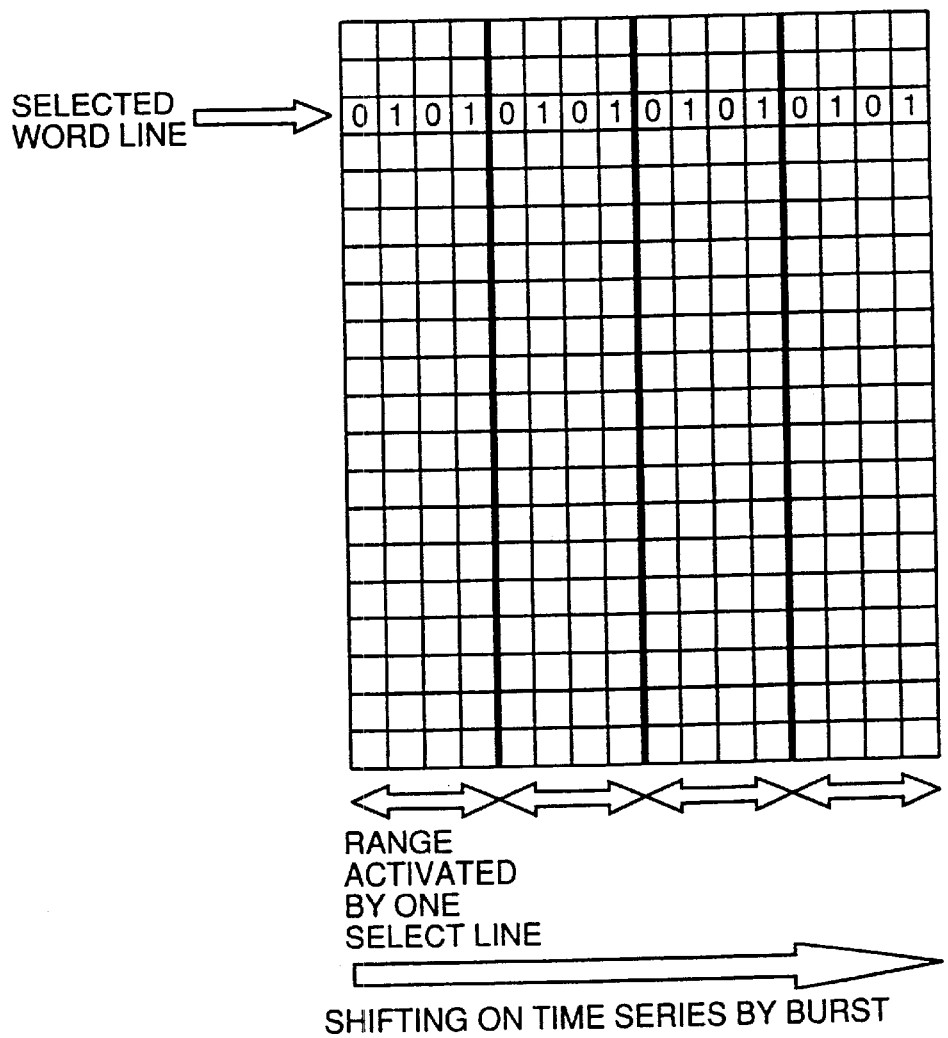
FIG. 39 shows an operation of a data decoder for producing the write data in the test operation mode using the data I/O terminals of 4 pins.
FIG. 40 conceptually shows a manner of successively writing internally produced data into corresponding banks in the test operation mode.

FIG. 39 shows the operation of the data decoder in the case where the write data is produced in the test operation mode using data I/O terminals DQ0, DQ4, DQ16 and DQ20 of 4 pins as already described with reference to FIGS. 37 and 38.

As already described, the write data produced correspondingly to data I/O terminals DQ0–DQ7 in the test operation mode is based on the data applied to data I/O terminals DQ0 and–DQ4, and the write data produced correspondingly to data I/O terminals DQ16–DQ31 in the test operation mode is based on the data applied to data I/O terminals DQ16 and DQ20.

FIG. 39 shows a data pattern in the case where data of 4 bits to be activated by one column select line is produced for four periods in the time base direction based on the data of 2 bits applied to data I/O terminals DQ0 and DQ4.

If the bit data applied to data I/O terminals DQ0 and DQ4 is, e.g., "01", the data pattern which is first applied, as data DLE, to data I/O pins DQ0–DQ3 is "0101".

In the bank corresponding to data I/O terminals DQ0–DQ31 and, in particular, in the even address region, therefore, data pattern of "0101" is simultaneously written into the memory cells of 4 bits which are activated by one column select line in the first cycle.

Thereafter, the data pattern applied to data I/O terminals DQ0–DQ3 does not change on the time series, and this constant pattern is supplied to thereto.

FIG. 40 conceptually shows a state that the data, which is internally produced in the test operation mode correspondingly to data I/O terminals DQ0–DQ3 in the above manner, is successively written into, e.g., even address region in the corresponding bank.

In connection with the selected word line, the column select lines are successively selected on the time series during the burst operation, and the data of, e.g., "0101" is simultaneously written into the memory cells of 4 bits corresponding to four columns which are simultaneously activated by one column select line as described before.

Figure 41:
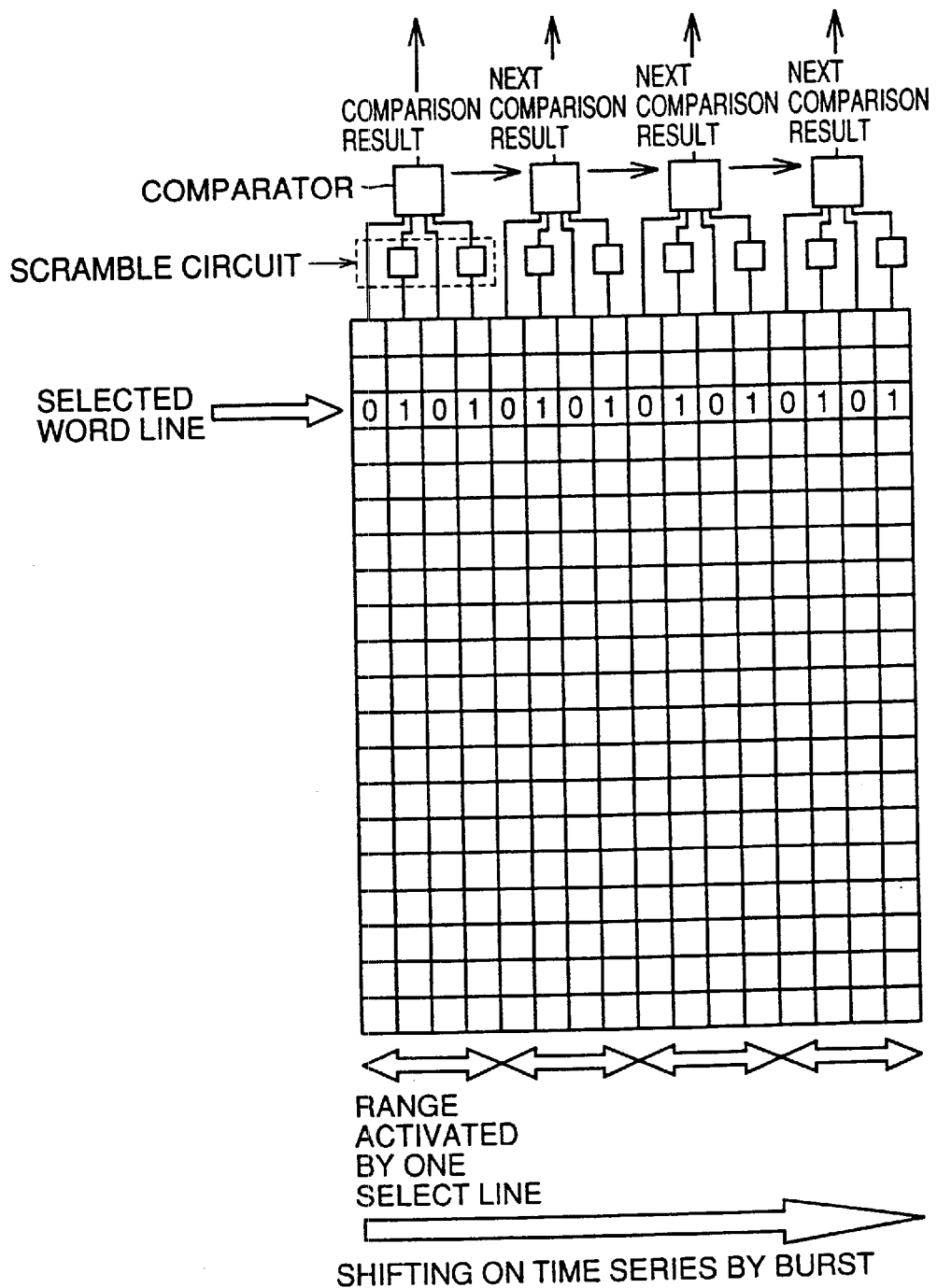
FIG. 41 conceptually shows a data read operation in the test operation mode.

FIG. 41 conceptually shows the data read operation in the test operation mode which is performed after the data write operation described before with reference to FIG. 40.

This operation will also be described in connection with, e.g., the even address region corresponding to data I/0 terminals DQ–DQ3.

The column select lines are successively activated on the time series by the burst operation while the selected and activated word line (memory cell row) is kept in the fixed state. In this operation, the data which is simultaneously read out from the memory cells of 4 bits activated by one column select line is scrambled by the scramble circuit, and then is converted by the comparator into data representing the result of comparison with respect to the data of 4 bits read from the odd address region. The data thus converted is issued to data I/0 terminal DQ0.

Figure 42:
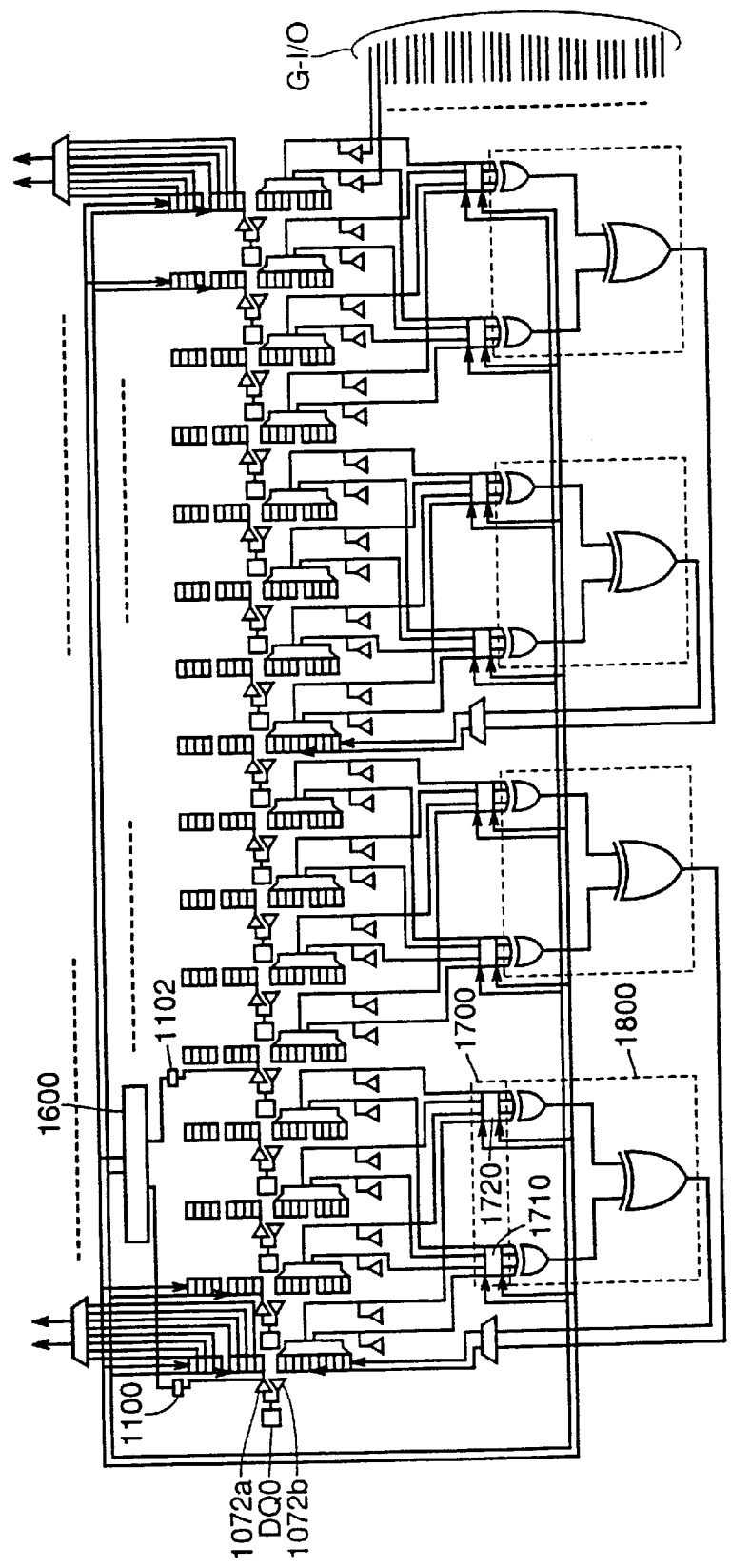
FIG. 42 is a schematic block diagram showing a structure relating to data I/O terminal DQ0–DQ15 of an embodiment 4.

FIG. 42 is a schematic block diagram showing a structure of a portion including data I/O terminals DQ0–DQ15 of the embodiment 4, and is comparable with FIG. 22 showing the embodiment 1.

As already described, the circuit structure shown in FIG. 42 differs from the circuit structure in FIG. 22 only in the structures of decoder circuit 1600, data scramble circuit 1700 and comparator circuit 1800. The same parts and portions bear the same reference numbers, and will not be described below.

Comparator circuit 1700 made a comparison on the data of 8 bits in total, i.e., the data read from the even address region and the data read from the odd address region in the bank corresponding to data I/O terminals DQ0–DQ3, and the data representing the result is sent to data I/O terminal DQ0 as already described.

Figure 43:
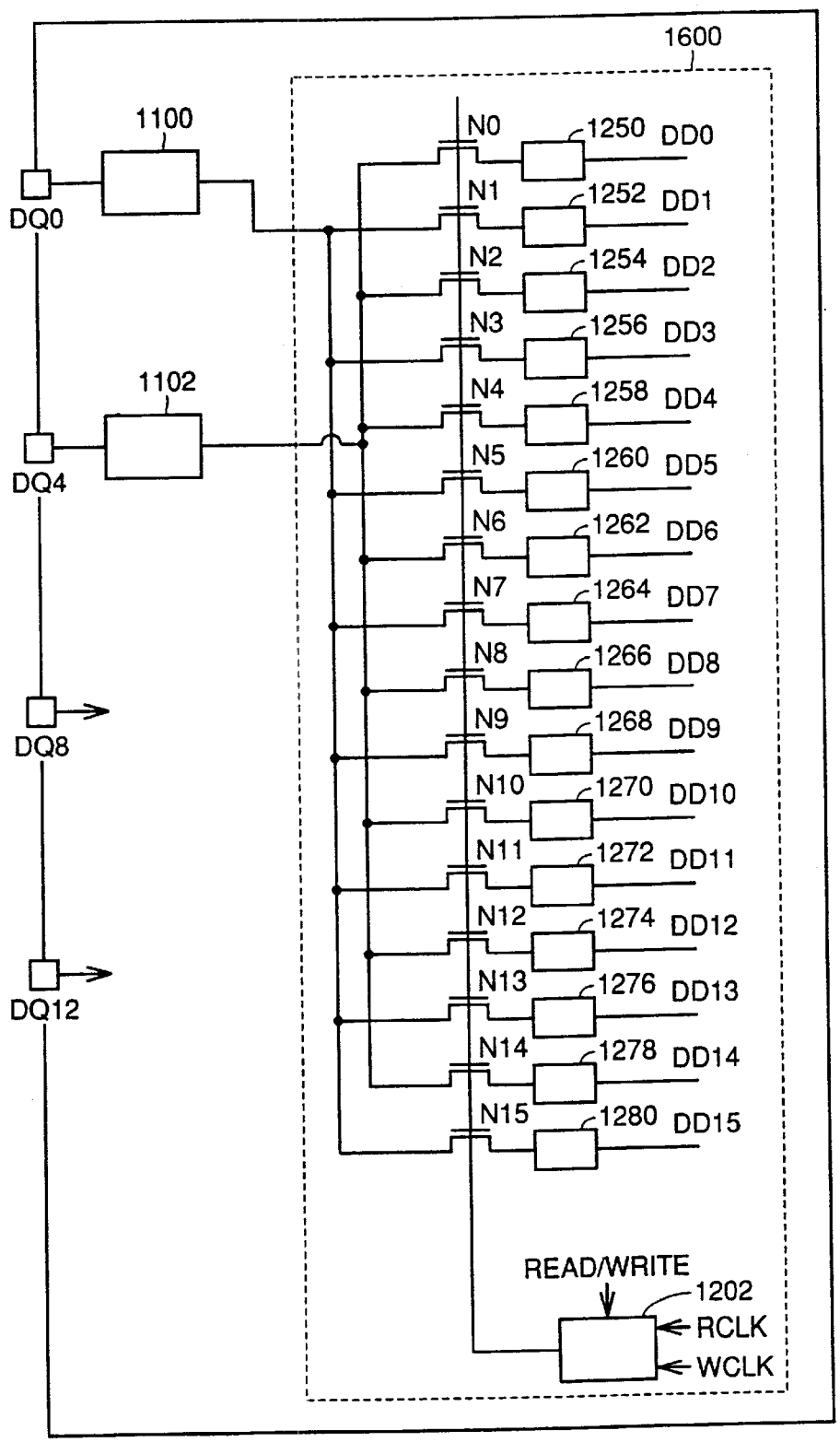
FIG. 43 is a schematic block diagram showing a structure of a data decoder 1600 of the embodiment 4 and, particularly, is a diagram comparable with FIG. 25 of the embodiment 1.

FIG. 43 is a schematic block diagram showing the structure of data decoder 1600 of the embodiment 4, and is comparable with FIG. 25 showing the embodiment 1.

In the embodiment 4, as already described, the write data corresponding to the 16 data I/O terminals (e.g., data I/O terminals DQ0–DQ15) is produced based on only the data sent from two data I/O terminals DQ0 and DQ4.

Data decoder 1600 includes multiplexer 1202 which receives read clock RCLK and write clock WCLK, and selects them for issuing the clock signal depending on whether the operation is the write or the read operation, N-channel MOS transistors N0, N2, N4, N6, N8, N10, N12 and N14 which are turned on/off in accordance with the output of multiplexer 1202 for selectively transmitting the data sent from latch circuit 1100 holding the data applied to data I/O terminal DQ0, N-channel MOS transistors N1, N3, N5, N7, N9, N11, N13 and N15 which are turned on/off in accordance with the output of multiplexer 1202 for selectively transmitting the data sent from latch circuit 1102 holding the data applied from data I/O terminal DQ4, and latch circuits 1250–1280 which are arranged correspondingly to N-channel MOS transistors N0–N15 for holding the data transmitted through these N-channel MOS transistors and issuing corresponding decode data DD0–DD15, respectively.

Figure 44:
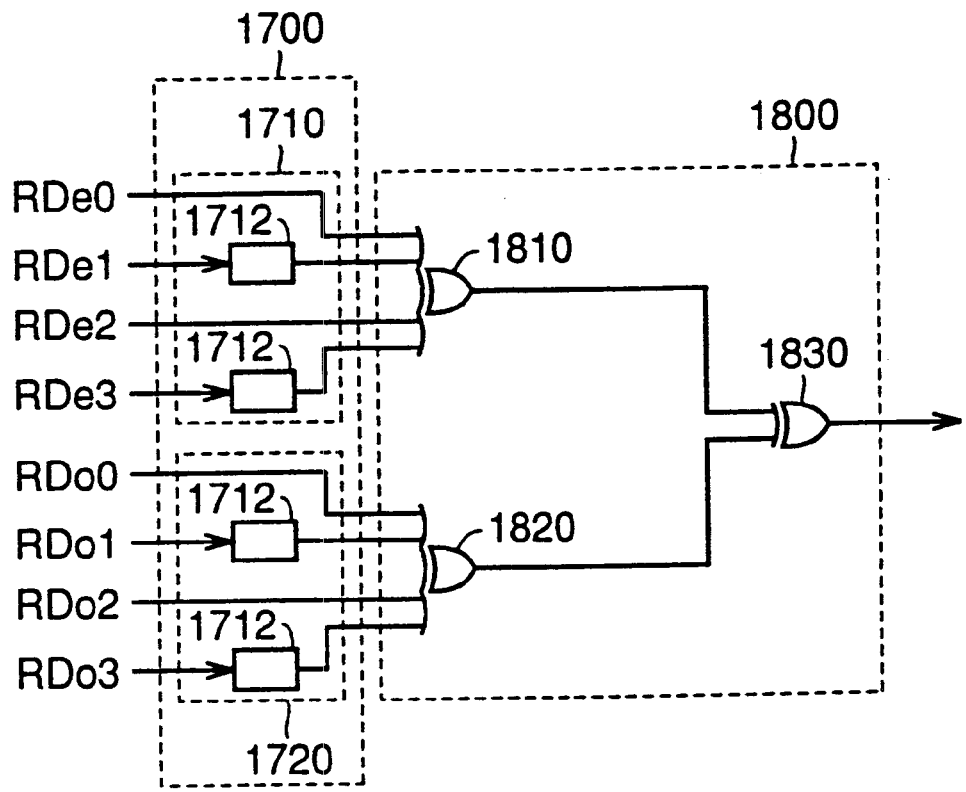
FIG. 44 is a circuit diagram showing structures of a data scramble circuit 1700 and a comparator circuit 1800.

FIG. 44 is a circuit diagram showing structures of data scramble circuit 1700 and comparator circuit 1800.

Data scramble circuit 1700 includes an internal scramble circuit 1710 for scrambling the read data corresponding to data I/O terminals DQ0–DQ3 and, in particular, 4 bits of data read from the even address region in the corresponding bank, and a data scramble circuit 1720 for scrambling the read data corresponding to data I/O terminals DQ0–DQ3 and, in particular, 4 bits of data read from the odd address region in the corresponding bank.

Comparator circuit 1800 includes an exclusive-OR gate 1810 making a comparison on the output of internal scramble circuit 1720, a logic gate 1820 performing exclusive-OR of the output of internal scramble circuit 1720, and a logic gate 1830 performing exclusive-OR between the outputs sent from exclusive-OR gates 1810 and 1820.

Figure 45:
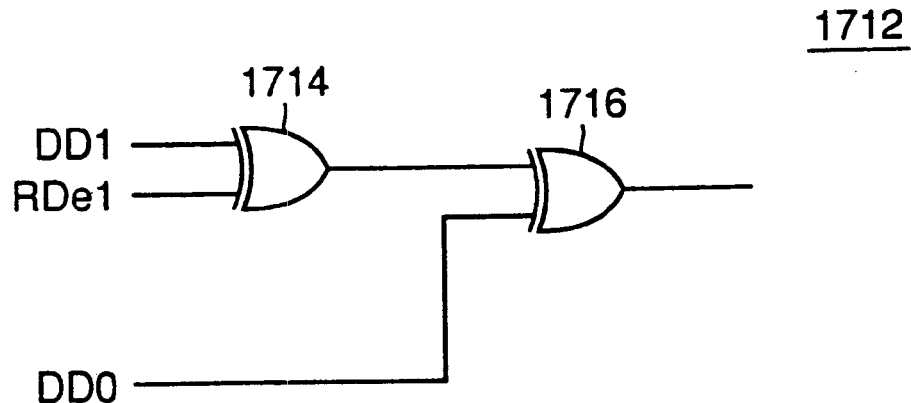
FIG. 45 is a circuit diagram showing a structure of an arithmetic circuit 1712.

FIG. 45 is a circuit diagram showing the structure of arithmetic circuit 1712 provided correspondingly to data RDe1 in internal scramble circuit 1710 shown in FIG. 44.

Arithmetic circuit 1712 includes an exclusive-OR gate 1714 receiving read data RDe1 and decode data DD1, and an exclusive-OR gate 1716 which receives decode data DD0 and the output of exclusive-OR gate 1714, and issues the arithmetic result to exclusive-OR gate 1810.

Arithmetic circuits 1712 provided for other data RDe3, RDo1 and RDo3 have similar structures.

Owing to the above structure, the result of comparison of the write and read data with the expected value data in the test operation mode can be externally transmitted by using the data I/O terminals of 4 pins among the data I/O terminals of 32 pins.

[Embodiment 5]

Figure 46:
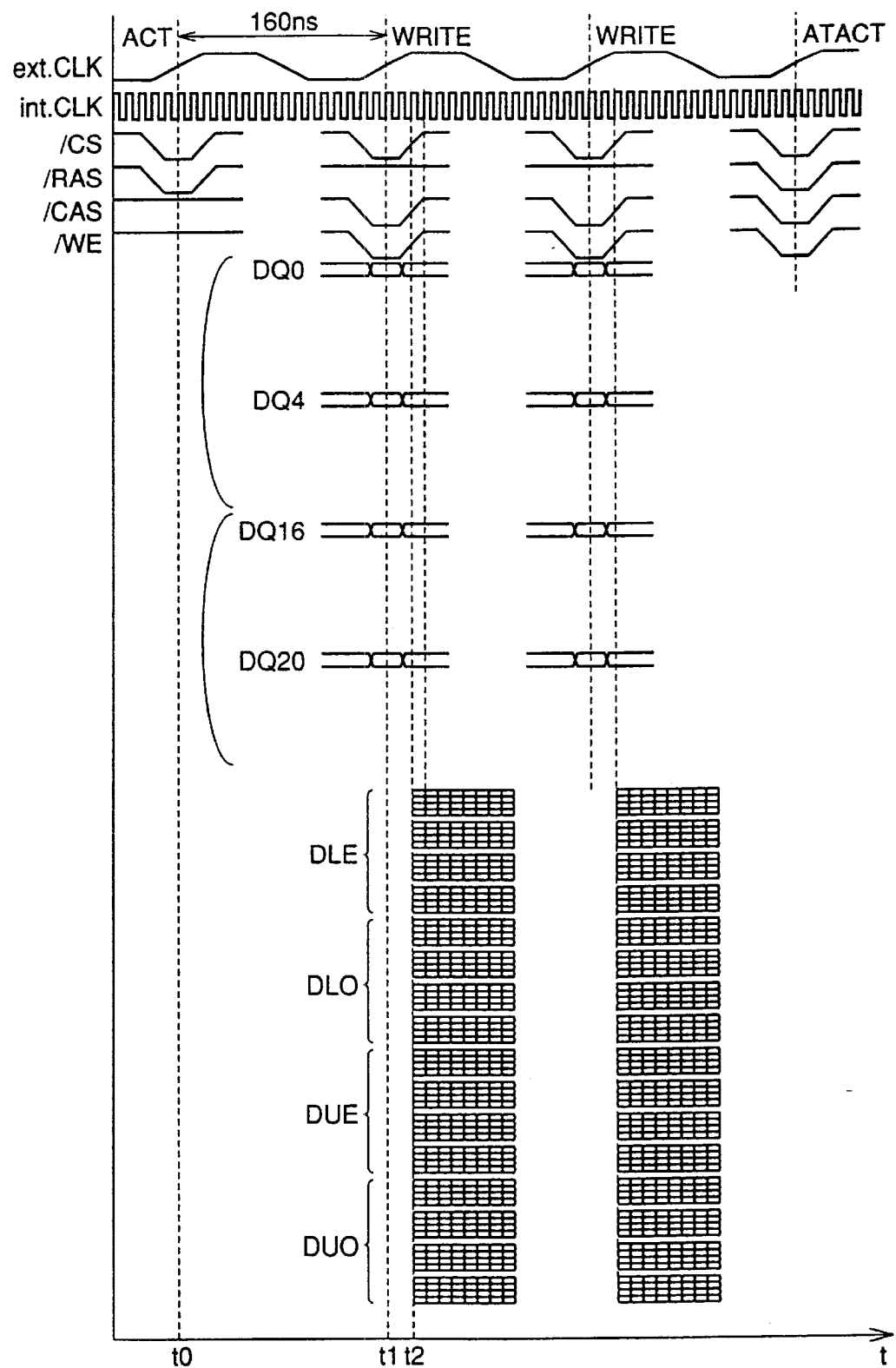
FIG. 46 is a timing chart showing an operation for data writing in the test operation mode of an embodiment 5.

FIG. 46 is a timing chart showing the write operation in the test operation mode of the SDRAM of the embodiment 5 of the invention.

As will be described below, the example shown in FIG. 46 differs from the SDRAM of the embodiment 4 in the structures of the scramble circuit and comparator circuit provided for the data I/O pins, and also differs from the embodiment 1 in that frequency division by an improved number is performed for producing the internal clock in internal control clock producing circuit 18.

The SDRAM of the embodiment 5 has a data I/O width of 32 bits, and has the data I/O width of 16 bits on each side so that a so-called ODI type is employed.

The SDRAM receives the external clock signal of a frequency of 160 ns generated by an inexpensive tester, and internally generates internal clock signal int.CLK of a frequency 16 times larger than that of the external clock signal. Thereby, the SDRAM internally performs the operation synchronized with clock signal int.CLK of 100 MHz.

At time t0, the ACT command instructing the operation of selecting the word line is applied for activating the chip.

It is assumed that the command data is taken into the SDRAM in response to the rising edge of the external clock signal.

Within one period of the external clock signal, the word line is sufficiently activated, and the sense amplifier operation of amplifying the data is completed.

For writing the data into the memory array, the write operation is instructed in response to the rising edge of clock signal at time t1.

At the same time, the data is taken into the SDRAM, and thereby the data pattern is generated.

It is now assumed that data of the data I/O pins of 4 bits among the data I/O pins of 32 bits is used for producing the data pattern, as is done in the embodiment 4.

The addressing for performing the write operation is produced based on the address which is input together the write command. Usually, the burst length is already set in the initial stage of the chip operation, and therefore the burst address is produced within the SDRAM based on the first input address without requiring a certain specifying operation.

If the burst length is set to 8, the burst address for 8 cycles is generated at every cycle after time t2, and thereby the write operation is performed.

Instead of the above, such a structure may be employed that an arbitrary address pattern is generated by decoding several bits in the input address through the steps similar to those of generating the data pattern.

Instead of the address input, decoding may be effected on the signal input through command pin, data setting by a mode register or the like.

Figure 47:
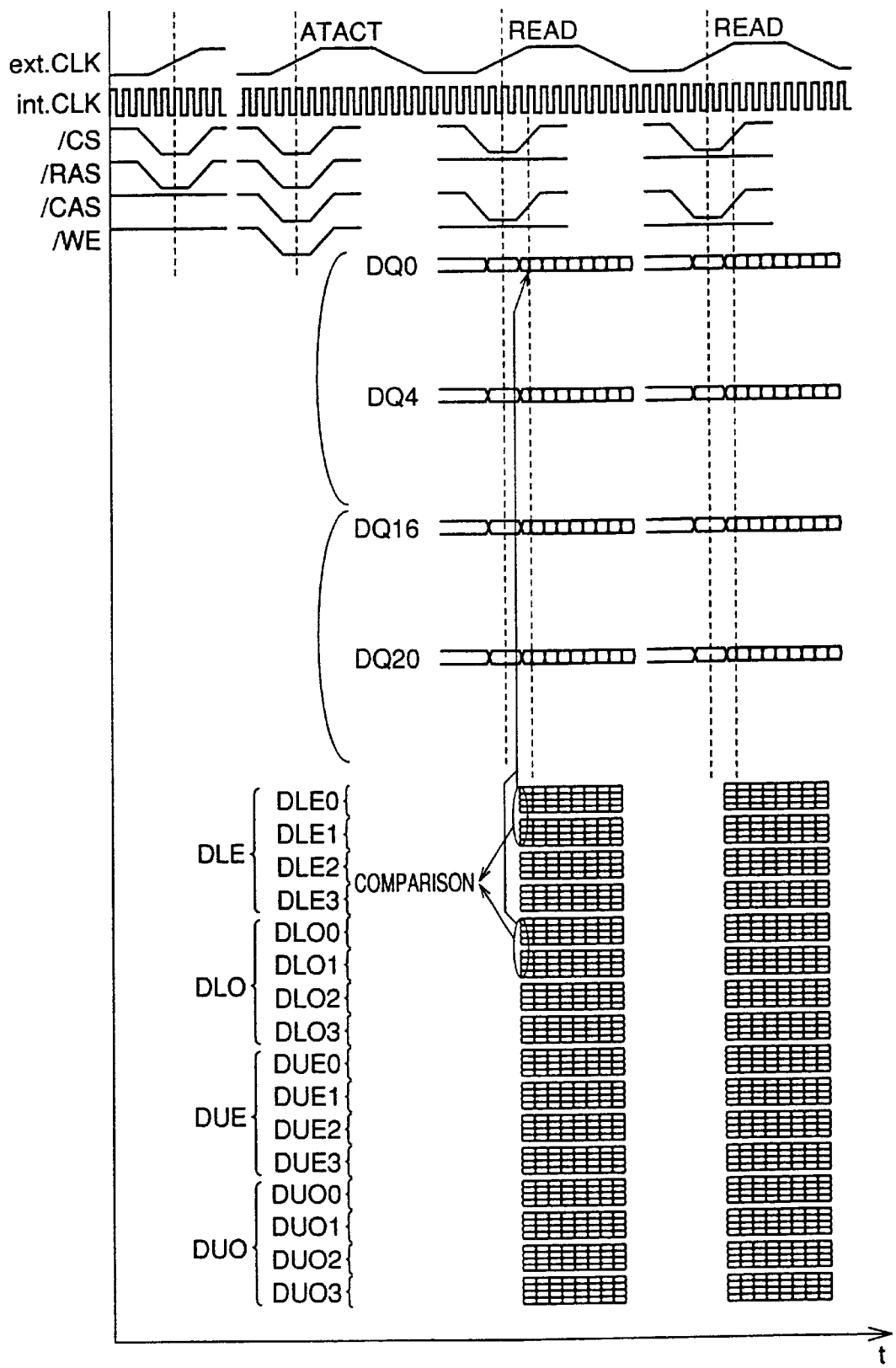
FIG. 47 is a timing chart showing a data read operation in the test mode of the embodiment 5.

FIG. 47 is a timing chart showing the read operation in the test operation mode of the SDRAM of the embodiment 5 of the invention.

In the example shown in FIGS. 46 and 47, the SDRAM operates with a single data rate, and the burst length is set to 8.

In the structure shown in FIG. 47, the comparison is made on the read data, which is read from the odd and even address regions in the bank corresponding to data I/O terminals DQ0–DQ7, and, in particular, is simultaneously made on data DLE0, DLE1, DLO0 and DLO1 of 16 bits among the above read data in response to each period of the internal cycle. The result of this comparison is sent to data I/O terminal DQ0 at every rising edge of the internal cycle.

Data I/O terminal DQ4 issues the data of comparison result relating 16 bits, i.e., DLE2, DLE3, DLO2 and DLO3 at the rising edge of the internal cycle. Data I/O terminal DQ16 issues the data of comparison result relating 16 bits, i.e., DUE0, DUE1, DUO0 and DLO1 at the rising edge of the internal cycle. Data I/O terminal DQ20 issues the data of comparison result relating 16 bits, i.e., DUE2, DUE3, DUO2 and DLO3 at the rising edge of the internal cycle.

Figure 48:
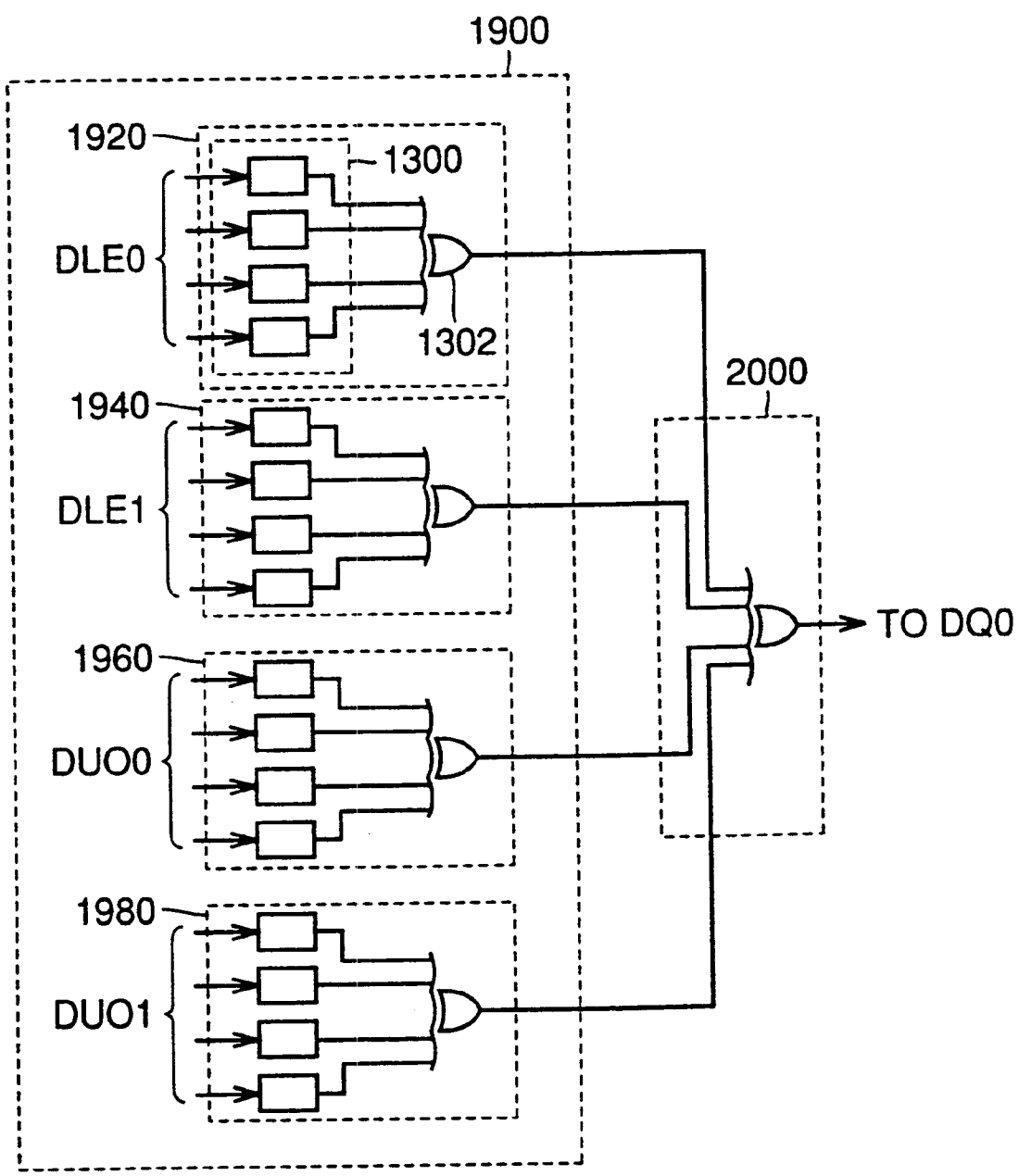
FIG. 48 is a schematic block diagram showing structures of a data scramble circuit 1900 and a comparator circuit 2000.

FIG. 48 is a schematic block diagram showing structures of a data scramble circuit 1900 and a comparator circuit 2000 for performing the above comparison.

Data scramble circuit 1900 includes an internal scramble circuit 1920 for scrambling data DLE0 read from the even address region in the bank corresponding to data I/O terminals DQ0–DQ3, an internal scramble circuit 1940 for scrambling data DLE1 read from the even address region in the bank corresponding to data I/O terminals DQ4–DQ7, an internal scramble circuit 1960 for scrambling data DLO0 read from the odd address region in the bank corresponding to data I/O terminals DQ0–DQ3, and an internal scramble circuit 1980 for scrambling data DLO1 read from the odd address region in the bank corresponding to data I/O terminals DQ4–DQ7.

The structure of, e.g., internal scramble circuit 1920 is similar to those of data scramble circuit 1300 and comparator circuit 1302 of the embodiment 1.

Other internal scramble circuits 1940–1980 have similar structures.

Comparator circuit 2000 includes an exclusive-OR gate 2000 which receives scrambled data from internal scramble circuits 1920–1980, and issues results of exclusive-OR operation.

Owing to the above structures of data scramble circuit 1900 and comparator circuit 2000, each result of comparison made on 16 bits of successively read data is issued to the data I/O terminal (e.g., DQ0) at every cycle of the internal clock signal.

[Embodiment 6]

Figure 49:
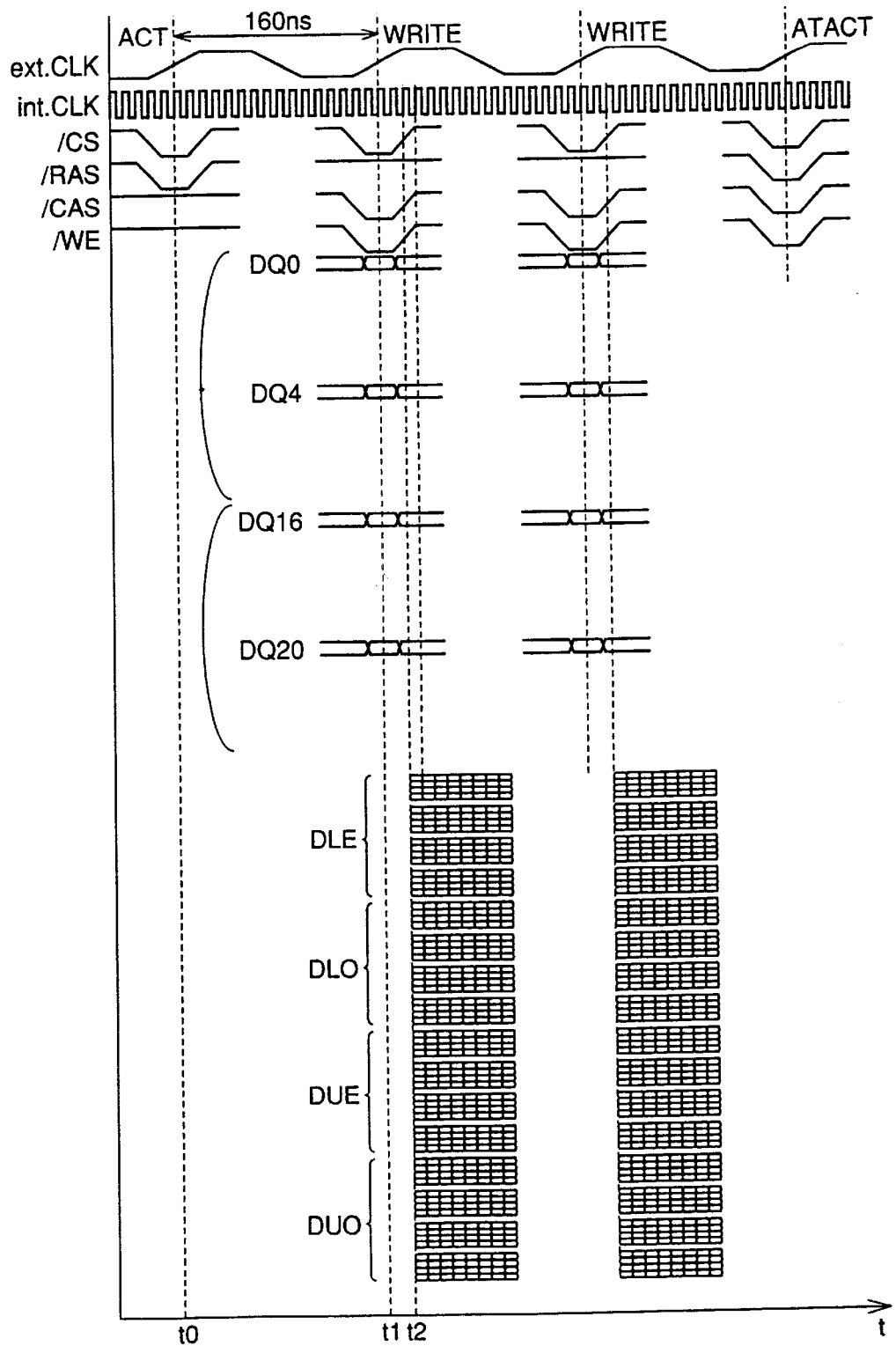
FIG. 49 is a timing chart showing a write operation in the test operation mode of an SDRAM of an embodiment 6 of the invention.

FIG. 49 is a timing chart showing the write operation in the test operation mode of SDRAM of an embodiment 6 of the invention.

The write operation shown in FIG. 49 is similar to the write operation in the test operation mode of the embodiment 5 shown in FIG. 46, and therefore will not be described below.

Figure 50:
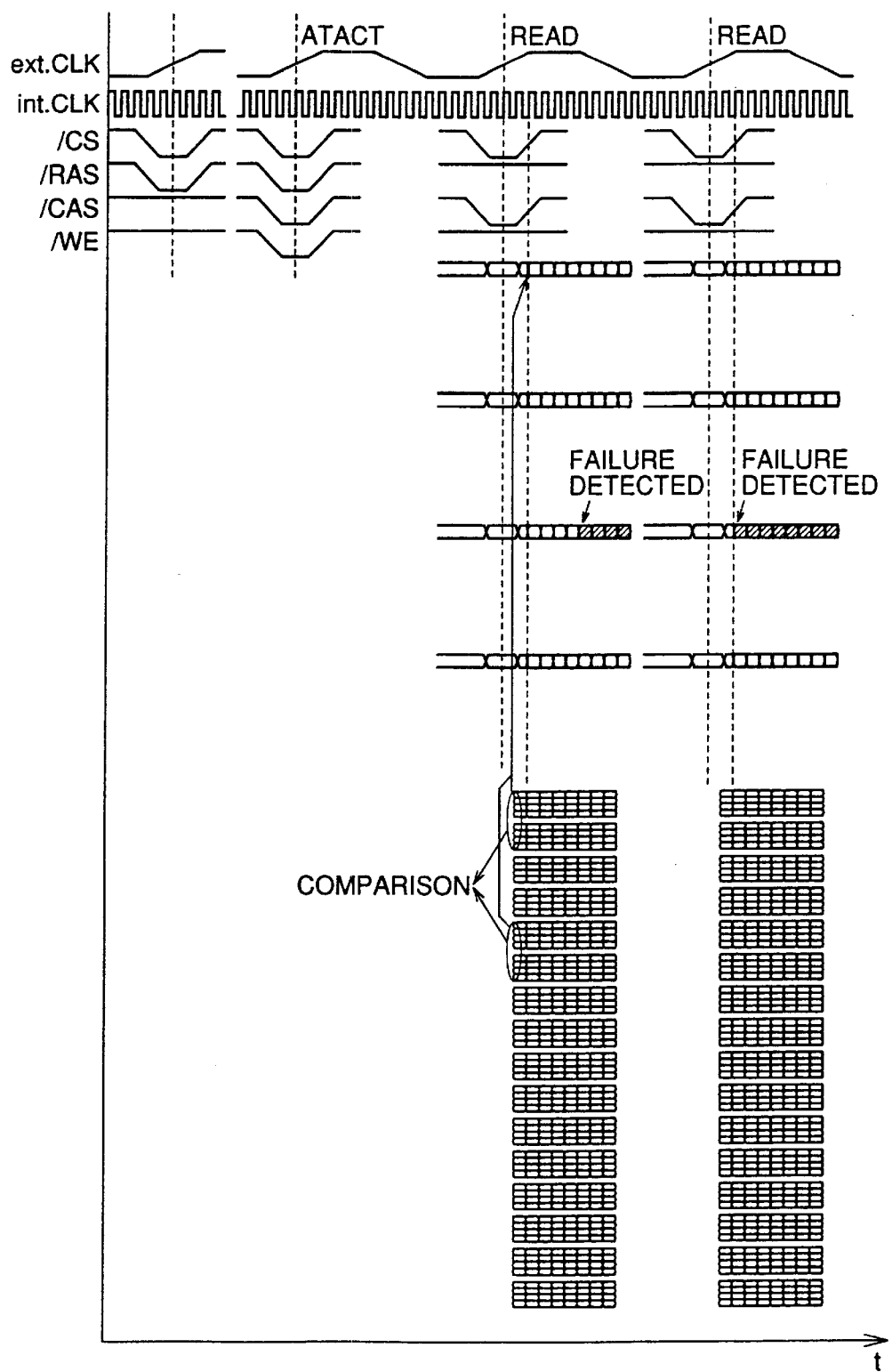
FIG. 50 is a timing chart showing a data read operation in the test mode of the embodiment 6.

FIG. 50 is a timing chart showing the read operation in the test operation mode of the SDRAM of the embodiment 6 of the invention.

The read operation of this embodiment differs from the read operation of the embodiment 5 shown in FIG. 47 in that when a failure in the read data and, in other words, mismatching with the expected value data is detected in a certain cycle, data representing the failure will be continuously output in the same cycle. Other points are similar to those in FIG. 47, and therefore will not be described below.

Figure 51:
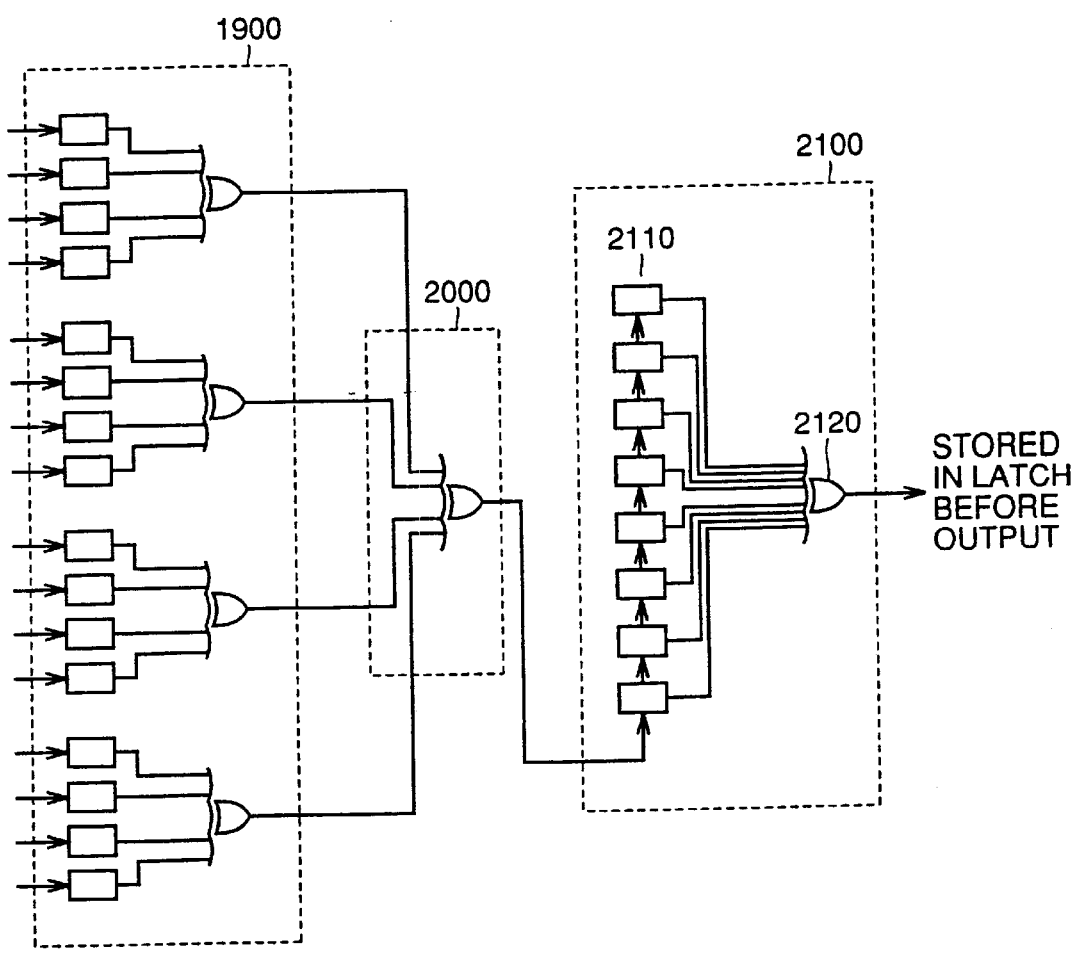
FIG. 51 is a schematic block diagram showing structures of the data scramble circuit 1900 and comparator circuits 2000 and 2100.

FIG. 51 is a schematic block diagram showing structures of data scramble circuit 1900 and comparator circuits 2000 and 2100 for performing the above comparing operation.

In addition to the structures of the embodiment 5 already described with reference to FIG. 48, comparator circuit 2100 is arranged for receiving the output of comparator circuit 2000 and converting the same to produce the data to be applied to the data I/O terminal.

Comparator circuit 2100 includes a shift register 2100 of a bit length, e.g., of 8 bits (i.e., bit length matching the burst length), which is reset at the start of the read cycle to change all the contents held therein to, e.g., "0", i.e., the data value representing the matching of the read data. Shift register 2110 receives the output of comparator circuit 2000, and successively shifts in accordance with internal clock signal int.CLK. Comparator circuit 2100 also includes an exclusive-OR gate 2120 which performs exclusive-OR operation between received data issued in parallel from shift register 2110, and applies the result to the latch circuit for data output provided for the corresponding data I/O terminal.

According to the above structures of data scramble circuit 1900 and comparator circuits 2000 and 2100, when the result of data comparison of successively read data of 16 bits indicates a failure in a certain cycle, the data indicating the failure will be continuously issued to the corresponding data I/O terminal (e.g., DQ0) for a period after the indication of the failure within the same cycle.

Figure 52:
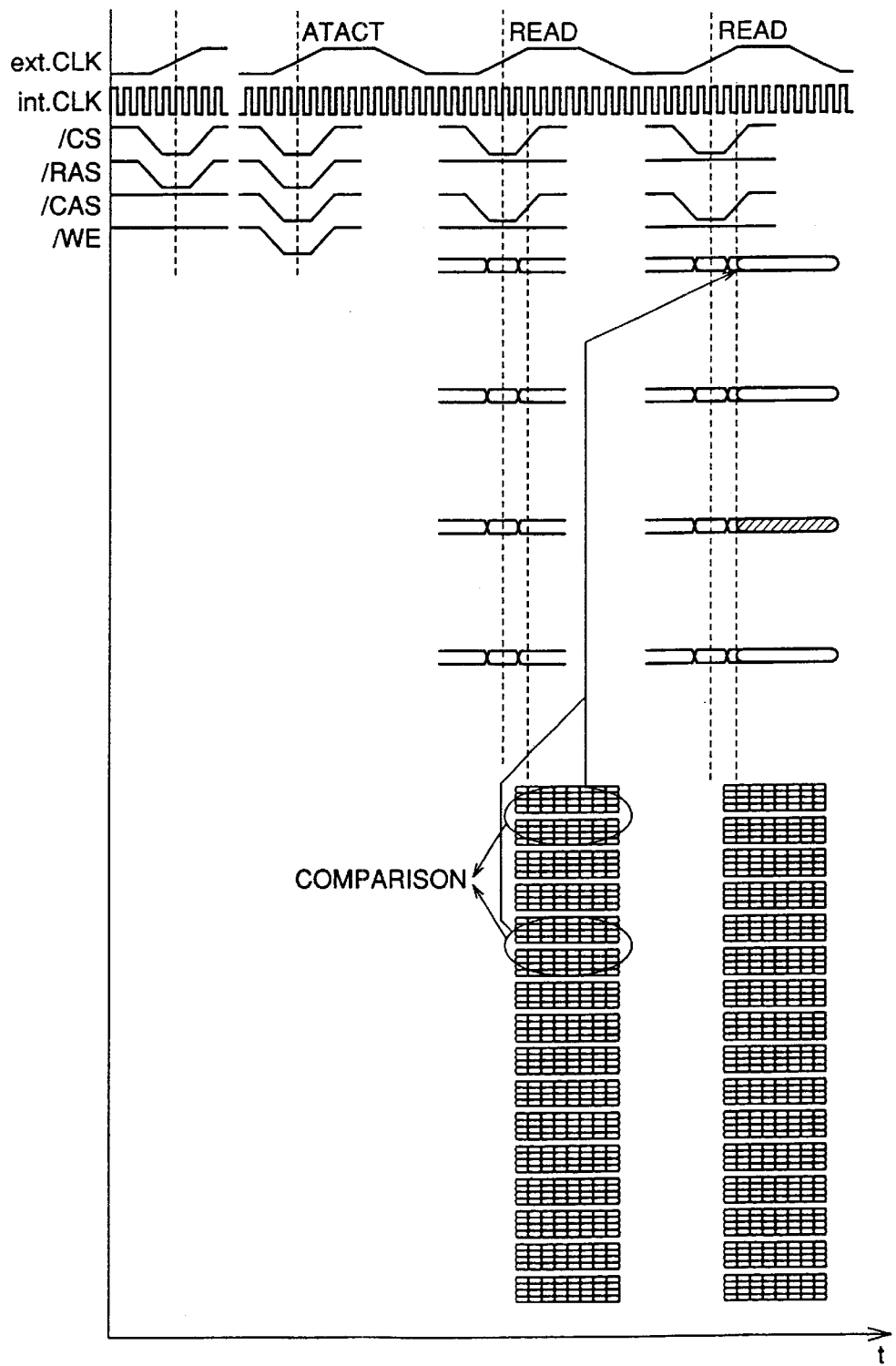
FIG. 52 is a timing chart showing another example of the read operation in the test operation mode of the SDRAM of the embodiment 6 of the invention.

FIG. 52 is a timing chart showing another example of the read operation in the test operation mode of the SDRAM of the embodiment 6 of the invention.

The read operation in FIG. 52 differs from that shown in FIG. 49 in that the shift register 2110 sends the data to exclusive-OR gate 2120 when shift register 2110 receives all the data to be read in the same cycle. Other points are similar to those in FIG. 49, and therefore will not be described below.

The above structure allows easy detection of a failure by the tester even if the tester applies external clock signal ext.CLK of a low frequency to the SDRAM, and therefore the SDRAM can be tested by a more inexpensive tester.

Figure 53A:
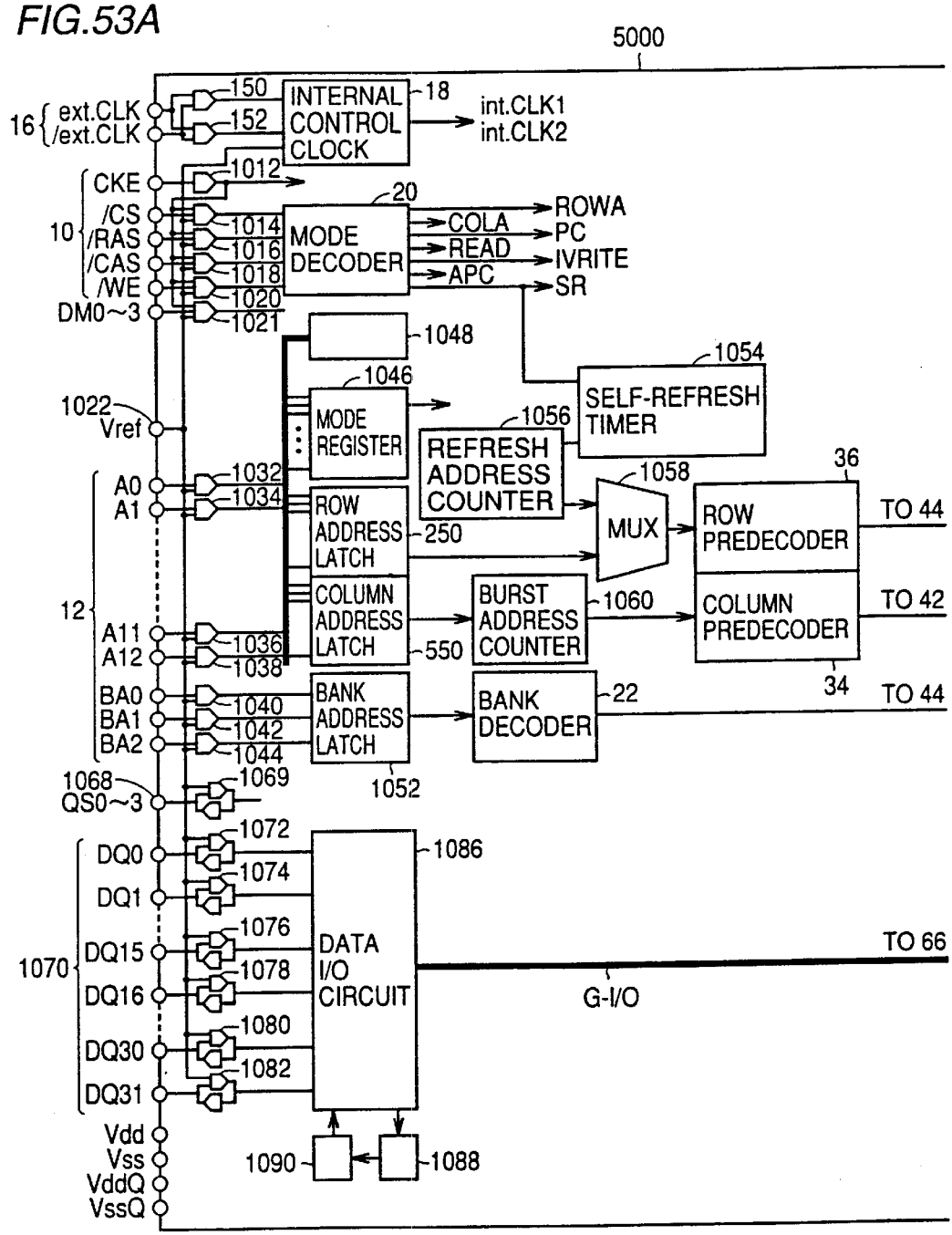
FIGS. 53A and 53B are a schematic block diagram showing an operation of an SDRAM 5000 for designating the test operation mode in accordance with a combination of externally applied address signals.
Figure 53B:
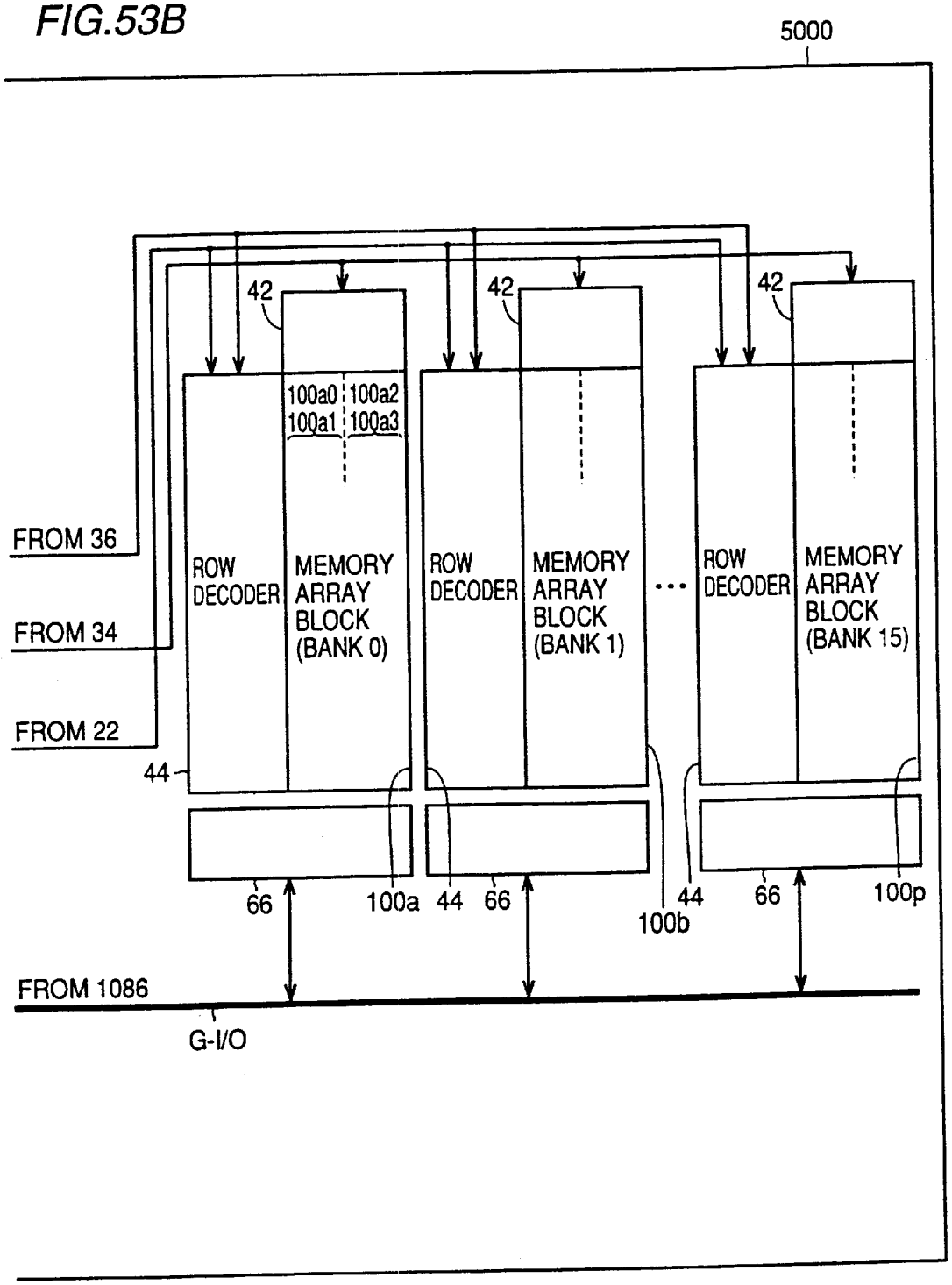

FIGS. 53A and 53B are a schematic block diagram showing a structure of an SDRAM 5000 for achieving the test mode operation described above, and more specifically for designating the test operation mode in accordance with a combination of externally applied address signals.

The structure in FIGS. 53A and 53B includes a mode register 1048 for designating the test mode in addition to the structures shown in FIGS. 1A and 1B.

Figure 54:
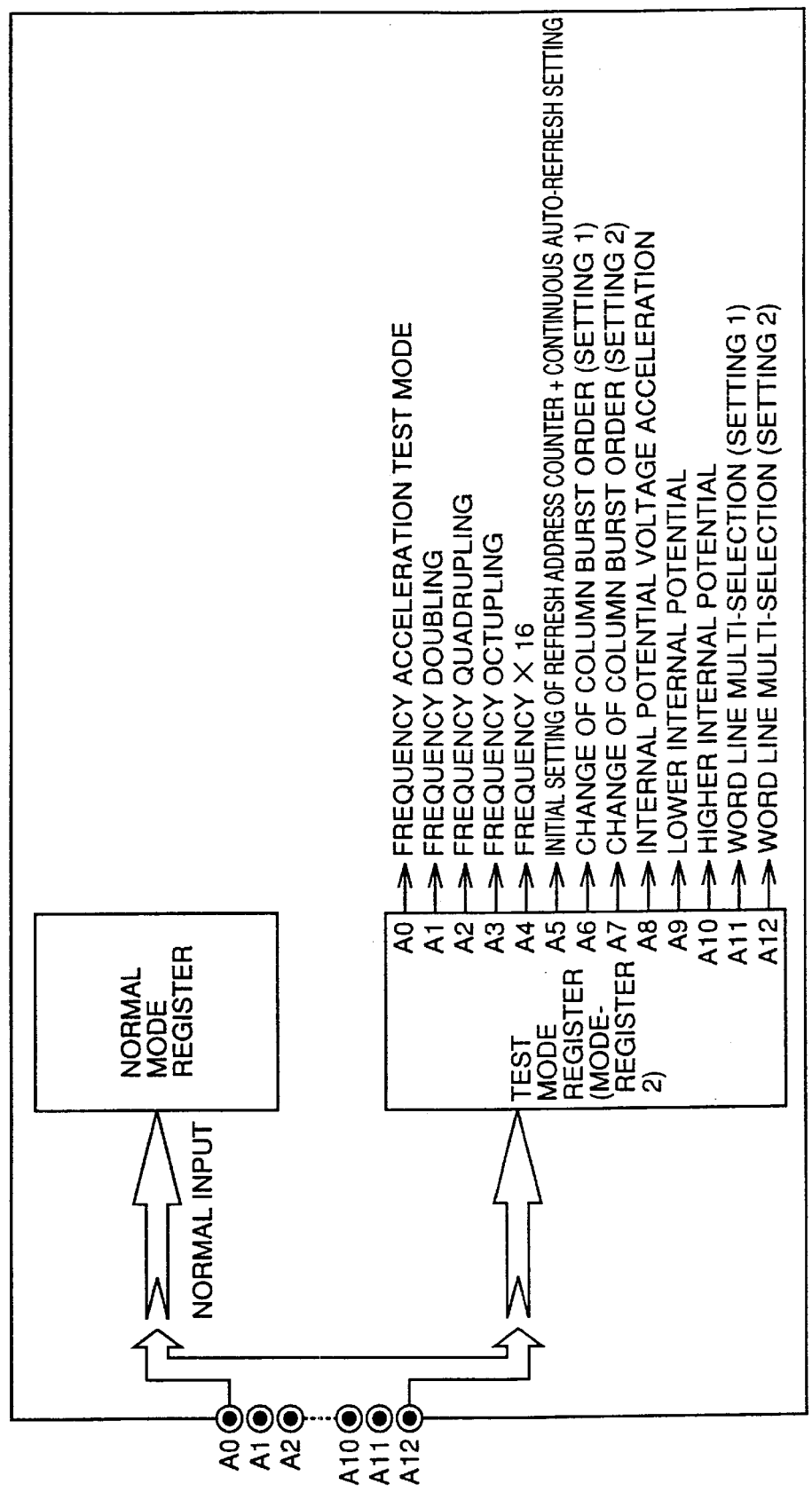
FIG. 54 shows a state of designating mode data in a mode register 1048 for test mode designation.

FIG. 54 shows a state in which mode register 1048 for test mode designation designates the mode data.

When a potential (super VIH) which is higher by a constant potential than external power supply potential Vdd is applied, e.g., to A0 pin in address signal input terminal 12, the mode data is set in the mode register for test in accordance with a combination of the address signals. In accordance with this mode data, internal control clock producing circuit 18 and others are controlled.

The mode data, for example, representing the setting of the frequency acceleration test mode is set in accordance with address signal A0, mode data representing the setting of doubling the frequency is set in accordance with address signal A1, mode data representing the setting of quadrupling the frequency is set in accordance with address signal A2, mode data representing the setting of octupling the frequency is set in accordance with address signal A3, and mode data representing the setting of increasing the frequency by 16 times is set in accordance with address signal A4. Further, settings such as initial setting of the refresh address counter, setting of continuous automatic refresh, order of column burst, setting of internal voltage value and setting of multi-selection of word lines are performed, e.g., in accordance with address signals A5–A12.

[Embodiment 7]

Figure 55A:
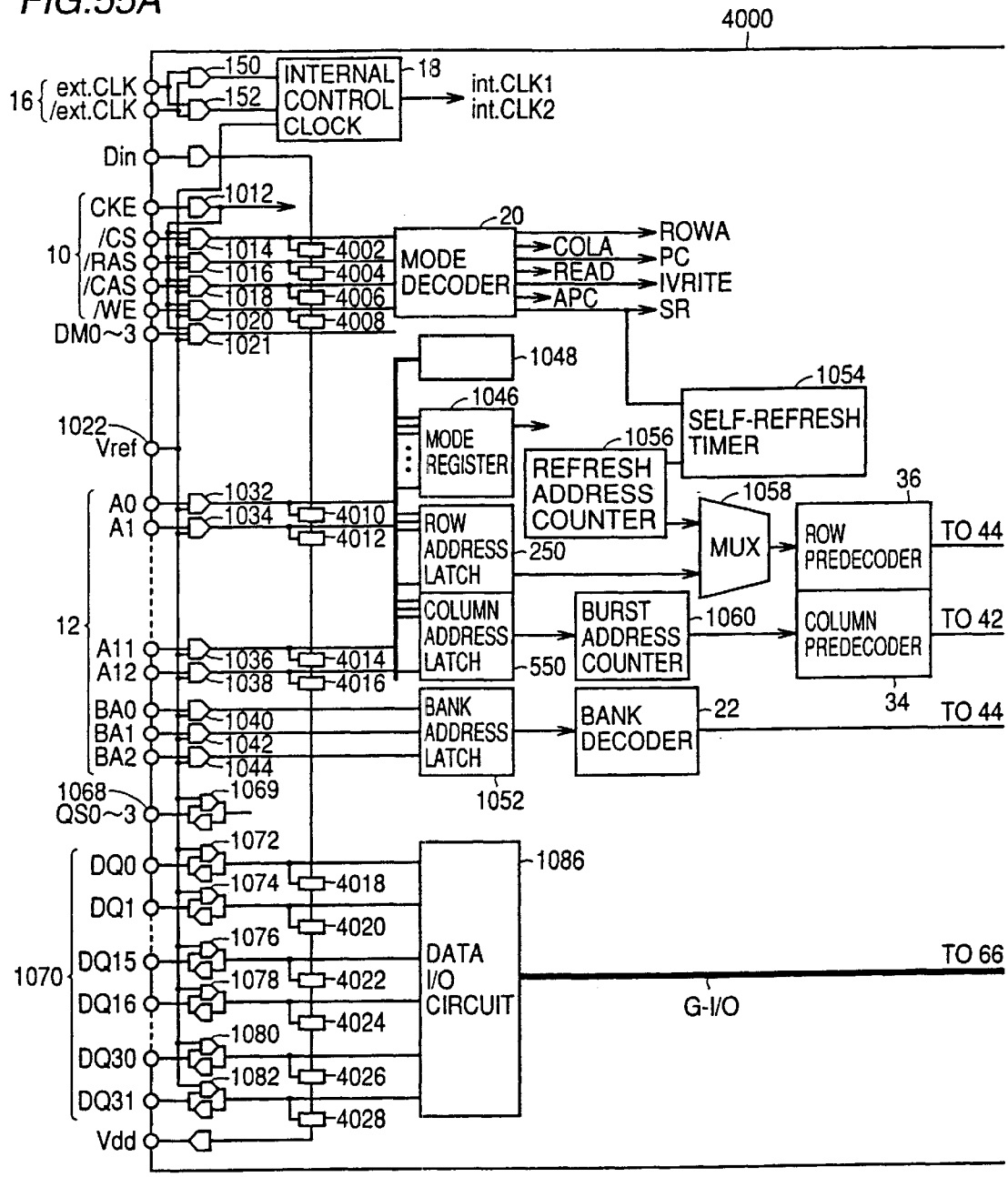
FIGS. 55A and 55B are a schematic block diagram showing a structure of an SDRAM 4000 of an embodiment 7 of the invention.
Figure 55B:
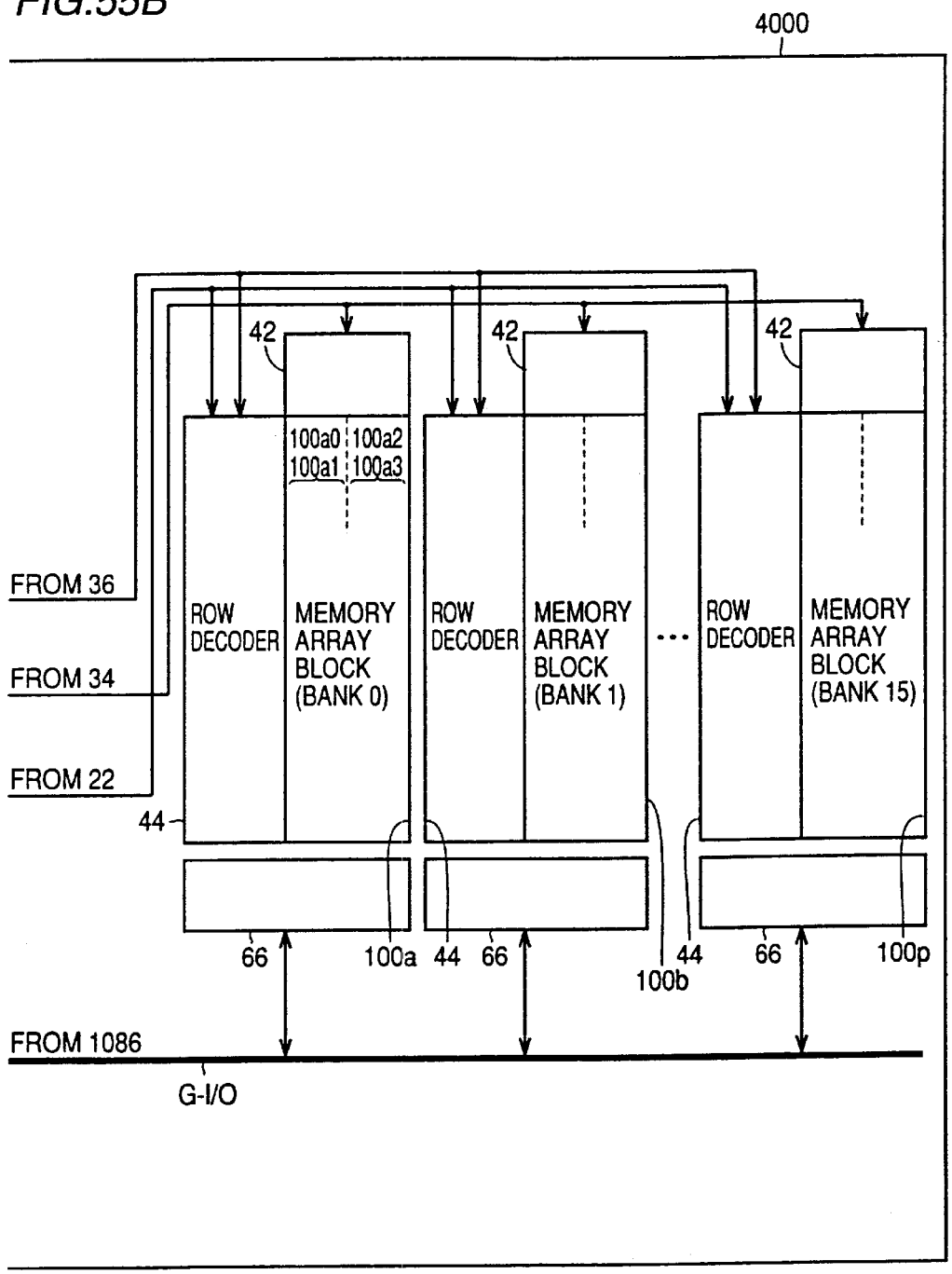

FIGS. 55A and 55B are a schematic block diagram showing a structure of an SDRAM 4000 of an embodiment 7 of the invention.

This structure differs from the structure of the SDRAM of the embodiment 6 in that shift registers 4002–4028 are arranged between I/O buffers 1014–1082 of the I/O terminals, on which data must be set in the test operation mode, and the internal latch circuits and others, respectively. The shift registers hold the data which is applied from data I/O terminal Din and is successively shifted.

The above structure allows further reduction in number of the I/O pins required in the test operation mode.

FIG. 56 shows a relationship in the above case wherein the number of I/O pins required in the test mode is reduced.

Owing to the above structure, the externally applied data can be sent from a data I/O terminal Din, and the data of the test result can be taken out from a data output terminal Dout by shifting the data.

[Embodiment 8]

Figure 57:
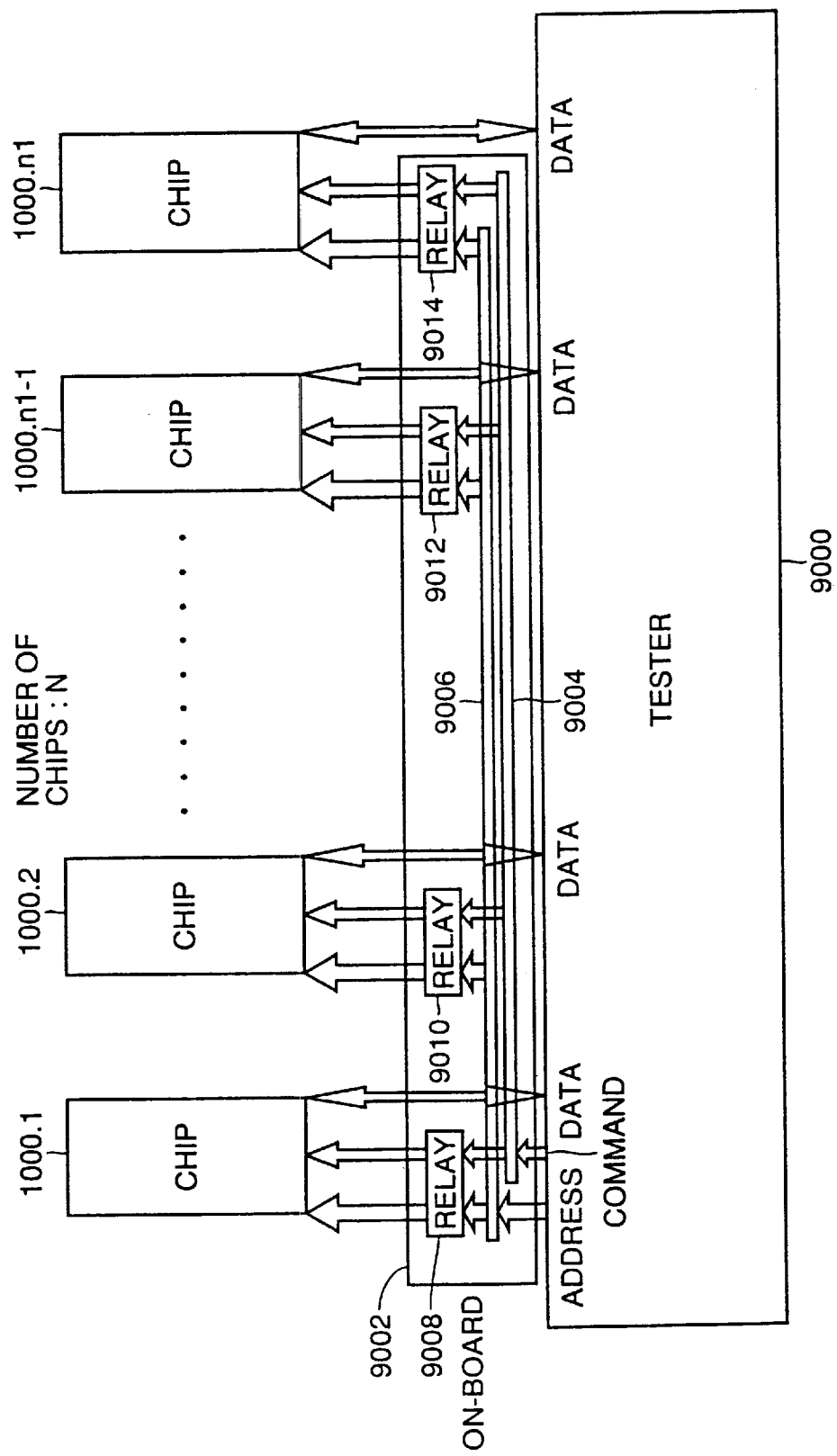
FIG. 57 is a schematic block diagram showing structures of a tester device 9000 and a test board 9002 of an embodiment 8 of the invention.

FIG. 57 is a schematic block diagram showing structures of tester device 9000 and a test board 9002 of an embodiment 8 of the invention.

The purpose is to reduce the total number of pins required for controlling each chip, and allow increase in number of the chips which can be simultaneously measured.

In the structure of this embodiment, signals issued from memory tester 9000 are commonly used by respective chips 1000.1–1000.n1 through buses 9004 and 9006 on test board 9002.

In a practical structure, however, relay circuits 9008–9014, each of which can selectively isolate the corresponding chip side from buses 9004 and 9006, in view of a situation that the chip side(s) may be empty.

The setting of relay circuit 9010 can be performed from the side of tester device 9000 by detecting initially in the test operation whether the accessible chip is present or.not.

The above test can be performed on the chips after assembly as well as the chips in a wafer. In particular, when the test is performed on the chips in the wafer, a shift in position may occur between probes of a probe card and the chips, e.g., on an edge of the wafer. Therefore, relay circuits 9008–9014 are required for isolating buses 9004 and 9006 from the chip sides.

[Embodiment 9]

Figure 58A:
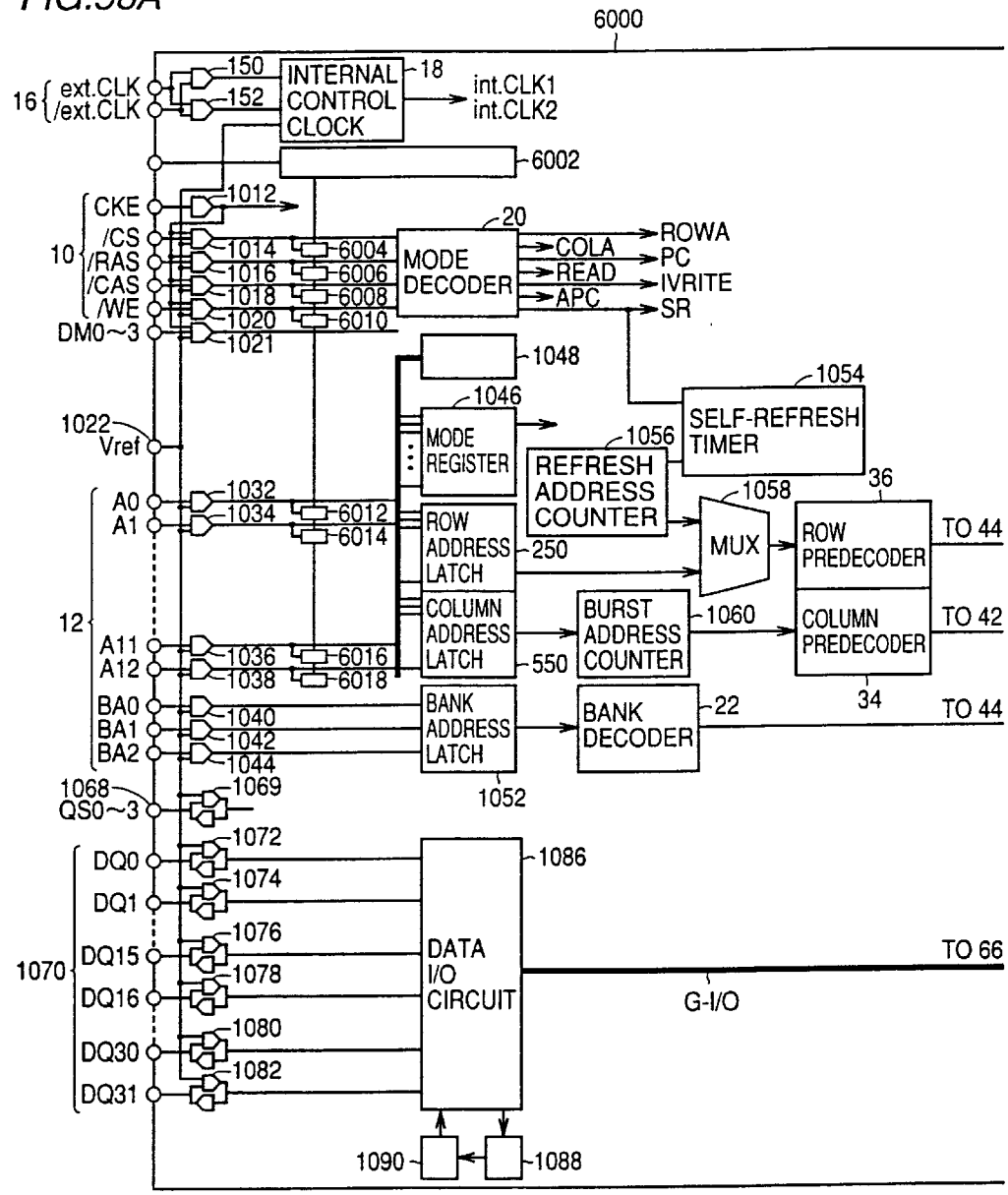
FIGS. 58A and 58B are a schematic block diagram showing a structure of an SDRAM 6000 of an embodiment 9 of the invention.
Figure 58B:
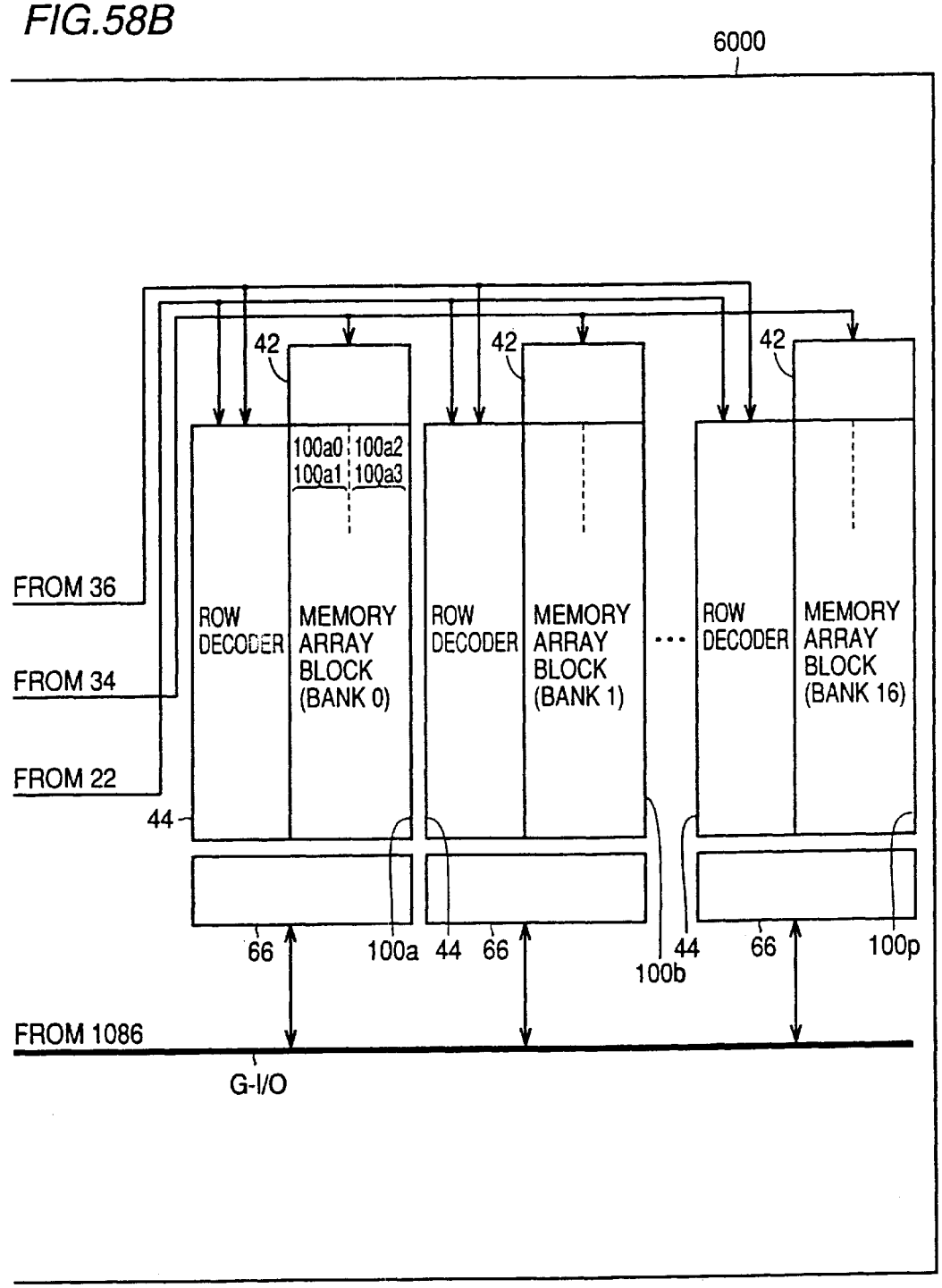

FIGS. 58A and 58B are a schematic block diagram showing a structure of an SDRAM 6000 of an embodiment 9 of the invention, The structure of the SDRAM in FIGS. 58A and 58B differs from the structure of the embodiment 6 in that a BIST (Built-in Test circuit) 6002 is employed for automatically producing the test data pattern and making a comparison between the expected value and the read data, and shift registers 6004–6018 are arranged between I/O buffers 1014–1038 of the respective I/O terminals, which require setting of the data in the test operation mode, and the internally arranged latch circuits and others, respectively. The respective shift registers hold the data which is applied from BIST circuit 6002 and is successively shifted.

The above structure can further reduce the number of I/O pins required in the test operation mode.

FIG. 59 further shows a relationship in the case where number of the I/O pins required in the test mode is reduced as described above.

Owing to the above structure, the externally applied data can be sent from data I/O terminal Din, and the data of test result is taken out from predetermined pins among the data I/O terminals.

[Embodiment 10]

Figure 60:
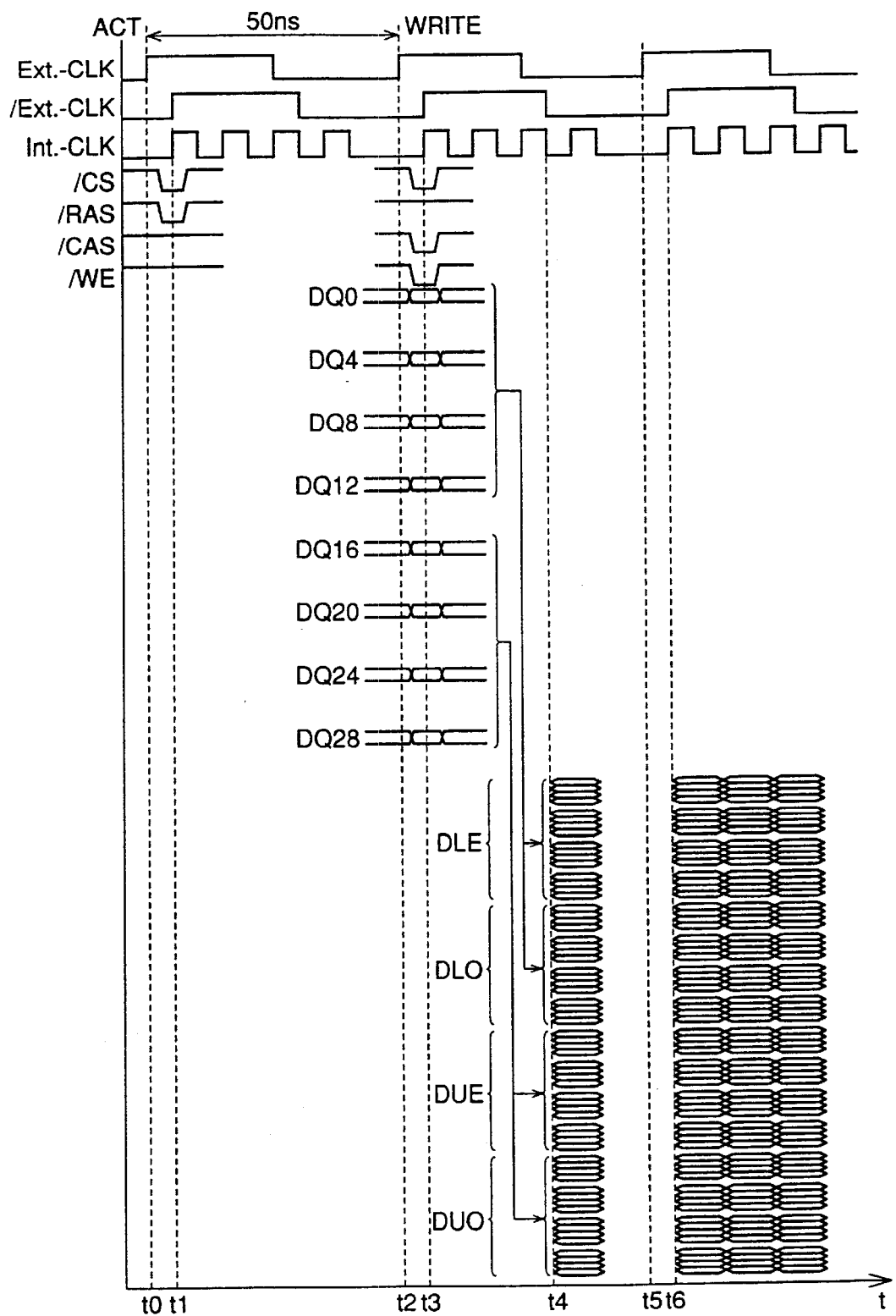
FIG. 60 is a timing chart showing a write operation in a test of a synchronous semiconductor memory device of an embodiment 10 of the invention.
Figure 61:
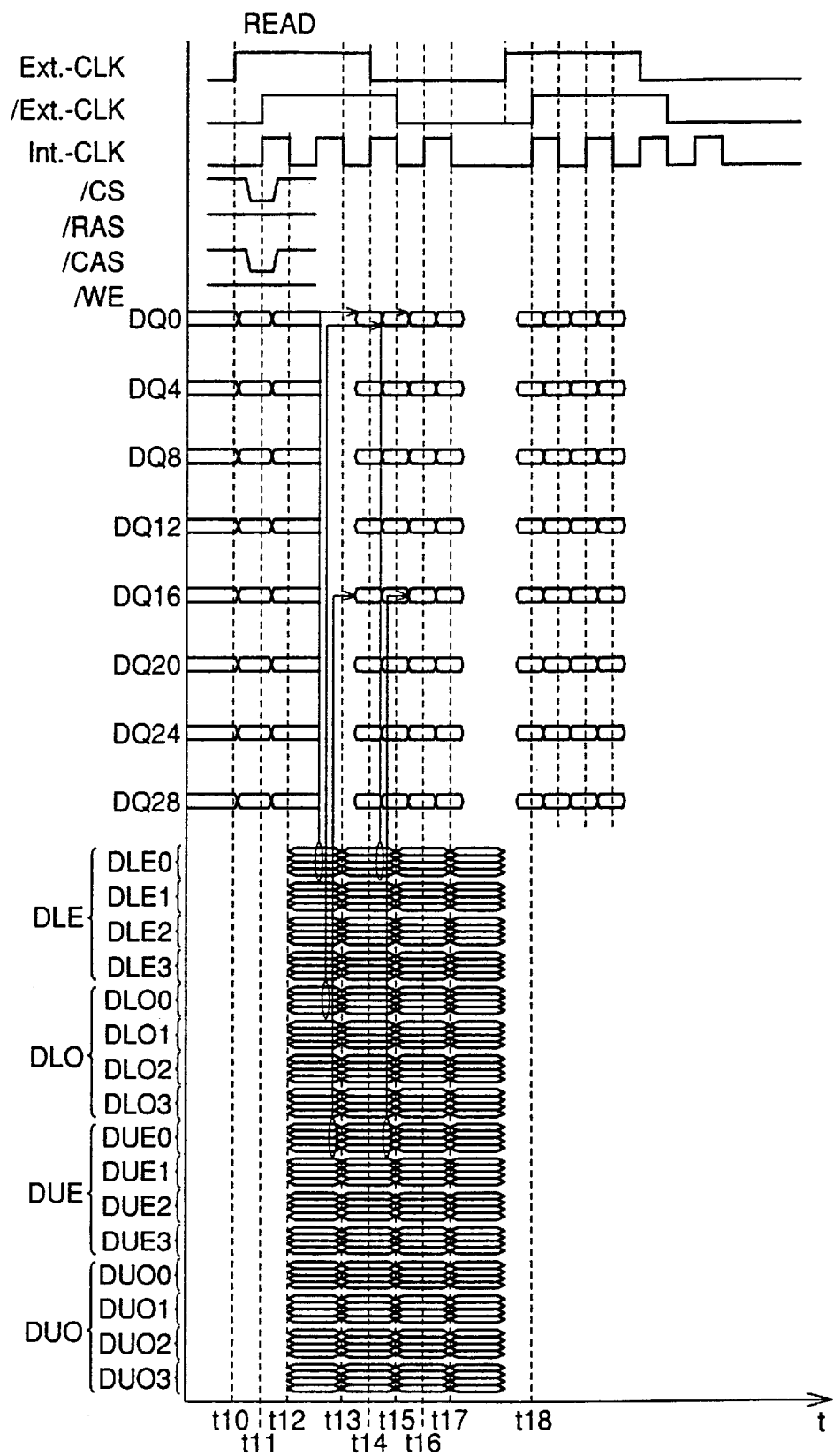
FIG. 61 is a timing chart showing a read operation in the test of the synchronous semiconductor memory device of the embodiment 10 of the invention.

FIGS. 60 and 61 are timing charts showing operations during a test of a synchronous semiconductor memory device of an embodiment 10 of the invention.

The synchronous semiconductor memory device of the embodiment 10 has a basic structure which is similar to that of SDRAM 1000 of the embodiment 1, and distinctive features of the test operation are as follows.

First, complementary. external clock signals Ext.CLK and /Ext.CLK are applied to the synchronous semiconductor memory device (e.g., SDRAM) with a predetermined phase difference.

Secondly, produced internal clock signal int.CLK has an active period (i.e., a period of "H" level) equal to a time length corresponding to the above phase difference. This internal clock signal int.CLK starts to be produced in response to the rising edge of external clock signal /Ext.CLK, and is activated a predetermined number of times (e.g., 4 times in FIGS. 60 and 61) during a period of one cycle of external clock signal /Ext.CLK.

The period of external clock signal Ext.CLK is, e.g., 50 ns corresponding to the frequency of 200 MHz, and varies with a frequency smaller than the operable frequency of the internal circuit of the synchronous semiconductor memory device. Further, it is assumed that the rising edge of external clock signal /Ext.CLK is delayed by a time τ, e.g., of 10 ns from the rising edge of external clock signal Ext.CLK.

In the synchronous semiconductor memory device of the embodiment 10, as will be described later, internal clock signal int.CLK having a larger frequency than external clock signal ext.CLK is produced based on external clock signal Ext.CLK, and the circuit operation is performed based on internal clock signal int.CLK.

According to the example shown in FIG. 60, the internal write data for test operation is produced based on the data applied to eight data I/O pins, i.e., data I/O terminals DQ0, DQ4, DQ8, DQ12, DQ16, DQ20, DQ24 and DQ28 among data I/O terminals DQ0–DQ31 similarly to SDRAM 1000 of the embodiment 1.

Accordingly, external clock signal /Ext.CLK rises at time t1 after time τ from the rising edge of external clock signal ext.CLK at time t0, and production of internal clock signal int.CLK starts in response to the rising at time t1. The ACT command is applied to the synchronous semiconductor memory device in response to the rising of external clock signal /Ext.CLK at time t1, i.e., the rising of internal clock signal int.CLK.

After internal clock signal int.CLK is activated for four cycles during one cycle of external clock signal /Ext.CLK, internal clock signal int.CLK will stay inactive (at "L" level) until next activation of external clock signal /Ext.CLK.

At time t3 and, in other words, after one period of external clock signal /Ext.CLK from time t0, the WRITE command is applied to the synchronous semiconductor memory device. At time t3, the write data is applied to each of eight data I/O terminals DQ0–DQ28 described above.

Based on the data of 4 bits applied to data I/O terminals DQ0, DQ4, DQ8 and DQ12, data of 32×4 bits, which is to be written as data DLE and DLO into the corresponding bank, is produced. Based on the data of 4 bits applied to data I/O terminals DQ16, DQ20, DQ24 and DQ28, data of 32×4 bits, which is to be written as data DUE and DUO into the corresponding bank, is produced.

From time t3 when external clock signal /Ext.CLK is activated again the internal circuits start the operation in accordance with the produced internal clock signal int.CLK, and data of 4×4 bits and data of 4×4 bits are produced as data DLE and DLO at time t4, respectively. These data are written into the even and odd address regions in the corresponding bank, respectively. Likewise, data of 4×4 bits and data of 4×4 bits are produced as data DUE and DUO at time t4, and are written into the even and odd address regions in the corresponding bank, respectively.

In synchronization with internal clock signal int.CLK which is produced in response to the rising of external clock signal /Ext.CLK at time t6, the data write operation for writing 16×4 bits at a time will be performed for three periods of internal clock signal int.CLK.

Thus, the data which is externally applied at time t3 is formed of 8 bits, but the data of 64 bits to be written simultaneously is produced based on the externally applied data. Thereafter, data of 64 bits is repetitively produced in accordance with the period of the internal clock signal similarly to SDRAM 1000 of the embodiment 1, and these data are successively written into the even and odd address regions in the corresponding bank.

In FIG. 60, external clock signal ext.CLK changes much more slowly than the operable frequency of the synchronous semiconductor memory device in contrast to the normal operation mode shown in FIG. 5. Therefore, the write data is shown to be applied to the device simultaneously with the write command.

FIG. 61 is a timing chart showing the operation of synchronous semiconductor memory device of the embodiment 10 in the test operation mode.

After the ACT command is applied to the synchronous semiconductor memory device, external clock signal /Ext.CLK is activated at time t11 after time τ from the rising of external clock signal Ext.CLK at time t10, and thereby the READ command instructing the read operation is applied to the synchronous semiconductor memory device. At the same time, data similar to that applied in the data write operation in FIG. 60 is applied to respective eight data I/O terminals DQ0–DQ28 which were used in the data write operation.

Similarly to SDRAM 1000 of the embodiment 1, the device issues data representing the result of comparison between the expected value data, which is produced based on the data applied at time t11, and the data read from each bank.

More specifically, 64 bits of data are read out in parallel from the even address region and the odd address region in each bank after the READ command is applied at time t11. In the data thus read and, in particular, in the data corresponding to, e.g., data DLE, the data of 4 bits, which is read from the memory cells activated simultaneously by one column select line, (e.g., data DLE0 of 4 bits to be applied to data I/O terminals DQ0–DQ3 in the normal read mode) is compared with the expected value to be read out based on the data applied to data I/O terminals DQ0, DQ4, DQ8 and DQ12 at time t11. Data of 1 bit representing the result of comparison between the expected value and the 4-bit data is issued to data I/O terminal DQ0 at time t14.

Likewise, at the falling edge of internal clock signal int.CLK at time t15, data of 4 bits among data DLO, which is to be issued to data I/O terminals DQ0–DQ3 in the normal operation mode, is compared with the expected value which is produced in the synchronous semiconductor memory device based on the data applied to data I/O terminals DQ0–DQ12 at time t11. The data of 1 bit representing the result of this comparison is applied to data I/O terminal DQ0.

At time t16, data I/O terminal DQ0 is further supplied with data representing the result of another comparison made between data of 4 bits, which is read in accordance with the next period of internal clock signal int.CLK, among data DLEO and the expected value which is produced based on the data applied to data I/O terminals DQ0–DQ12 at time t11.

Thereafter, the result of comparison made between the value of 4 bits data DLE0, which correspond to the data to be applied to data I/O terminals DQ0–DQ3 in the normal operation, among data DLE and the above expected value as well as the result of comparison made between the value of 4 bits of read data DLO0, which is to be applied to data I/O terminals DQ0–DQ3 in the normal operation mode, among data DLO and the above expected value are issued in response to the rising and falling edges of internal clock signal int.CLK from data I/O terminal DQ0, respectively.

The above output of comparison results is continuously performed at the rising and failing edges of internal clock signal int.CLK which is produced in response to the rising edge of external clock signal /Ext.CLK at time t18.

The above operation is performed similarly in connection with other data I/O terminals DQ4, DQ8 and DQ12.

In connection with data I/O terminal DQ16, data representing the result of comparison made between read data of 4 bits, which is to be issued correspondingly to data I/O terminals DQ16–DQ19 in the normal operation mode and the above expected value is successively issued from data I/O terminal DQ16.

Similar operations are likewise performed with respect to other data I/O terminals DQ20, DQ24 and DQ28.

Owing to the above operations, internal clock signal int.CLK varies faster than externally applied external clock signal Ext.CLK in the test operation mode even if externally applied external clock signal ext.CLK has a large cycle. Since the internal circuits of the synchronous semiconductor memory device operate in synchronization with internal clock signal int.CLK, a load on the tester device can be reduced.

Further, only the data I/O terminals of 8 pins among the data I/O terminals of 32 pins are used in the test operation mode. Therefore, it is possible to reduce the total number of the input pins and the data I/O pins to be controlled per one chip of the synchronous semiconductor memory device. Accordingly, it is possible to increase the number of chips which can be tested simultaneously in parallel by the tester.

Figure 62:
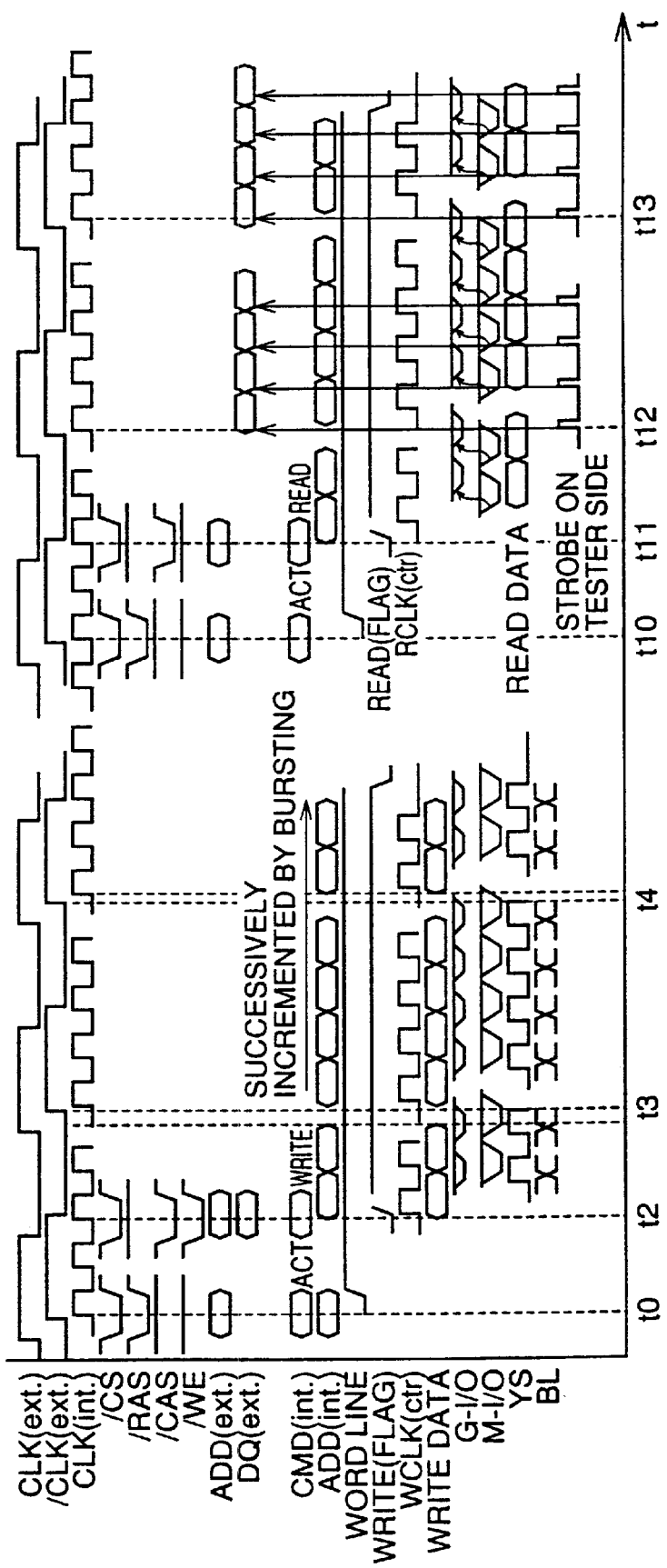
FIG. 62 is a timing chart showing the operation in the test operation mode of the synchronous semiconductor memory device of the embodiment 10.

FIG. 62 is a timing chart showing another operation in the test operation mode of the synchronous semiconductor memory device of the embodiment 10. This operation is basically similar to that already described with reference to FIGS. 60 and 61, but such a structure is employed that the ACT command is applied at the rising edge of external clock signal /Ext.CLK, and the WRITE or READ command is applied at the falling edge of external clock signal /Ext.CLK.

In response to the rising edge of external clock signal /Ext.CLK at time t0, production of internal clock signal int.CLK starts, and the ACT command instructing the word line select operation is applied for activating the synchronous semiconductor memory device.

The ACT command is decoded within the synchronous semiconductor memory device. Based on the decoded command, activation of the word line and data amplifying operation by the sense amplifier are performed and are completed within a period of one cycle of external clock signal /Ext.CLK.

Then, at time t2, the WRITE command is applied to the synchronous semiconductor memory device in response to the rising edge of internal clock signal int.CLK and the data pattern is produced based on the data simultaneously applied to eight data I/O terminals DQ0–DQ28. More specifically, in connection with 16 DQ terminals among data I/O terminals (DQ terminals) of 32 bits, the data which corresponding to these 16 DQ terminals and changes over time is produced based on the data applied to 4 DQ terminals. Also, similar data is likewise produced in connection with the other 16 DQ terminals.

The write data thus produced is transmitted to the memory cell array through global I/O line pair G-I/O and main I/O line pair M-I/O.

In the memory cell array, column select lines YS are successively activated in accordance with the internal addresses, which are produced by the burst counter at the edges of activation of internal clock signal int.CLK between times t2 and t3, the edge of activation of internal clock signal int.CLK produced in response to the rising edge of external clock signal /Ext.CLK at time t3, and the edge of activation of internal clock signal int.CLK produced in response to the rising edge of external clock signal /Ext.CLK at time t4, respectively. Thereby, the write data is transmitted to the bit line pairs connected to the memory cells corresponding to the internal addresses.

Data writing is performed in synchronization with write clock WCLK produced based on internal clock signal int.CLK.

Since the operation is the double data rate operation, four write data produced corresponding to, e.g., DQ terminals DQ0–DQ3 are written into the memory cells which are simultaneously selected by one column select line YS.

As described above, input of the commands is performed in synchronization with internal clock signal int.CLK. Therefore, a margin test for the operation of taking in the commands can also be performed.

In the read operation, the ACT command is applied at time t10, and the READ command is applied at time t11. Thereby, the data reading is performed in synchronization with read clock RCLK which is produced based on internal clock signal int.CLK.

On the tester side, the frequency of internal clock signal int.CLK is set in advance, and the strobe signal for the read data is activated at the intended time of data output which is determined based on the rising edge of external clock signal /Ext.CLK. Thus, a plurality of strobe signals are activated within the same period of external clock signal /Ext.CLK. The synchronous semiconductor memory device outputs the data in response to activation of the strobe signals. Such a structure may be employed that the data output is performed in synchronization with the edge of external clock signal /Ext.CLK.

As already described, each of the data production and the data writing is performed for four DQ terminals among 16 DQ terminals at a time. The reason for this is as follows.

In connection with 32 data which are output simultaneously, the memory cells which are simultaneously selected by one column select line YS are four in number, and the memory cell columns which are selected simultaneously by this column select line is handled as a unit for replacement with redundant columns. In the test from which replacement of memory cells is determined, it is desired to provide the comparison results each relating to the unit of replacement. Accordingly, the structure in FIG. 61 is adapted to issue the comparison results each relating to the four memory cells. Sixty-four data are simultaneously read from the memory cells, and sixteen data each relating to four among the sixty four data are issued within one period of internal clock signal int.CLK.

For reducing the number of DQ terminals used in the test operation mode below that in the example shown in FIG. 61, such a structure may be employed that the comparison result to be issued is held in a latch for increasing the number of issued data per one DQ terminal, and thereby increasing the number of cycles of data output.

As already described, the addressing for the data writing is produced based on the address which is input together with the command. In general, the burst length is already set in a initial stage immediately after the synchronous semiconductor memory device starts the operation. In this initial stage, therefore, the burst address is produced within the synchronous semiconductor memory device based on the initial input address without requiring any external processing. If the burst address is set in advance to, e.g., 4, the internal addresses for 4 cycles are produced in every cycle for executing the write operation.

Further, such a manner may be employed that several bits in the input address are decoded by a structure similar to that for producing the data pattern, whereby an arbitrary address pattern is produced within the synchronous semiconductor memory device. In this case, the data to be decoded is not restricted to data applied as the address signal, and may be data applied to command pins or data held in the mode registers.

FIG. 63 is a schematic block diagram showing a structure of internal clock producing circuit 7000 for producing internal clock signal int.CLK as described before with reference to FIGS. 60 to 63.

Figure 63:
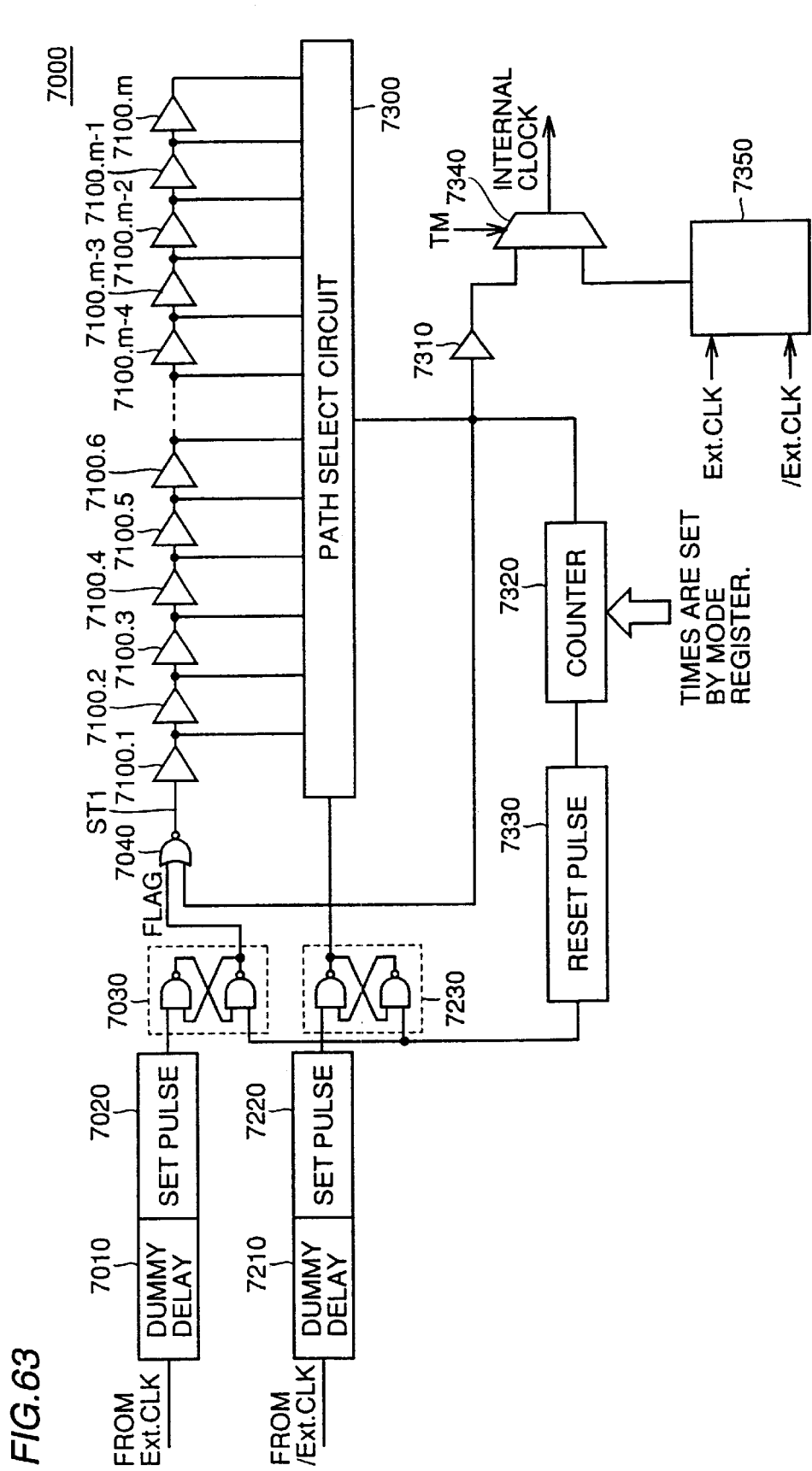
FIG. 63 is a schematic block diagram showing a structure of an internal clock producing circuit 7000.

Referring to FIG. 63, internal clock producing circuit 7000 includes a dummy delay circuit 7010 which receives external clock signal Ext.CLK and delays the same by a predetermined time, a pulse producing circuit 7020 which receives the output of dummy delay circuit 7010 and produces a set pulse, a flip-flop circuit 7030 which changes a signal FLAG from "H" level, i.e., a standby state to "L" level in response to activation of the output of pulse producing circuit 7020, an NOR circuit 7040 which receives signal FLAG on one of its input nodes and issues a signal ST1, buffer circuits 7100.0–7100.m of m (m: natural number) in number which are connected together in series for successively delaying and transmitting signal ST1 received thereby, a path select circuit 7300 which receives the outputs of buffer circuits 7100.1–7100.m and selectively applies one of these outputs to the other input node of NOR circuit 7040, a counter circuit 7320 which receives the output of path select circuit 7300 and counts N times (N: natural number), which are set by the mode register, the activation, a reset pulse predetermined circuit 7330 which produces a reset pulse in accordance with the result of counting by counter circuit 7320, a dummy delay circuit 7210 which receives and delays external clock signal /Ext.CLK by a predetermined time, a pulse producing circuit 7220 which receives the output of dummy delay circuit 7210 and produces a set pulse, and a flipflop circuit 7230 which changes signal TCAP from "L" level, i.e., standby state to "H" level in response to activation of the output of pulse producing circuit 7220, and changes signal TCAP from "H" level to "L" level in response to the output of reset pulse producing circuit 7330.

Internal clock producing circuit 7000 further includes a buffer circuit 7310 which receives the output of path select circuit 7300, and a multiplexer 7340 receiving the output of an internal synchronous signal producing circuit 7350, which produces the internal clock signal synchronized with external clock signals Ext.CLK and /Ext.CLK in the normal operation mode, and the output of buffer circuit 7310, and issuing one of the received outputs as internal clock signal int.CLK in accordance with test mode signal TM.

External clock signals Ext.CLK and /Ext.CLK are applied through clock signal input terminal 16 shown in FIG. 1A. Thus, clock signal input terminal 16 is supplied with mutually complementary clock signals in the normal operation mode, and is supplied with the complementary clock signals having the foregoing phase difference therebetween in the test operation mode.

Figure 64:
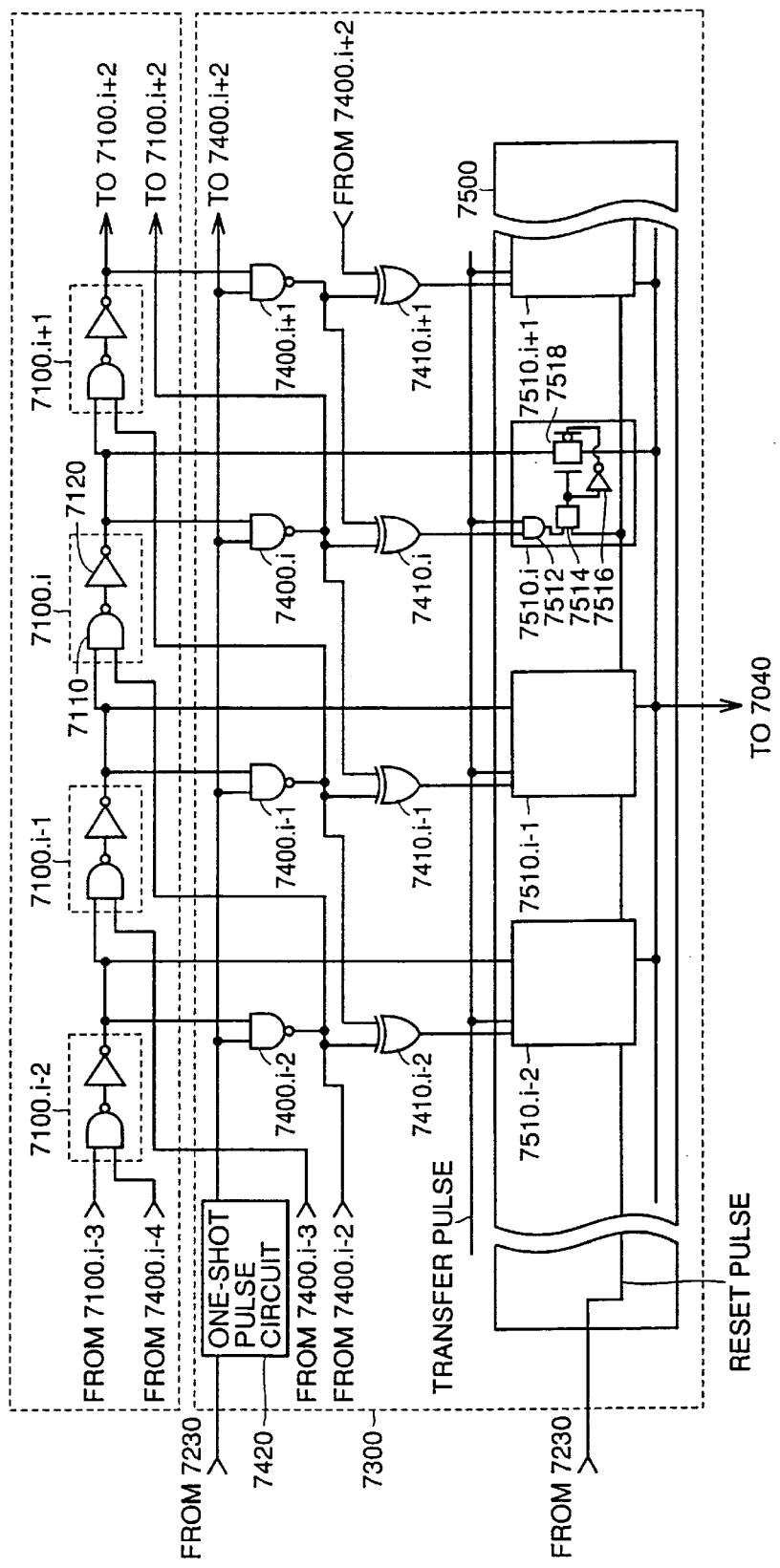
FIG. 64 is a schematic block diagram fragmentarily showing structures of buffer circuits 7100.1–7100.m and a path select circuit 7300.

FIG. 64 is a schematic block diagram fragmentarily showing the structures of buffer circuits 7100.1–7100.m and the structure of path select circuit 7300 shown in FIG. 63.

Buffer circuit 7100.i in the ith position includes an NAND circuit 7110 receiving on one of its input nodes the output of buffer circuit 7100.i–1 in the (i–1)th position, and an inverter 7120 which receives the output of NAND circuit 7110 and issues the inverted signal to buffer circuit 7100.i+1 in the (i+1)th position. Other buffer circuits 7100.j (j: natural numbers) have similar structures.

Path select circuit 7300 includes a one-shot pulse circuit 7420 which receives the output of flip-flop circuit 7230 and issues a one-shot pulse signal (active state: "H" level), and an NAND circuit 7400.i which is provided correspondingly to buffer circuit 7100.i and receives on one and the other of its inputs the outputs of buffer circuit 7100.i and one-shot pulse circuit 7420, respectively. NAND circuits 7400.j (j: natural number) having similar structures are provided from the other buffer circuits 7100.j, respectively.

Path select circuit 7300 further includes an exclusive-OR circuit 7410.i which is provided correspondingly to buffer circuit 7100.i and receives the outputs of NAND circuits 7410.i and 7410.i+1. Exclusive-OR circuits 7410.j (j: natural numbers) having similar structures are provided for other buffer circuits 7100.j, respectively.

Path select circuit 7300 further includes a switch circuit 7500 storing exclusive-OR circuit 7410.j among exclusive-OR circuits 7410.1–7410.m, which attains the active level ("H" level) in response to the activation ("H" level) of the output of flip-flop circuit 7230, and selectively applying the output, which is sent from buffer circuit 7100.j corresponding to the stored circuit 7410.j, to NOR circuit 7040 while the output of flip-flop circuit 7230 is active.

Select circuit 7500 includes path setting circuits 7510.j (j=1, 2, . . . m) corresponding to buffer circuits 7100.j, respectively. For example, path setting circuit 7510.i includes an AND circuit 7512 which receives the output of exclusive-OR circuit 7410.i on one of its input nodes, and also receives a transferred pulse (e.g., the output of one-shot pulse circuit 7420) on the other input node, a flip-flop circuit 7514 which is set in response to activation of the output of AND circuit 7512, and is reset in accordance with deactivation of the output of flip-flop circuit 7230, an inverter 7516 receiving the output of flip-flop circuit 7514, and a transmission gate 7518 which transmits the output of buffer circuit 7100.i to circuit 7040 in accordance with the outputs of flip-flop circuit 7514 and inverter 7516.

Figure 65:
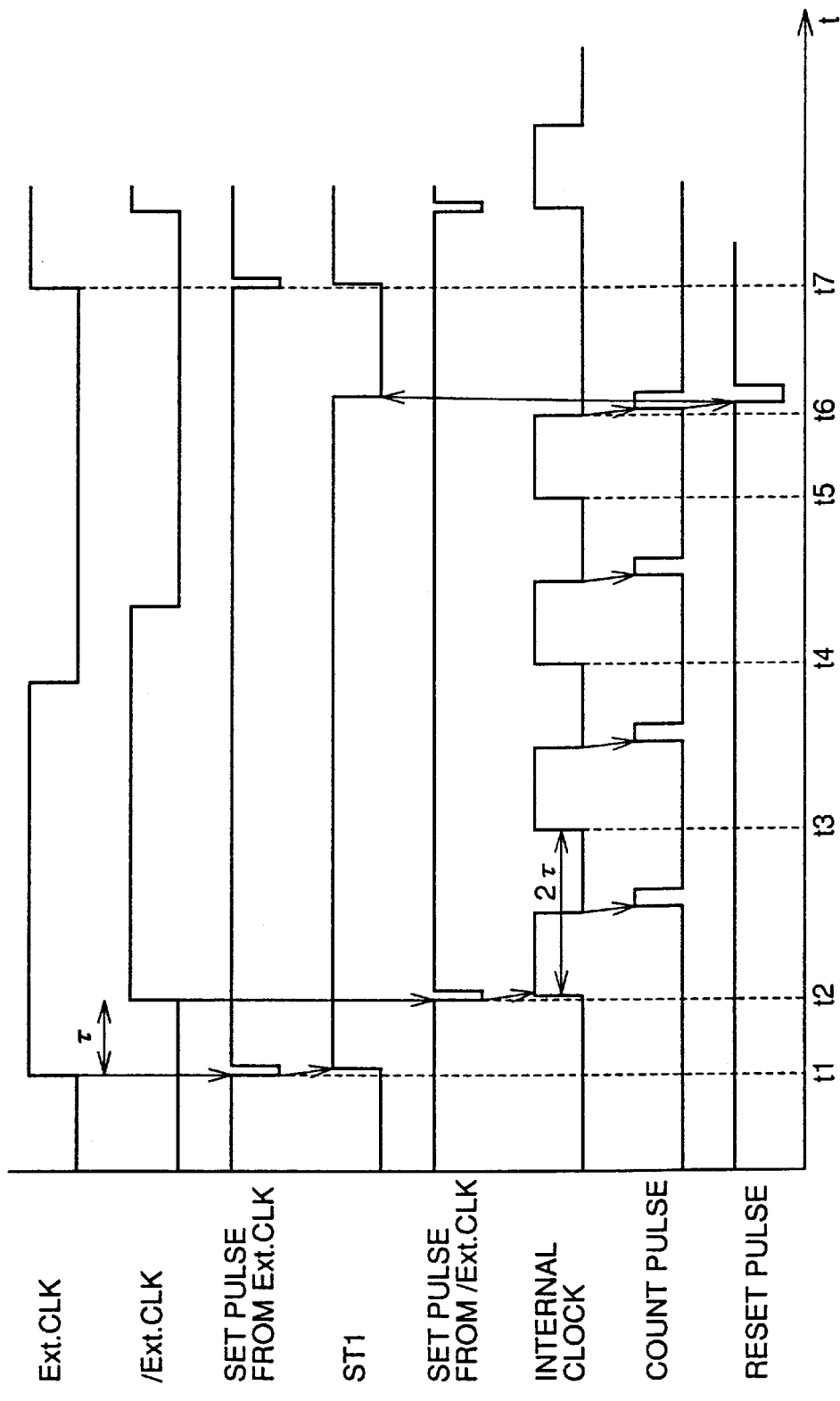
FIG. 65 is a timing chart showing an operation of the internal clock producing circuit 7000.

FIG. 65 is a timing chart showing an operation of internal clock producing circuit 7000 described with reference to FIGS. 63 and 64.

At time t1, pulse producing circuit 7020 issues the set pulse signal in response to activation of external clock signal Ext.CLK so that the output level of flip-flop circuit 7030 attains "L" level. Thereby, output signal ST1 of NOR circuit 7040 attains "H" level.

The change in output level of NOR circuit 7040 propagates through buffer circuits 7100.1–7100.m.

At time t2 after time τ from time t1, external clock signal /Ext.CLK attains "H" level. In response to this, pulse producing circuit 7220 issues the set pulse signal, and the output of flip-flop circuit 7230 attains "H" level. It is assumed that, at the time of the above operation, the change in output level of NOR circuit 7040, which is being propagated through buffer circuits 7100.1–7100.m, is already propagated to the output node of buffer circuit 7100.i−1. Thus, it is assumed that the output levels of buffer circuit 7100.1–7100.i−1 are at "H" level, and the output levels of buffer circuits 7100.i–7100.m are at "L" level.

Accordingly, when the output of flip-flop circuit 7230 attains "H" level, the outputs of NAND circuits 7400.1–7400.i−1 attain "L" level, and the outputs of NAND circuits 7400.i–7400.m attain "H" level. Thus, exclusive-OR circuit 7410.i−1 among exclusive-OR circuits 7410.1–7410.m issues the output at "H" level. In response to this, select circuit 7500 applies the output of buffer circuit 7100.i−1 to the input node of NOR circuit 7040 while the output of flip-flop circuit 7230 is active. Thus, NOR circuit 7040 and buffer circuits 7100.1–7100.i−1 form a ring oscillator.

Therefore, output of internal clock signal int.CLK starts at time t2 with a cycle of 2τ, and internal clock signal int.CLK is supplied to the internal circuits-through buffer circuit 7310 and multiplexer 7340.

Counter circuit 7320 counts, e.g., 4 times, which are specified by the mode register, the activation of the output of path select circuit 7300. When this counting is finished in accordance with deactivation of internal clock signal int.CLK at time t6, reset pulse producing circuit 7330 issues a reset pulse to reset flip-flop circuits 7030 and 7230 so that internal clock producing circuit 7000 returns to the initial state. Thereafter, external clock signal Ext.CLK is activated again at time t7. Thereby, similar operations are performed, and will be repeated during the test operation period.

Owing to the above structure, a load on the tester side can be reduced even in the case of a fast operation, and therefore the operation test can be performed inexpensively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a plurality of clock input terminals each for receiving an external clock signal;
   a clock input circuit;
   means for changing a combination of connections between said plurality of clock input terminals and said clock input circuit; and
   a data output circuit for outputting data in synchronization with an output of said clock input circuit.

2. The semiconductor device according to claim 1 wherein said plurality of clock input terminals receive first and second external clock signals complementary each other; and
   said data output circuit receives an internal clock signal according to the first and second external clock signals to output data in synchronization with the output of said clock input circuit.

3. The semiconductor device according to claim 1, wherein
   said clock input terminal receives a first external clock signal; and
   said data output circuit receives an internal clock signal according to a comparison between the first external clock signal and a reference potential to output data in synchronization with the output of said clock input circuit.

4. The semiconductor device according to claim 1, wherein said means changes the combination in response to whether an external data strobe signal associated with write data is used or not.

* * * * *

UNITED STATES PATENT AND TRADEMARK OFFICE
CERTIFICATE OF CORRECTION

PATENT NO.      : 6,396,768 B1                                                Page 1 of 1
DATED           : May 28, 2002
INVENTOR(S)     : Tsukasa Ooishi It is certified that error appears in the above-identified patent and that said Letters Patent is hereby corrected as shown below:

<u>Title page,</u>
Item [63], Related U.S. Application Data, change "now abandoned" to -- now Pat. No. 6,259,647 --

Signed and Sealed this

Twenty-sixth Day of November, 2002

Attest:

Attesting Officer

JAMES E. ROGAN
Director of the United States Patent and Trademark Office